US010290652B1

(12) United States Patent
Sharangpani et al.

(10) Patent No.: US 10,290,652 B1
(45) Date of Patent: May 14, 2019

(54) THREE-DIMENSIONAL MEMORY DEVICE WITH GRADED WORD LINES AND METHODS OF MAKING THE SAME

(71) Applicant: SANDISK TECHNOLOGIES LLC, Addison, TX (US)

(72) Inventors: Rahul Sharangpani, Fremont, CA (US); Raghuveer S. Makala, Campbell, CA (US); Fei Zhou, San Jose, CA (US); Adarsh Rajashekhar, Santa Clara, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 15/992,603

(22) Filed: May 30, 2018

(51) Int. Cl.
*H01L 27/11582* (2017.01)
*H01L 27/11556* (2017.01)
*H01L 21/285* (2006.01)
*H01L 21/768* (2006.01)
*H01L 23/535* (2006.01)

(52) U.S. Cl.
CPC .. *H01L 27/11582* (2013.01); *H01L 21/28556* (2013.01); *H01L 21/76847* (2013.01); *H01L 21/76871* (2013.01); *H01L 23/535* (2013.01); *H01L 27/11556* (2013.01)

(58) Field of Classification Search
CPC ......... H01L 27/11548; H01L 27/11556; H01L 27/11575; H01L 27/1158
See application file for complete search history.

(56) References Cited

U.S. PATENT DOCUMENTS

| | | |
|---|---|---|
| 9,397,046 B1 | 7/2016 | Sharangpani et al. |
| 9,460,931 B2 | 10/2016 | Pachamuthu et al. |
| 9,496,419 B2 | 11/2016 | Sharangpani et al. |
| 9,793,139 B2 | 10/2017 | Sharangpani et al. |
| 9,953,999 B2 * | 4/2018 | Nam ................ H01L 27/11519 |
| 2017/0125538 A1 | 5/2017 | Sharangpani et al. |

(Continued)

OTHER PUBLICATIONS

Endoh et al., "Novel Ultra High Density Memory with a Stacked-Surrounding Gate Transistor (S-SGT) Structured Cell," IEDM Proc. pp. 33-36, (2001).

(Continued)

*Primary Examiner* — Matthew L Reames
(74) *Attorney, Agent, or Firm* — The Marbury Law Group PLLC

(57) ABSTRACT

A method of forming a three-dimensional memory device includes providing an alternating stack of insulating layers and sacrificial material layers located between a first trench and a second trench, forming memory stack structures extending vertically through the alternating stack, wherein each of the memory stack structures contains a memory film and a vertical semiconductor channel, removing the sacrificial material layers selective to the insulating layers through the first and the second trenches to form backside recesses having a first proximal region adjacent to the first trench, a second proximal region adjacent to the second trench and a distal region located between the first and the second proximal regions, and forming fluorine-free tungsten layers in the respective backside recesses such that each fluorine-free tungsten layer has a greater thickness in the distal region than in the first and the second proximal regions.

20 Claims, 42 Drawing Sheets

(56) References Cited

U.S. PATENT DOCUMENTS

| | | |
|---|---|---|
| 2017/0352669 A1 | 12/2017 | Sharangpani et al. |
| 2017/0373197 A1 | 12/2017 | Sharangpani et al. |
| 2018/0019256 A1 | 1/2018 | Amano et al. |
| 2018/0033646 A1 | 2/2018 | Sharangpani et al. |
| 2018/0090373 A1 | 3/2018 | Sharangpani et al. |

OTHER PUBLICATIONS

Park, H. L., et al., "The Deposition Mechanism and Microstructures Of Tungsten Films Produced By Silicon Reduction Of Wf6", Thin Solid Films, vol. 166, pp. 37-43 (1988).

Leusink, G. J., et al., "Growth kinetics and inhibition of growth of chemical vapor deposited thin tungsten films on silicon from tungsten hexafluoride", J. Appl. Phys. vol. 72, No. 2, pp. 490-498, (1992).

Groenen, "The Reaction Mechanism of W-CVD on Si," Technische Universiteit, 115 pages, download date Apr. 6, 2018.

Clancey, J. W. et al., "Atomic layer deposition of ultrathin platinum films on tungsten atomic layer deposition adhesion layers: Application to high surface area substrates," J. Vac. Sci. Technol. A 33(1), Jan./Feb. 2015, 01A130-1.

Jiang, P.C. et al., "Dependence of crystal structure and work function of WNx films on the nitrogen content," Applied Physics Letters, vol. 89, pp. 122107-1-122107-3, (2006).

Jeon, S. et al., "Direct Synthesis of W18O49 Nanorods from W2N film by Thermal Annealing," NanoTechnology, vol. 18, pp. 1-7, (2007).

\* cited by examiner

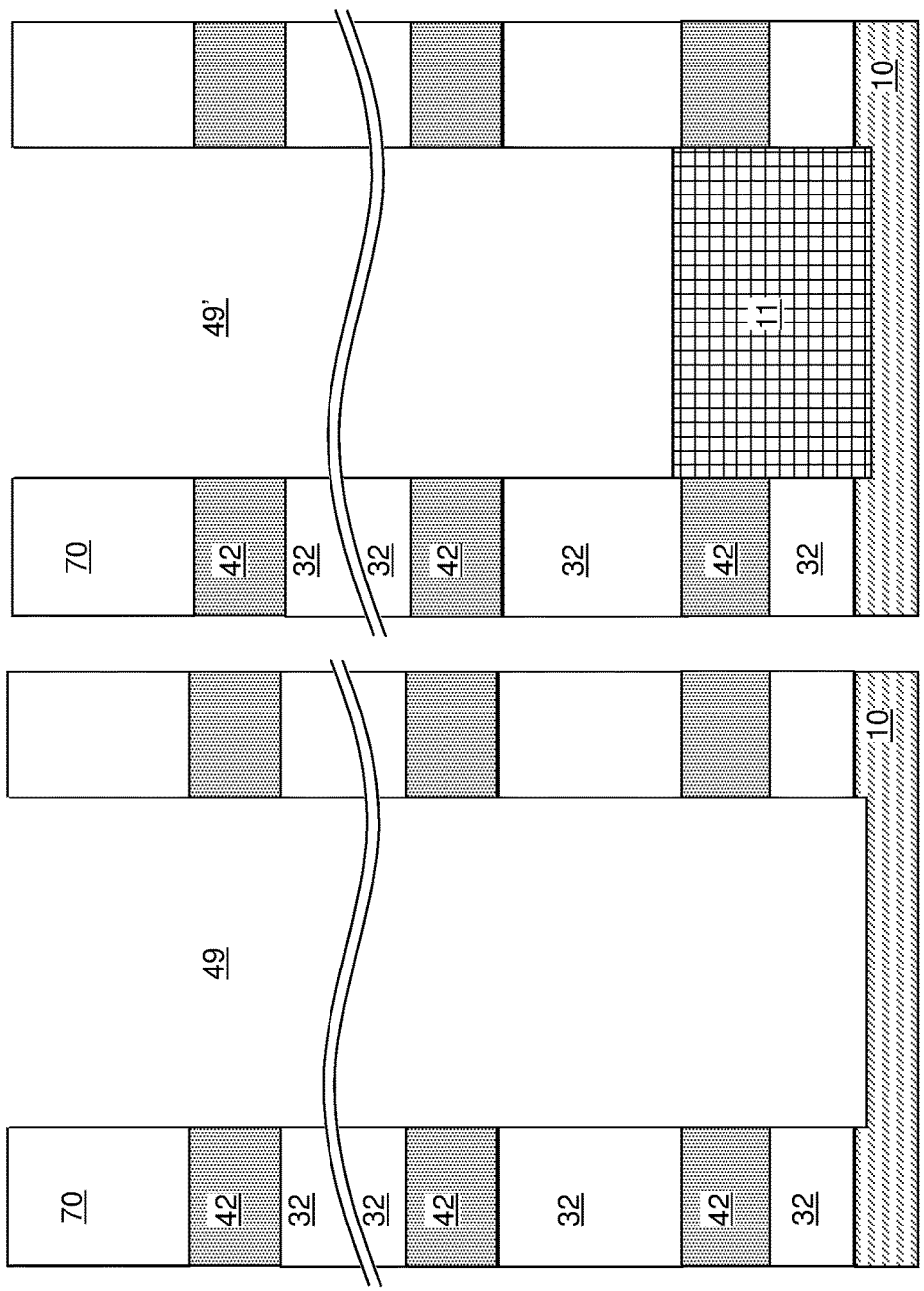

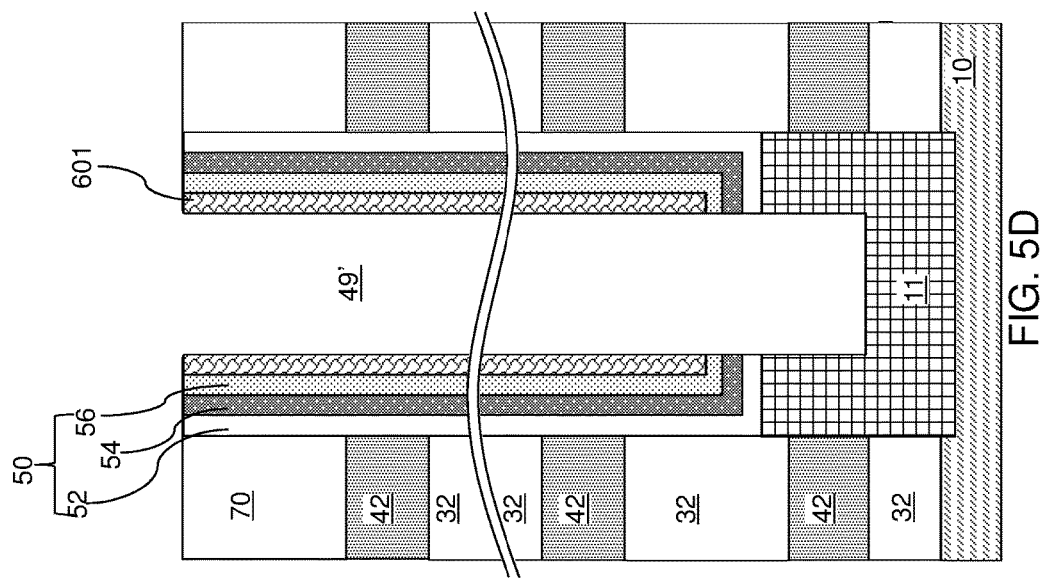
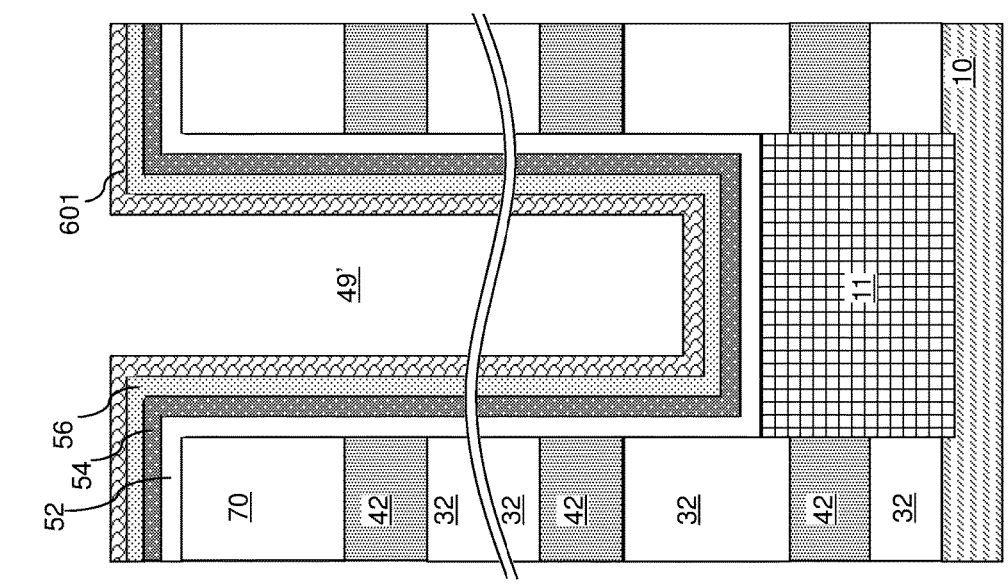

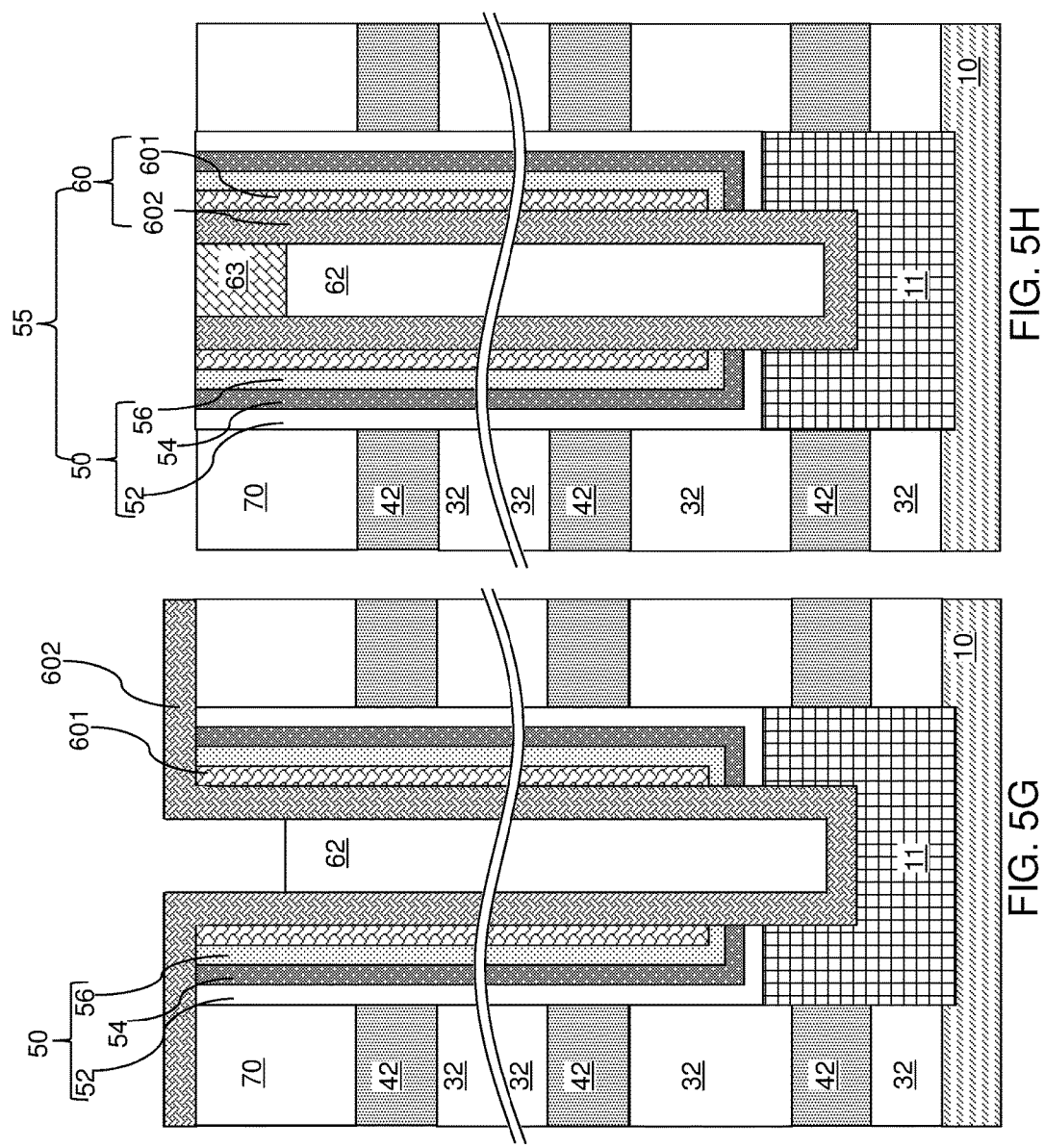

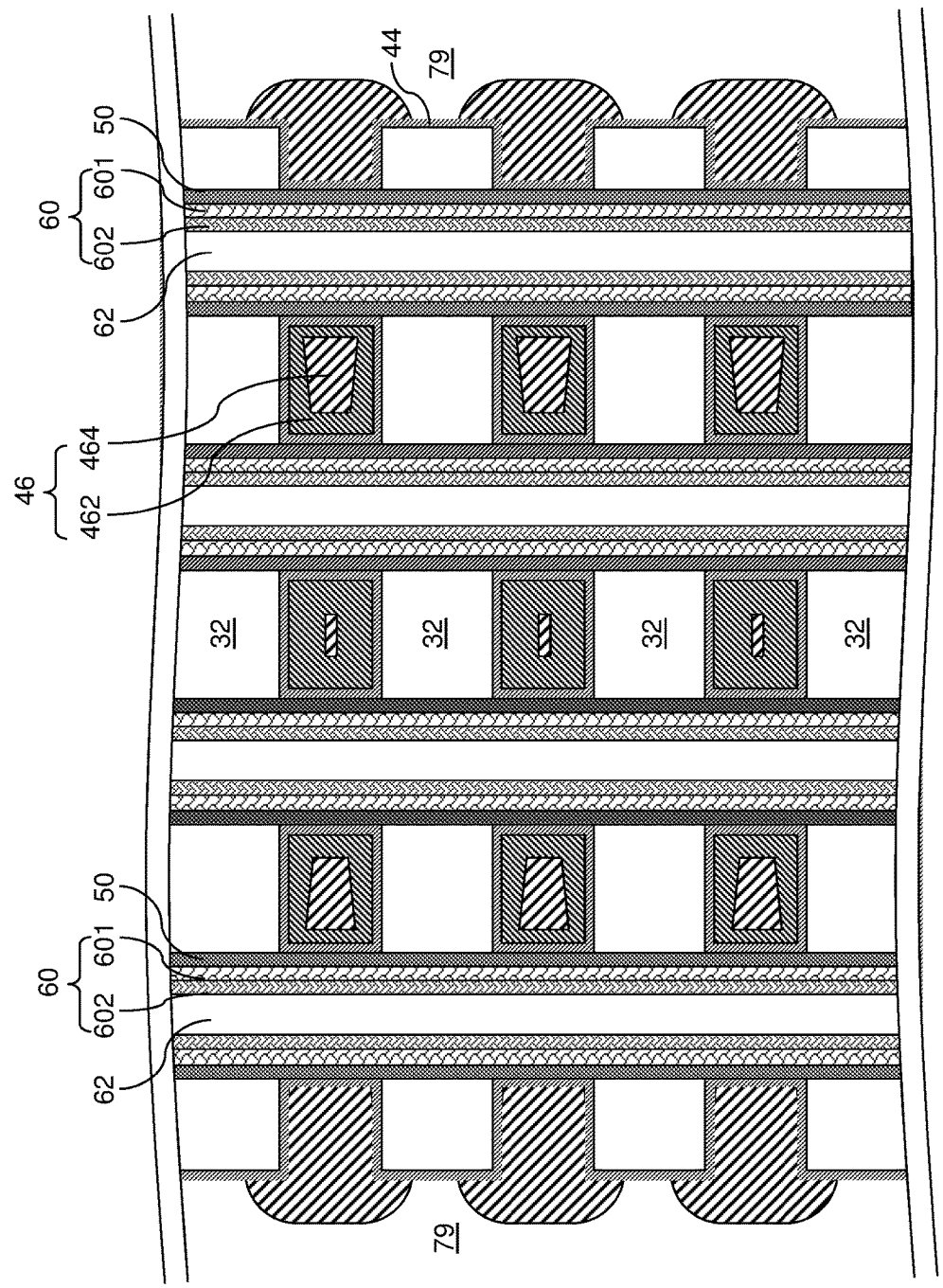

THREE-DIMENSIONAL MEMORY DEVICE WITH GRADED WORD LINES AND METHODS OF MAKING THE SAME

FIELD

The present disclosure relates generally to the field of semiconductor devices, and particular to a three-dimensional memory device including graded word lines and methods of manufacturing the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a three-dimensional memory device comprises an alternating stack of insulating layers and electrically conductive layers located over a substrate, memory stack structures extending through the alternating stack, wherein each memory stack structure comprises a memory film and a vertical semiconductor channel, a first trench located on a first side of the alternating stack, and a second trench located on a second side of the alternating stack. Each of the electrically conductive layers comprises a first proximal region adjacent to the first trench, a second proximal region adjacent to the second trench and a distal region located between the first and the second proximal regions. The distal region differs from the first and second proximal region in at least one of composition and structure.

According to another aspect of the present disclosure, a method of forming a three-dimensional memory device includes providing an alternating stack of insulating layers and sacrificial material layers located between a first trench and a second trench, forming memory stack structures extending vertically through the alternating stack, wherein each of the memory stack structures contains a memory film and a vertical semiconductor channel, removing the sacrificial material layers selective to the insulating layers through the first and the second trenches to form backside recesses having a first proximal region adjacent to the first trench, a second proximal region adjacent to the second trench and a distal region located between the first and the second proximal regions, and forming fluorine-free tungsten layers in the respective backside recesses such that each fluorine-free tungsten layer has a greater thickness in the distal region than in the first and the second proximal regions.

BRIEF DESCRIPTION OF THE DRAWINGS

FIGS. 5A-5H are sequential schematic vertical cross-sectional views of a memory opening within the exemplary structure during formation of a memory stack structure, an optional dielectric core, and a drain region therein according to an embodiment of the present disclosure.

FIGS. 11A-11D are sequential vertical cross-sectional views of a region of the exemplary structure along the vertical plane C-C' of FIG. 7B during formation of second exemplary electrically conductive layers according to an embodiment of the present disclosure.

DETAILED DESCRIPTION

Figure 1:
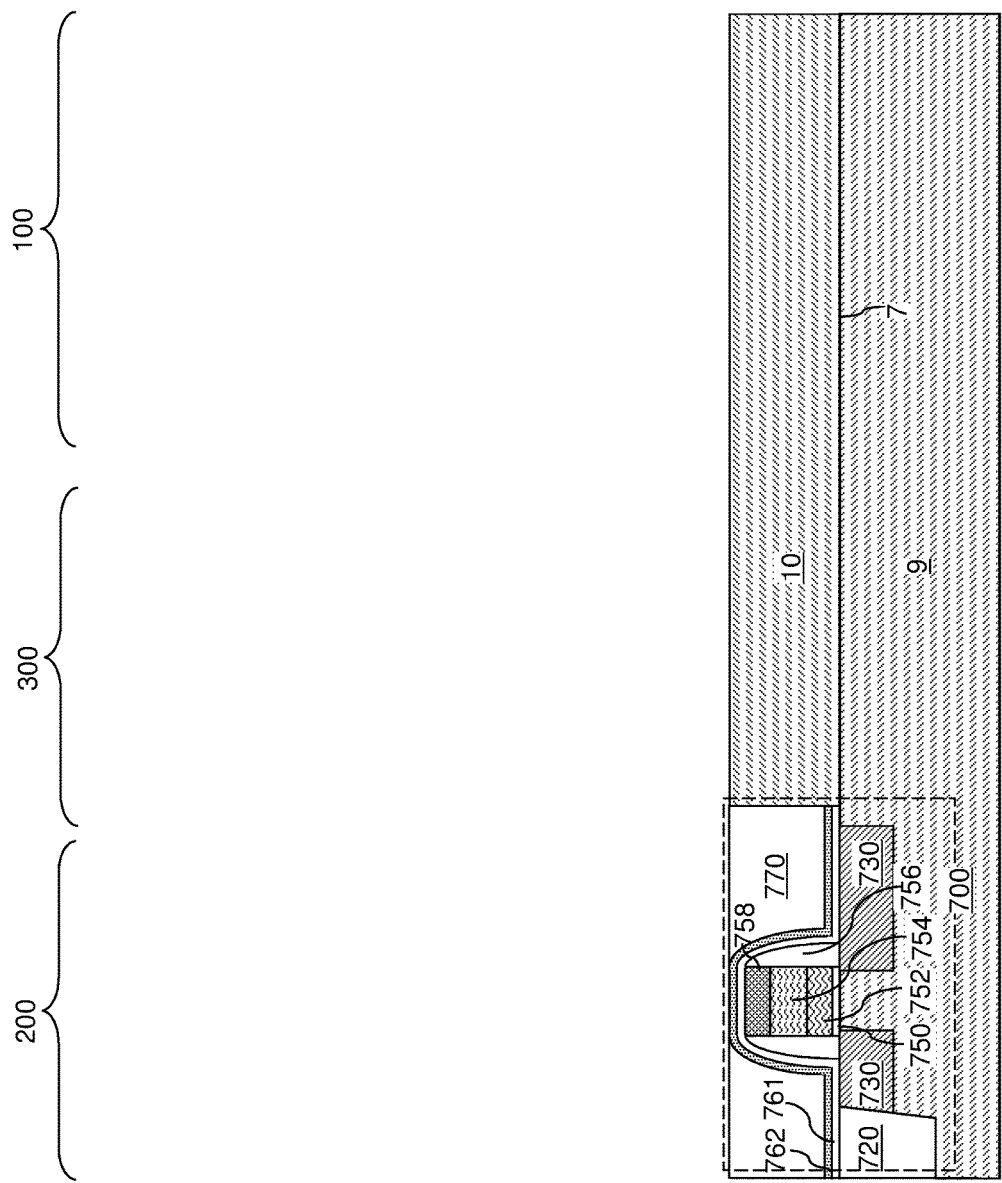
FIG. 1 is a schematic vertical cross-sectional view of an exemplary structure after formation of at least one peripheral device, a semiconductor material layer, and a gate dielectric layer according to an embodiment of the present disclosure.

As discussed above, the present disclosure is directed a three-dimensional memory device including compositionally graded word lines and methods of manufacturing the same, the various aspects of which are described below. The embodiments of the disclosure can be employed to form various structures including a multilevel memory structure, non-limiting examples of which include semiconductor devices such as three-dimensional monolithic memory array devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The same reference numerals refer to the same element or similar element. Unless otherwise indicated, elements having the same reference numerals are presumed to have the same composition. Unless otherwise indicated, a "contact" between elements refers to a direct contact between elements that provides an edge or a surface shared by the elements. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

Generally, a semiconductor die, or a semiconductor package, can include a memory chip. Each semiconductor package contains one or more dies (for example one, two, or four). The die is the smallest unit that can independently execute commands or report status. Each die contains one or more planes (typically one or two). Identical, concurrent operations can take place on each plane, although with some restrictions. Each plane contains a number of blocks, which are the smallest unit that can be erased by in a single erase operation. Each block contains a number of pages, which are the smallest unit that can be programmed, i.e., a smallest unit on which a read operation can be performed.

Referring to FIG. 1, an exemplary structure according to an embodiment of the present disclosure is illustrated, which can be employed, for example, to fabricate a device structure containing vertical NAND memory devices. The exemplary structure includes a substrate (9, 10), which can be a semiconductor substrate. The substrate can include a substrate semiconductor layer 9 and an optional semiconductor material layer 10. The substrate semiconductor layer 9 maybe a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface, such as a single crystalline semiconductor surface.

As used herein, a "semiconducting material" refers to a material having electrical conductivity in the range from $1.0 \times 10^{-6}$ S/cm to $1.0 \times 10^5$ S/cm. As used herein, a "semiconductor material" refers to a material having electrical conductivity in the range from $1.0 \times 10^{-6}$ S/cm to $1.0 \times 10^5$ S/cm in the absence of electrical dopants therein, and is capable of producing a doped material having electrical conductivity in a range from 1.0 S/cm to $1.0 \times 10^5$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^5$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^{5}$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

At least one semiconductor device 700 for a peripheral circuitry can be formed on a portion of the substrate semiconductor layer 9. The at least one semiconductor device can include, for example, field effect transistors. For example, at least one shallow trench isolation structure 720 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (750, 752, 754, 758), each of which can include a gate dielectric 750, a gate electrode (752, 754), and a gate cap dielectric 758. The gate electrode (752, 754) may include a stack of a first gate electrode portion 752 and a second gate electrode portion 754. At least one gate spacer 756 can be formed around the at least one gate structure (750, 752, 754, 758) by depositing and anisotropically etching a dielectric liner. Active regions 730 can be formed in upper portions of the substrate semiconductor layer 9, for example, by introducing electrical dopants employing the at least one gate structure (750, 752, 754, 758) as masking structures. Additional masks may be employed as needed. The active region 730 can include source regions and drain regions of field effect transistors. A first dielectric liner 761 and a second dielectric liner 762 can be optionally formed. Each of the first and second dielectric liners (761, 762) can comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 761 can be a silicon oxide layer, and the second dielectric liner 762 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 770. In one embodiment the planarized top surface of the planarization dielectric layer 770 can be coplanar with a top surface of the dielectric liners (761, 762). Subsequently, the planarization dielectric layer 770 and the dielectric liners (761, 762) can be removed from an area to physically expose a top surface of the substrate semiconductor layer 9. As used herein, a surface is "physically exposed" if the surface is in physical contact with vacuum, or a gas phase material (such as air).

The optional semiconductor material layer 10, if present, can be formed on the top surface of the substrate semiconductor layer 9 prior to, or after, formation of the at least one semiconductor device 700 by deposition of a single crystalline semiconductor material, for example, by selective epitaxy. The deposited semiconductor material can be the same as, or can be different from, the semiconductor material of the substrate semiconductor layer 9. The deposited semiconductor material can be any material that can be employed for the substrate semiconductor layer 9 as described above. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 170 can be removed, for example, by chemical mechanical planarization (CMP). In this case, the semiconductor material layer 10 can have a top surface that is coplanar with the top surface of the planarization dielectric layer 770.

The region (i.e., area) of the at least one semiconductor device 700 is herein referred to as a peripheral device region 200. The region in which a memory array is subsequently formed is herein referred to as a memory array region 100. A contact region 300 for subsequently forming stepped terraces of electrically conductive layers can be provided between the memory array region 100 and the peripheral device region 200.

Figure 2:
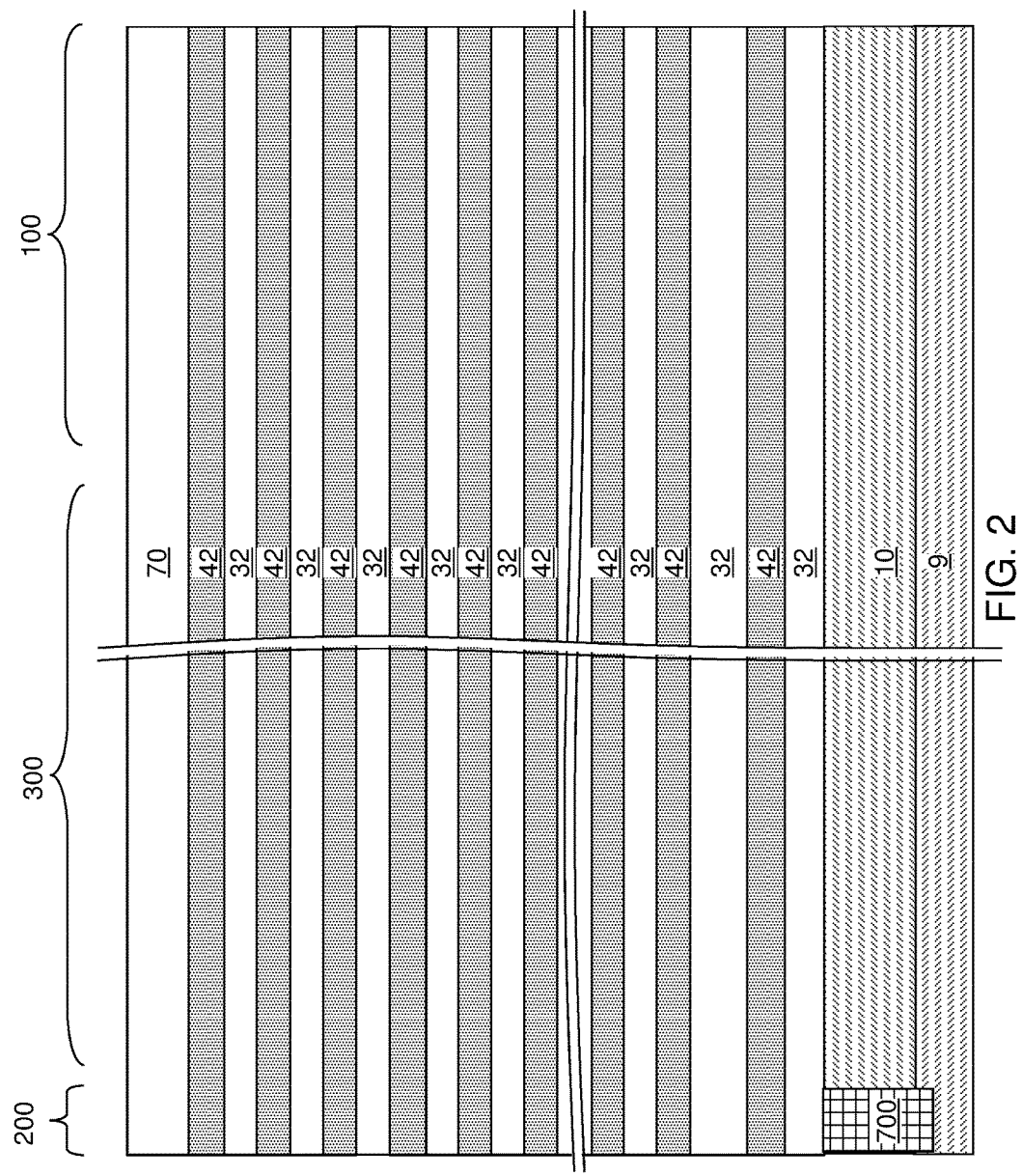
FIG. 2 is a schematic vertical cross-sectional view of the exemplary structure after formation of an alternating stack of insulating layers and sacrificial material layers according to an embodiment of the present disclosure.

Referring to FIG. 2, a stack of an alternating plurality of first material layers (which can be insulating layers 32) and second material layers (which can be sacrificial material layer 42) is formed over the top surface of the substrate (9, 10). As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer. In this case, the stack can include an alternating plurality of insulating layers 32 and sacrificial material layers 42, and constitutes a prototype stack of alternating layers comprising insulating layers 32 and sacrificial material layers 42.

The stack of the alternating plurality is herein referred to as an alternating stack (32, 42). In one embodiment, the alternating stack (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride or a semiconductor material including at least one of silicon and germanium.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, by CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate.

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

While the present disclosure is described employing an embodiment in which the spacer material layers are sacrificial material layers 42 that are subsequently replaced with electrically conductive layers, embodiments are expressly contemplated herein in which the sacrificial material layers are formed as electrically conductive layers. In this case, steps for replacing the spacer material layers with electrically conductive layers can be omitted.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be employed for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

Figure 3:
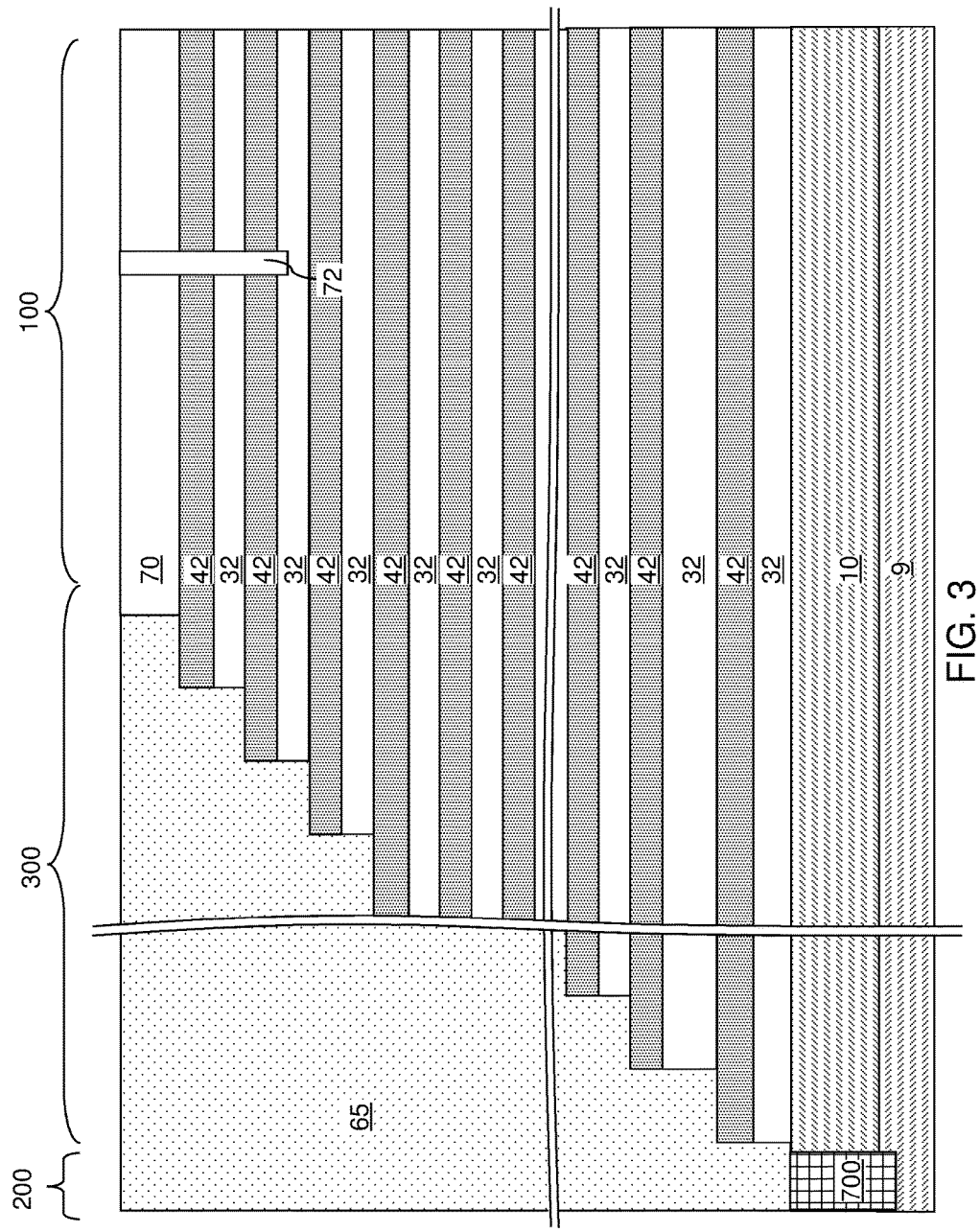
FIG. 3 is a schematic vertical cross-sectional view of the exemplary structure after formation of stepped terraces and a retro-stepped dielectric material portion according to an embodiment of the present disclosure.

Referring to FIG. 3, stepped surfaces are formed at a peripheral region of the alternating stack (32, 42), which is herein referred to as a terrace region. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A stepped cavity is formed within the volume from which portions of the alternating stack (32, 42) are removed through formation of the stepped surfaces. A "stepped cavity" refers to a cavity having stepped surfaces.

The terrace region is formed in the contact region 300, which is located between the memory array region 100 and the peripheral device region 200 containing the at least one semiconductor device for the peripheral circuitry. The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

Each sacrificial material layer 42 other than a topmost sacrificial material layer 42 within the alternating stack (32, 42) laterally extends farther than any overlying sacrificial material layer 42 within the alternating stack (32, 42) in the terrace region. The terrace region includes stepped surfaces of the alternating stack (32, 42) that continuously extend from a bottommost layer within the alternating stack (32, 42) to a topmost layer within the alternating stack (32, 42).

Each vertical step of the stepped surfaces can have the height of one or more pairs of an insulating layer 32 and a sacrificial material layer. In one embodiment, each vertical step can have the height of a single pair of an insulating layer 32 and a sacrificial material layer 42. In another embodiment, multiple "columns" of staircases can be formed along a first horizontal direction hd1 such that each vertical step has the height of a plurality of pairs of an insulating layer 32 and a sacrificial material layer 42, and the number of columns can be at least the number of the plurality of pairs. Each column of staircase can be vertically offset among one another such that each of the sacrificial material layers 42 has a physically exposed top surface in a respective column of staircases. In the illustrative example, two columns of staircases are formed for each block of memory stack structures to be subsequently formed such that one column of staircases provide physically exposed top surfaces for odd-numbered sacrificial material layers 42 (as counted from the bottom) and another column of staircases provide physically exposed top surfaces for even-numbered sacrificial material layers (as counted from the bottom). Configurations employing three, four, or more columns of staircases with a respective set of vertical offsets among the physically exposed surfaces of the sacrificial material layers 42 may also be employed. Each sacrificial material layer 42 has a greater lateral extent, at least along one direction, than any overlying sacrificial material layers 42 such that each physically exposed surface of any sacrificial material layer 42 does not have an overhang. In one embodiment, the vertical steps within each column of staircases may be arranged along the first horizontal direction hd1, and the columns of staircases may be arranged along a second horizontal direction hd2 that is perpendicular to the first horizontal direction hd1. In one embodiment, the first horizontal direction hd1 may be perpendicular to the boundary between the memory array region 100 and the contact region 300.

A retro-stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the insulating cap layer 70, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Optionally, drain select level isolation structures 72 can be formed through the insulating cap layer 70 and a subset of the sacrificial material layers 42 located at drain select levels. The drain select level isolation structures 72 can be formed, for example, by forming drain select level isolation trenches and filling the drain select level isolation trenches with a dielectric material such as silicon oxide. Excess portions of the dielectric material can be removed from above the top surface of the insulating cap layer 70.

Figure 4A:
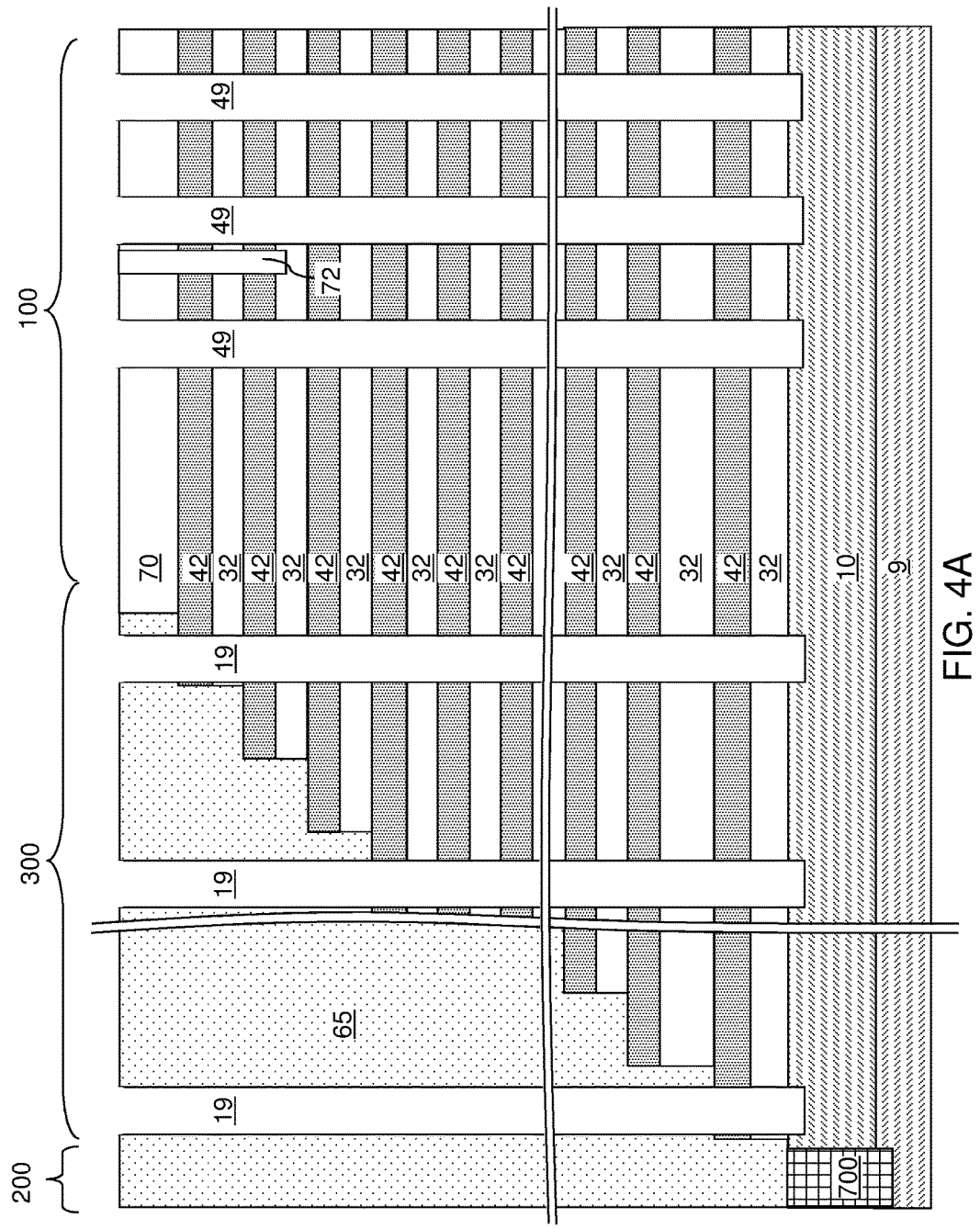
FIG. 4A is a schematic vertical cross-sectional view of the exemplary structure after formation of memory openings and support openings according to an embodiment of the present disclosure.
Figure 4B:
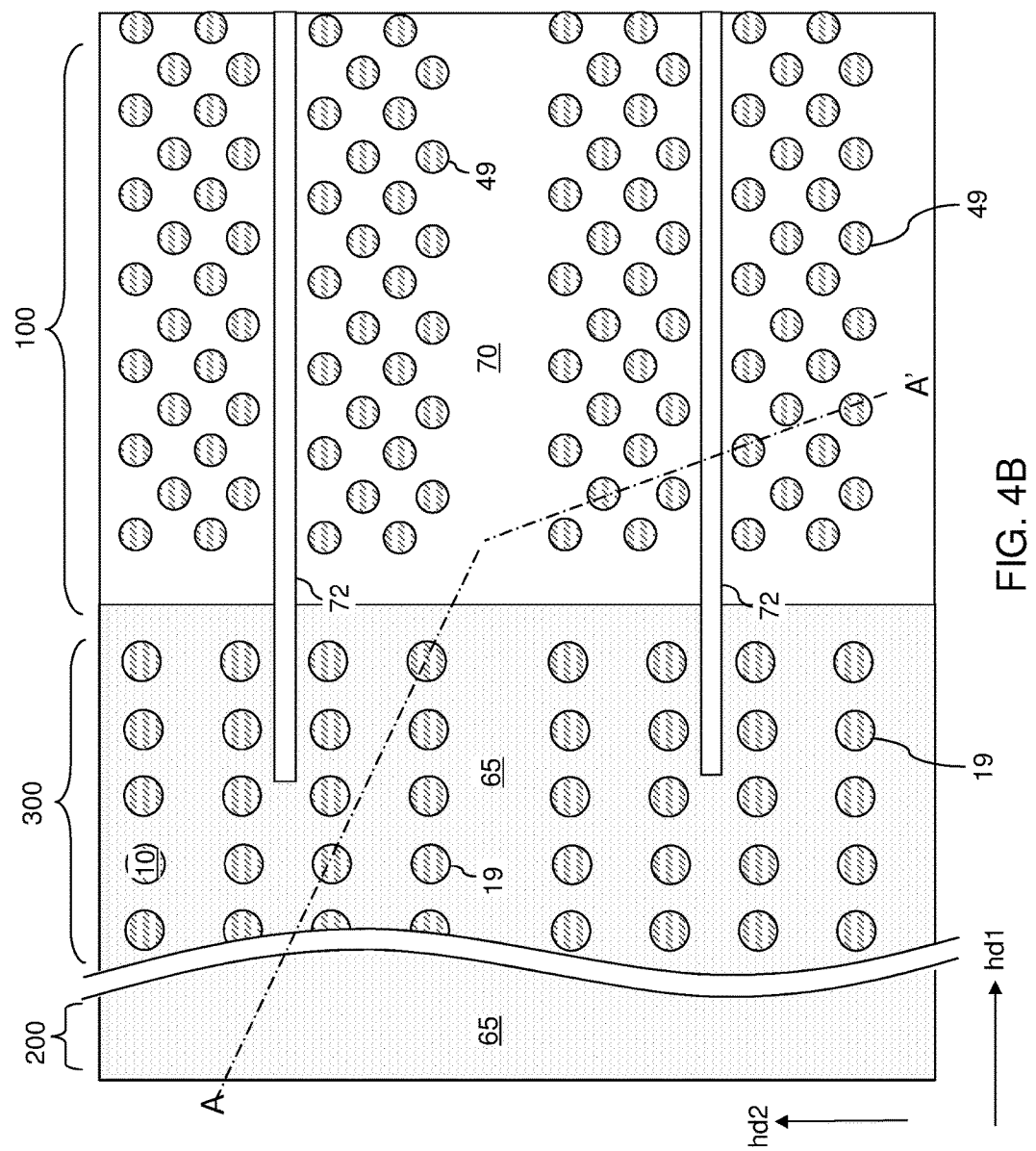
FIG. 4B is a top-down view of the exemplary structure of FIG. 4A. The vertical plane A-A' is the plane of the cross-section for FIG. 4A.

Referring to FIGS. 4A and 4B, a lithographic material stack (not shown) including at least a photoresist layer can be formed over the insulating cap layer 70 and the retro-stepped dielectric material portion 65, and can be lithographically patterned to form openings therein. The openings include a first set of openings formed over the memory array region 100 and a second set of openings formed over the contact region 300. The pattern in the lithographic material stack can be transferred through the insulating cap layer 70 or the retro-stepped dielectric material portion 65, and through the alternating stack (32, 42) by at least one anisotropic etch that employs the patterned lithographic material stack as an etch mask. Portions of the alternating stack (32, 42) underlying the openings in the patterned lithographic material stack are etched to form memory openings 49 and support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 are formed through the insulating cap layer 70 and the entirety of the alternating stack (32, 42) in the memory array region 100. The support openings 19 are formed through the retro-stepped dielectric material portion 65 and the portion of the alternating stack (32, 42) that underlie the stepped surfaces in the contact region 300.

The memory openings 49 extend through the entirety of the alternating stack (32, 42). The support openings 19 extend through a subset of layers within the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. The sidewalls of the memory openings 49 and the support openings 19 can be substantially vertical, or can be tapered. The patterned lithographic material stack can be subsequently removed, for example, by ashing.

The memory openings 49 and the support openings 19 can extend from the top surface of the alternating stack (32, 42) to at least the horizontal plane including the topmost surface of the semiconductor material layer 10. In one embodiment, an overetch into the semiconductor material layer 10 may be optionally performed after the top surface of the semiconductor material layer 10 is physically exposed at a bottom of each memory opening 49 and each support opening 19. The overetch may be performed prior to, or after, removal of the lithographic material stack. In other words, the recessed surfaces of the semiconductor material layer 10 may be vertically offset from the un-recessed top surfaces of the semiconductor material layer 10 by a recess depth. The recess depth can be, for example, in a range from 1 nm to 50 nm, although lesser and greater recess depths can also be employed. The overetch is optional, and may be omitted. If the overetch is not performed, the bottom surfaces of the memory openings 49 and the support openings 19 can be coplanar with the topmost surface of the semiconductor material layer 10.

Each of the memory openings 49 and the support openings 19 may include a sidewall (or a plurality of sidewalls) that extends substantially perpendicular to the topmost surface of the substrate. A two-dimensional array of memory openings 49 can be formed in the memory array region 100. A two-dimensional array of support openings 19 can be formed in the contact region 300. The substrate semiconductor layer 9 and the semiconductor material layer 10 collectively constitutes a substrate (9, 10), which can be a semiconductor substrate. Alternatively, the semiconductor material layer 10 may be omitted, and the memory openings 49 and the support openings 19 can be extend to a top surface of the substrate semiconductor layer 9.

FIGS. 5A-5H illustrate structural changes in a memory opening 49, which is one of the memory openings 49 in the exemplary structure of FIGS. 4A and 4B. The same structural change occurs simultaneously in each of the other memory openings 49 and in each support opening 19.

Referring to FIG. 5A, a memory opening 49 in the exemplary device structure of FIGS. 4A and 4B is illustrated. The memory opening 49 extends through the insulating cap layer 70, the alternating stack (32, 42), and optionally into an upper portion of the semiconductor material layer 10. At this processing step, each support opening 19 can extend through the retro-stepped dielectric material portion 65, a subset of layers in the alternating stack (32, 42), and optionally through the upper portion of the semiconductor material layer 10. The recess depth of the bottom surface of each memory opening with respect to the top surface of the semiconductor material layer 10 can be in a range from 0 nm to 30 nm, although greater recess depths can also be employed. Optionally, the sacrificial material layers 42 can be laterally recessed partially to form lateral recesses (not shown), for example, by an isotropic etch.

Referring to FIG. 5B, an optional pedestal channel portion (e.g., an epitaxial pedestal) 11 can be formed at the bottom portion of each memory opening 49 and each support openings 19, for example, by selective epitaxy. Each pedestal channel portion 11 comprises a single crystalline semiconductor material in epitaxial alignment with the single crystalline semiconductor material of the semiconductor material layer 10. In one embodiment, the pedestal channel portion 11 can be doped with electrical dopants of the same conductivity type as the semiconductor material layer 10. In one embodiment, the top surface of each pedestal channel portion 11 can be formed above a horizontal plane including the top surface of a sacrificial material layer 42. In this case, at least one source select gate electrode can be subsequently formed by replacing each sacrificial material layer 42 located below the horizontal plane including the top surfaces of the pedestal channel portions 11 with a respective conductive material layer. The pedestal channel portion 11 can be a portion of a transistor channel that extends between a source region to be subsequently formed in the substrate (9, 10) and a drain region to be subsequently formed in an upper portion of the memory opening 49. A memory cavity 49' is present in the unfilled portion of the memory opening 49 above the pedestal channel portion 11. In one embodiment, the pedestal channel portion 11 can comprise single crystalline silicon. In one embodiment, the pedestal channel portion 11 can have a doping of the first conductivity type, which is the same as the conductivity type of the semiconductor material layer 10 that the pedestal channel portion contacts. If a semiconductor material layer 10 is not present, the pedestal channel portion 11 can be formed directly on the substrate semiconductor layer 9, which can have a doping of the first conductivity type.

Referring to FIG. 5C, a stack of layers including a blocking dielectric layer 52, a charge storage layer 54, a tunneling dielectric layer 56, and an optional first semiconductor channel layer 601 can be sequentially deposited in the memory openings 49.

The blocking dielectric layer 52 can include a single dielectric material layer or a stack of a plurality of dielectric material layers. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The dielectric metal oxide layer can be deposited, for example, by chemical vapor deposition (CVD), atomic layer deposition (ALD), pulsed laser deposition (PLD), liquid source misted chemical deposition, or a combination thereof. The thickness of the dielectric metal oxide layer can be in a range from 1 nm to 20 nm, although lesser and greater thicknesses can also be employed. The dielectric metal oxide layer can subsequently function as a dielectric material portion that blocks leakage of stored electrical charges to control gate electrodes. In one embodiment, the blocking dielectric layer 52 includes aluminum oxide. In one embodiment, the blocking dielectric layer 52 can include multiple dielectric metal oxide layers having different material compositions.

Alternatively or additionally, the blocking dielectric layer 52 can include a dielectric semiconductor compound such as silicon oxide, silicon oxynitride, silicon nitride, or a combination thereof. In one embodiment, the blocking dielectric layer 52 can include silicon oxide. In this case, the dielectric semiconductor compound of the blocking dielectric layer 52 can be formed by a conformal deposition method such as low pressure chemical vapor deposition, atomic layer deposition, or a combination thereof. The thickness of the dielectric semiconductor compound can be in a range from 1 nm to 20 nm, although lesser and greater thicknesses can also be employed. Alternatively, the blocking dielectric layer 52 can be omitted, and a backside blocking dielectric layer can be formed after formation of backside recesses on surfaces of memory films to be subsequently formed.

Subsequently, the charge storage layer 54 can be formed. In one embodiment, the charge storage layer 54 can be a continuous layer or patterned discrete portions of a charge trapping material including a dielectric charge trapping material, which can be, for example, silicon nitride. Alternatively, the charge storage layer 54 can include a continuous layer or patterned discrete portions of a conductive material such as doped polysilicon or a metallic material that is patterned into multiple electrically isolated portions (e.g., floating gates), for example, by being formed within lateral recesses into sacrificial material layers 42. In one embodiment, the charge storage layer 54 includes a silicon nitride layer. In one embodiment, the sacrificial material layers 42 and the insulating layers 32 can have vertically coincident sidewalls, and the charge storage layer 54 can be formed as a single continuous layer.

In another embodiment, the sacrificial material layers 42 can be laterally recessed with respect to the sidewalls of the insulating layers 32, and a combination of a deposition process and an anisotropic etch process can be employed to form the charge storage layer 54 as a plurality of memory material portions that are vertically spaced apart. While the present disclosure is described employing an embodiment in which the charge storage layer 54 is a single continuous layer, embodiments are expressly contemplated herein in which the charge storage layer 54 is replaced with a plurality of memory material portions (which can be charge trapping material portions or electrically isolated conductive material portions) that are vertically spaced apart.

The charge storage layer 54 can be formed as a single charge storage layer of homogeneous composition, or can include a stack of multiple charge storage layers. The multiple charge storage layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the charge storage layer 54 may comprise an insulating charge trapping material, such as one or more silicon nitride segments. Alternatively, the charge storage layer 54 may comprise conductive nanoparticles such as metal nanoparticles, which can be, for example, ruthenium nanoparticles. The charge storage layer 54 can be formed, for example, by chemical vapor deposition (CVD), atomic layer deposition (ALD), physical vapor deposition (PVD), or any suitable deposition technique for storing electrical charges therein. The thickness of the charge storage layer 54 can be in a range from 2 nm to 20 nm, although lesser and greater thicknesses can also be employed.

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be employed.

The optional first semiconductor channel layer 601 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601 includes amorphous silicon or polysilicon. The first semiconductor channel layer 601 can be formed by a conformal deposition method such as low pressure chemical vapor deposition (LPCVD). The thickness of the first semiconductor channel layer 601 can be in a range from 2 nm to 10 nm, although lesser and greater thicknesses can also be employed. A memory cavity 49' is formed in the volume of each memory opening 49 that is not filled with the deposited material layers (52, 54, 56, 601).

Referring to FIG. 5D, the optional first semiconductor channel layer 601, the tunneling dielectric layer 56, the charge storage layer 54, the blocking dielectric layer 52 are sequentially anisotropically etched employing at least one anisotropic etch process. The portions of the first semiconductor channel layer 601, the tunneling dielectric layer 56, the charge storage layer 54, and the blocking dielectric layer 52 located above the top surface of the insulating cap layer 70 can be removed by the at least one anisotropic etch process. Further, the horizontal portions of the first semiconductor channel layer 601, the tunneling dielectric layer 56, the charge storage layer 54, and the blocking dielectric layer 52 at a bottom of each memory cavity 49' can be removed to form openings in remaining portions thereof. Each of the first semiconductor channel layer 601, the tunneling dielectric layer 56, the charge storage layer 54, and the blocking dielectric layer 52 can be etched by a respective anisotropic etch process employing a respective etch chemistry, which may, or may not, be the same for the various material layers.

Each remaining portion of the first semiconductor channel layer 601 can have a tubular configuration. The charge storage layer 54 can comprise a charge trapping material or a floating gate material. In one embodiment, each charge storage layer 54 can include a vertical stack of charge storage regions that store electrical charges upon programming. In one embodiment, the charge storage layer 54 can be a charge storage layer in which each portion adjacent to the sacrificial material layers 42 constitutes a charge storage region.

A surface of the pedestal channel portion 11 (or a surface of the semiconductor material layer 10 in case the pedestal channel portions 11 are not employed) can be physically exposed underneath the opening through the first semiconductor channel layer 601, the tunneling dielectric layer 56, the charge storage layer 54, and the blocking dielectric layer 52. Optionally, the physically exposed semiconductor surface at the bottom of each memory cavity 49' can be vertically recessed so that the recessed semiconductor surface underneath the memory cavity 49' is vertically offset from the topmost surface of the pedestal channel portion 11 (or of the semiconductor material layer 10 in case pedestal channel portions 11 are not employed) by a recess distance. A tunneling dielectric layer 56 is located over the charge storage layer 54. A set of a blocking dielectric layer 52, a charge storage layer 54, and a tunneling dielectric layer 56 in a memory opening 49 constitutes a memory film 50, which includes a plurality of charge storage regions (as embodied as the charge storage layer 54) that are insulated from surrounding materials by the blocking dielectric layer 52 and the tunneling dielectric layer 56. In one embodiment, the first semiconductor channel layer 601, the tunneling dielectric layer 56, the charge storage layer 54, and the blocking dielectric layer 52 can have vertically coincident sidewalls.

Figure 5E:
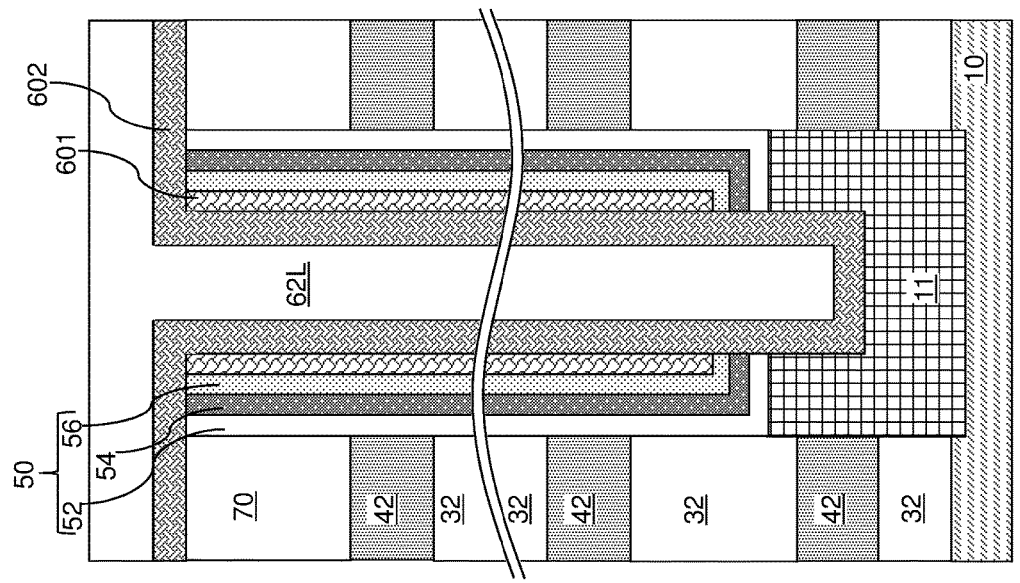

Referring to FIG. 5E, a second semiconductor channel layer 602 can be deposited directly on the semiconductor surface of the pedestal channel portion 11 or the semiconductor material layer 10 if the pedestal channel portion 11 is omitted, and directly on the first semiconductor channel layer 601. The second semiconductor channel layer 602 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602 includes amorphous silicon or polysilicon. The second semiconductor channel layer 602 can be formed by a conformal deposition method such as low pressure chemical vapor deposition (LPCVD). The thickness of the second semiconductor channel layer 602 can be in a range from 2 nm to 10 nm, although lesser and greater thicknesses can also be employed. The second semiconductor channel layer 602 may partially fill the memory cavity 49' in each memory opening, or may fully fill the cavity in each memory opening.

The materials of the first semiconductor channel layer 601 and the second semiconductor channel layer 602 are collectively referred to as a semiconductor channel material. In other words, the semiconductor channel material is a set of all semiconductor material in the first semiconductor channel layer 601 and the second semiconductor channel layer 602.

Figure 5F:
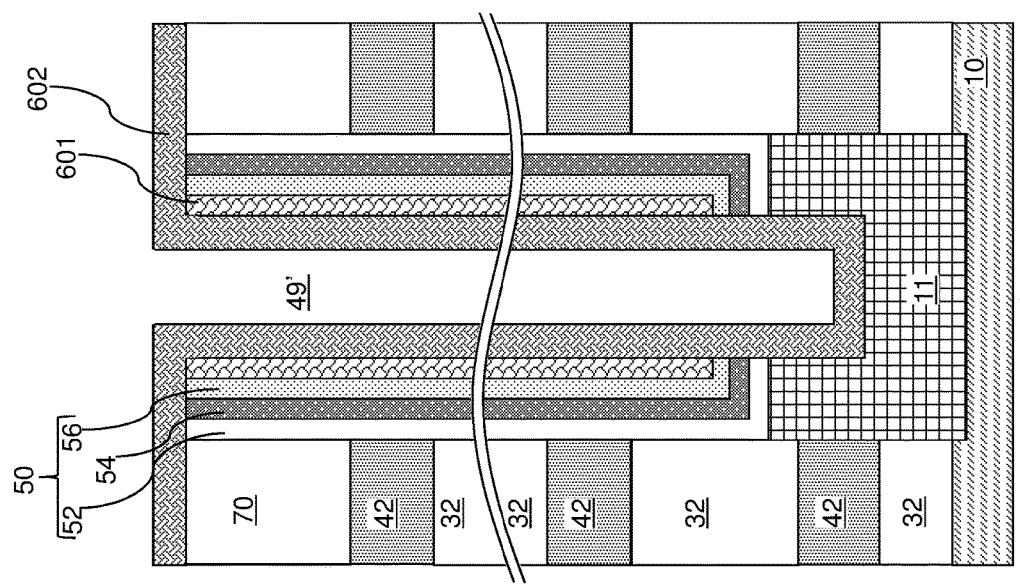

Referring to FIG. 5F, in case the memory cavity 49' in each memory opening is not completely filled by the second semiconductor channel layer 602, a dielectric core layer 62L can be deposited in the memory cavity 49' to fill any remaining portion of the memory cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Referring to FIG. 5G, the dielectric core layer 62L can be vertically recessed selective to the material of the second semiconductor channel layer 602 below the top surface of the insulating cap layer 70. An anisotropic etch process or an isotropic etch process can be employed, which etches silicon oxide or organosilicate glass selective to the semiconductor material of the second semiconductor material layer 602. Each remaining portion of the dielectric core layer 62L constitutes a dielectric core 62. The top surface of each dielectric core 62 can be located between the horizontal plane including the top surface of the insulating cap layer 70 and the horizontal plane including the bottom surface of the insulating cap layer 70. A recessed region is present above each dielectric core 62.

Referring to FIG. 5H, a doped semiconductor material having a doping of a second conductivity type is deposited in the recessed regions and over the second semiconductor material layer 602. The second conductivity type that is the opposite of the first conductivity type. For example, if the first conductivity type is p-type, the second conductivity type is n-type, and vice versa. The dopant concentration in the deposited doped semiconductor material can be in a range from $5.0 \times 10^{19}/cm^3$ to $2.0 \times 10^{21}/cm^3$, although lesser and greater dopant concentrations can also be employed.

Portions of the deposited semiconductor material and the second semiconductor material layer 602 located above the horizontal plane including the top surface of the insulating cap layer 70 can be removed by a planarization process. The planarization process can employ, for example, chemical mechanical planarization (CMP) or a recess etch. Each remaining portion of the doped semiconductor material of the second conductivity type constitutes a drain region 63. The drain regions 63 can include doped polysilicon or doped amorphous silicon that can be annealed into doped polysilicon. Each drain region 63 can be located entirety within a memory opening 49 or entirely within a support opening 19. Each remaining portion of the second semiconductor channel layer 602 can be located entirety within a memory opening 49 or entirely within a support opening 19.

Each adjoining pair of a first semiconductor channel layer 601 and a second semiconductor channel layer 602 can collectively form a vertical semiconductor channel 60 through which electrical current can flow when a vertical NAND device including the vertical semiconductor channel 60 is turned on. A tunneling dielectric layer 56 is surrounded by a charge storage layer 54, and laterally surrounds a portion of the vertical semiconductor channel 60. Each adjoining set of a blocking dielectric layer 52, a charge storage layer 54, and a tunneling dielectric layer 56 collectively constitute a memory film 50, which can store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Each combination of a memory film 50 and a vertical semiconductor channel 60 within a memory opening 49 constitutes a memory stack structure 55. The memory stack structure 55 is a combination of a semiconductor channel, a tunneling dielectric layer, a plurality of memory elements as embodied as portions of the charge storage layer 54, and an optional blocking dielectric layer 52. Each combination of a pedestal channel portion 11 (if present), a memory stack structure 55, a dielectric core 62, and a drain region 63 within a memory opening 49 is herein referred to as a memory opening fill structure 58. Each combination of a pedestal channel portion 11 (if present), a memory film 50, a vertical semiconductor channel 60, a dielectric core 62, and a drain region 63 within each support opening 19 fills the respective support openings 19, and constitutes a support pillar structure 20.

Figure 6:
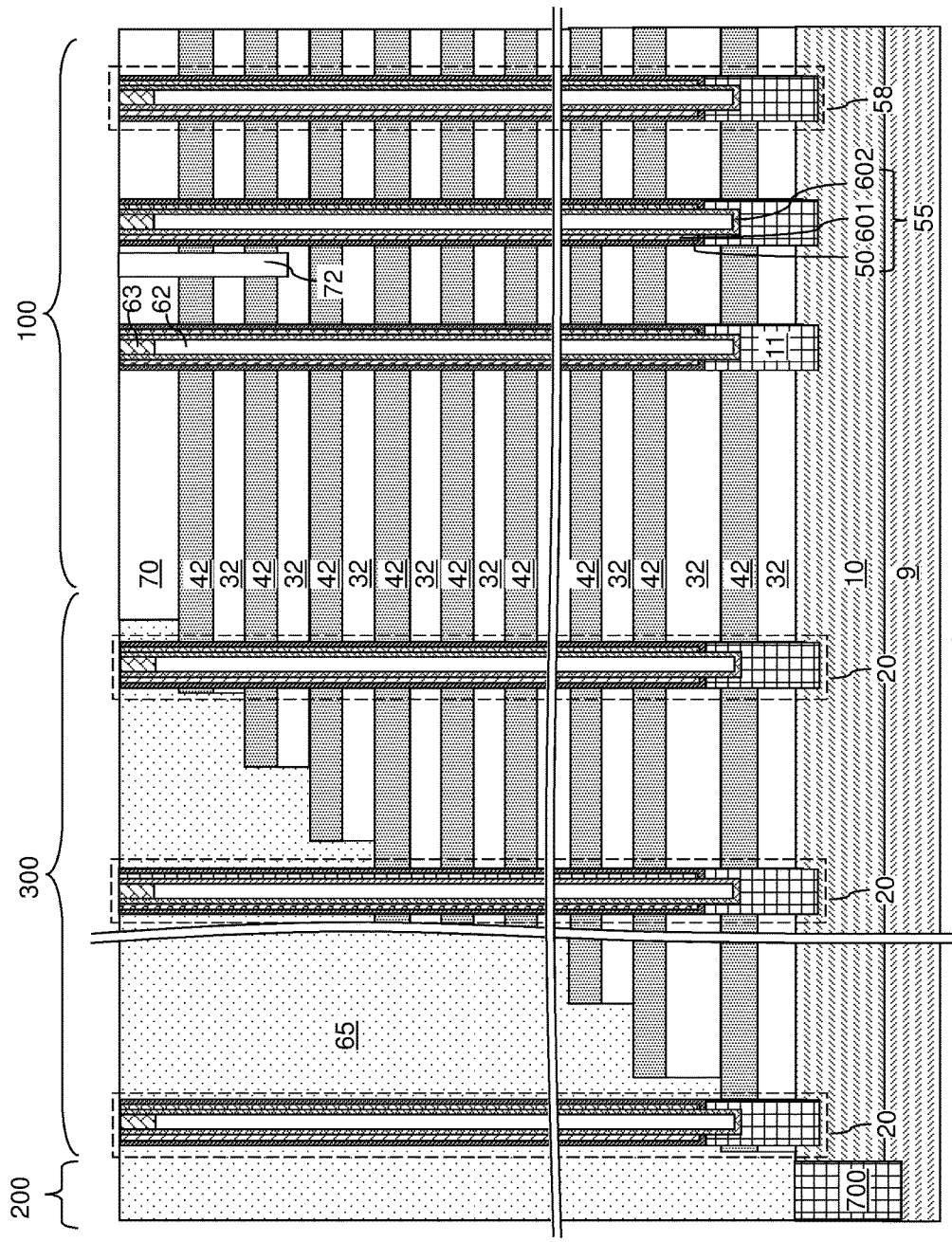
FIG. 6 is a schematic vertical cross-sectional view of the exemplary structure after formation of memory stack structures and support pillar structures according to an embodiment of the present disclosure.

Referring to FIG. 6, the exemplary structure is illustrated after formation of memory opening fill structures 58 and support pillar structure 20 within the memory openings 49 and the support openings 19, respectively. An instance of a memory opening fill structure 58 can be formed within each memory opening 49 of the structure of FIGS. 4A and 4B. An instance of the support pillar structure 20 can be formed within each support opening 19 of the structure of FIGS. 4A and 4B.

Each memory stack structure 55 includes a vertical semiconductor channel 60, which may comprise multiple semiconductor channel layers (601, 602), and a memory film 50. The memory film 50 may comprise a tunneling dielectric layer 56 laterally surrounding the vertical semiconductor channel 60 and a vertical stack of charge storage regions laterally surrounding the tunneling dielectric layer 56 (as embodied as a memory material layer 54) and an optional blocking dielectric layer 52. While the present disclosure is described employing the illustrated configuration for the memory stack structure, the methods of the present disclosure can be applied to alternative memory stack structures including different layer stacks or structures for the memory film 50 and/or for the vertical semiconductor channel 60.

Figure 7A:
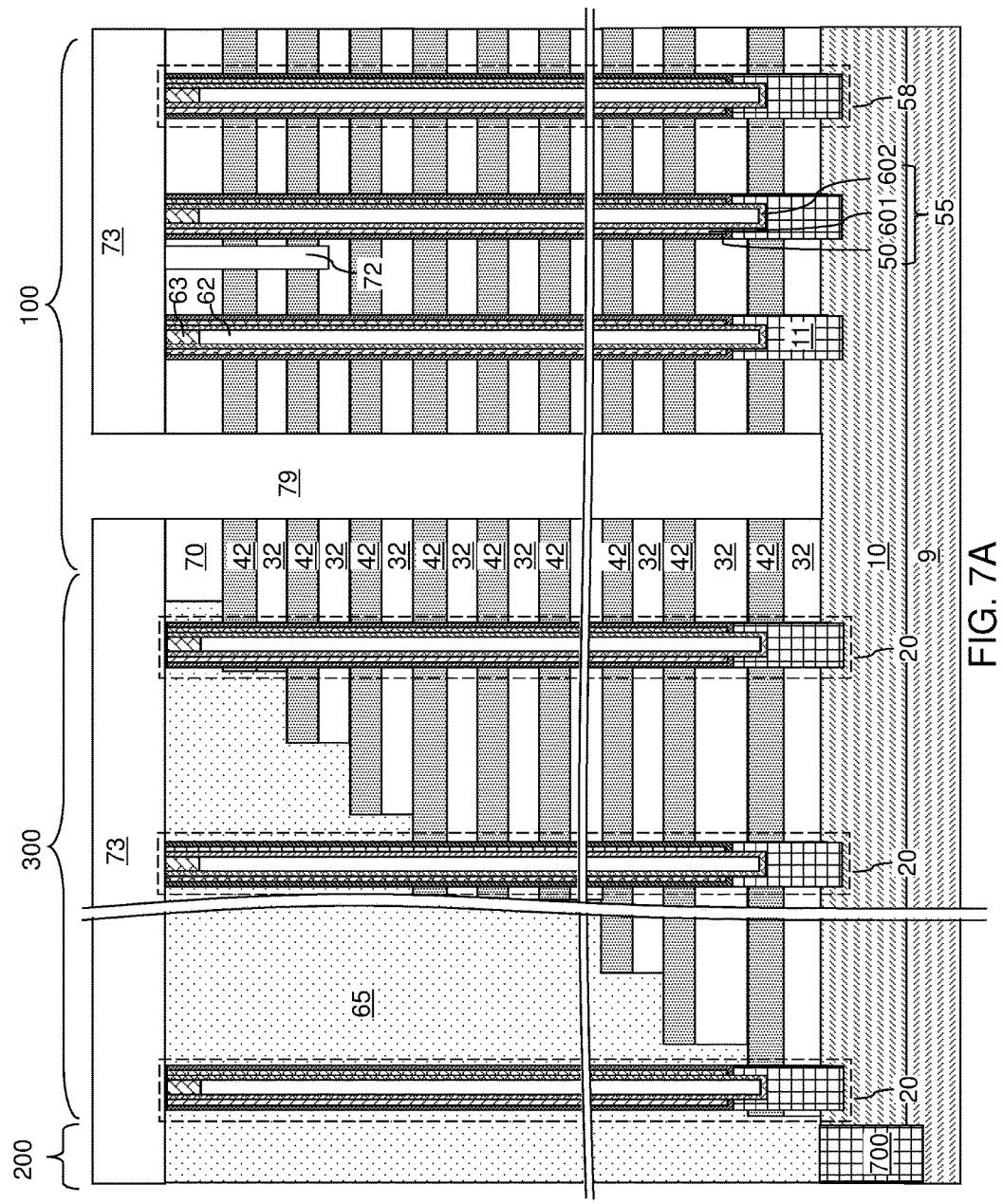
FIG. 7A is a schematic vertical cross-sectional view of the exemplary structure after formation of backside trenches according to an embodiment of the present disclosure.
Figure 7B:
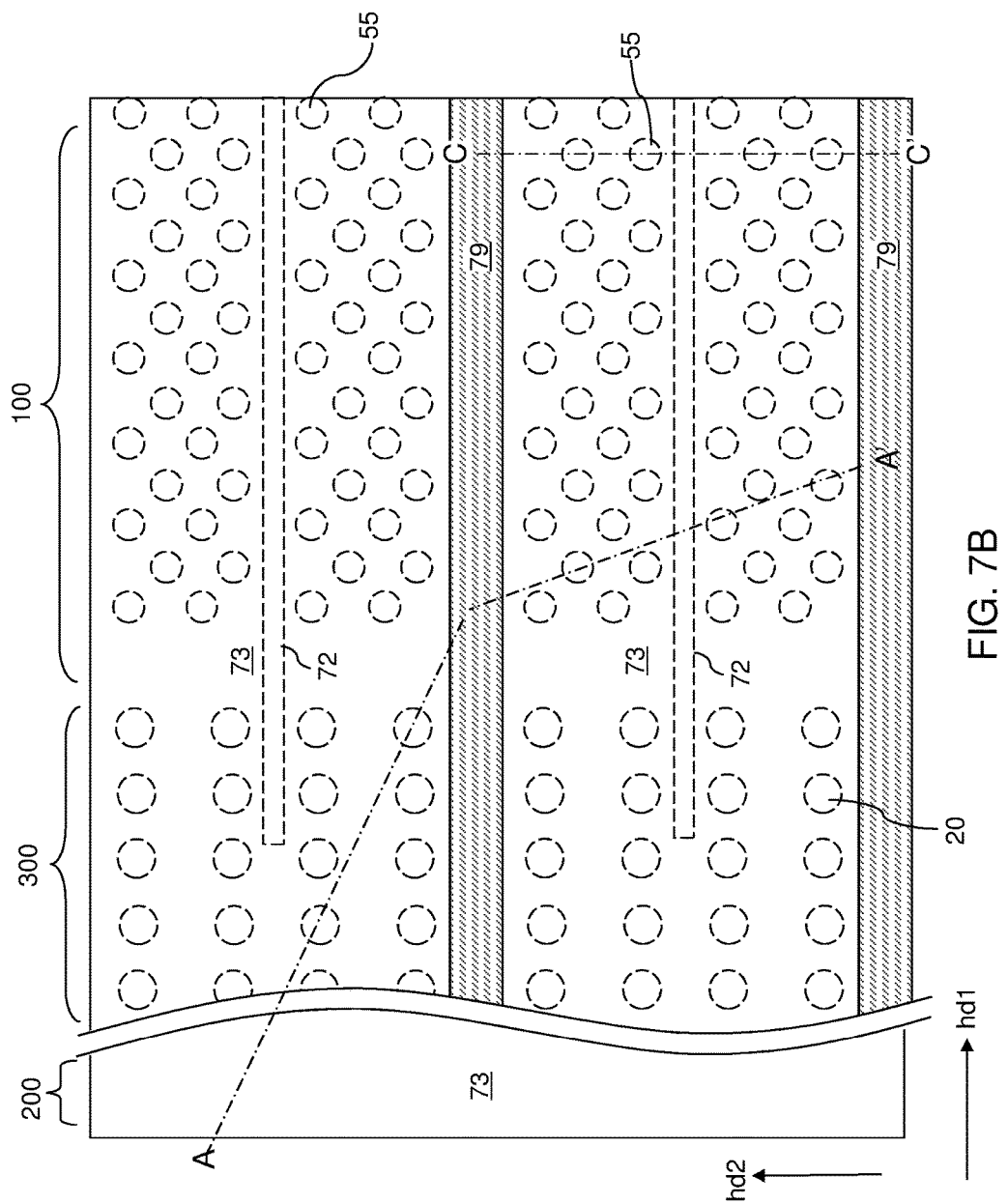
FIG. 7B is a partial see-through top-down view of the exemplary structure of FIG. 7A. The vertical plane A-A' is the plane of the schematic vertical cross-sectional view of FIG. 7A.
Figure 7C:
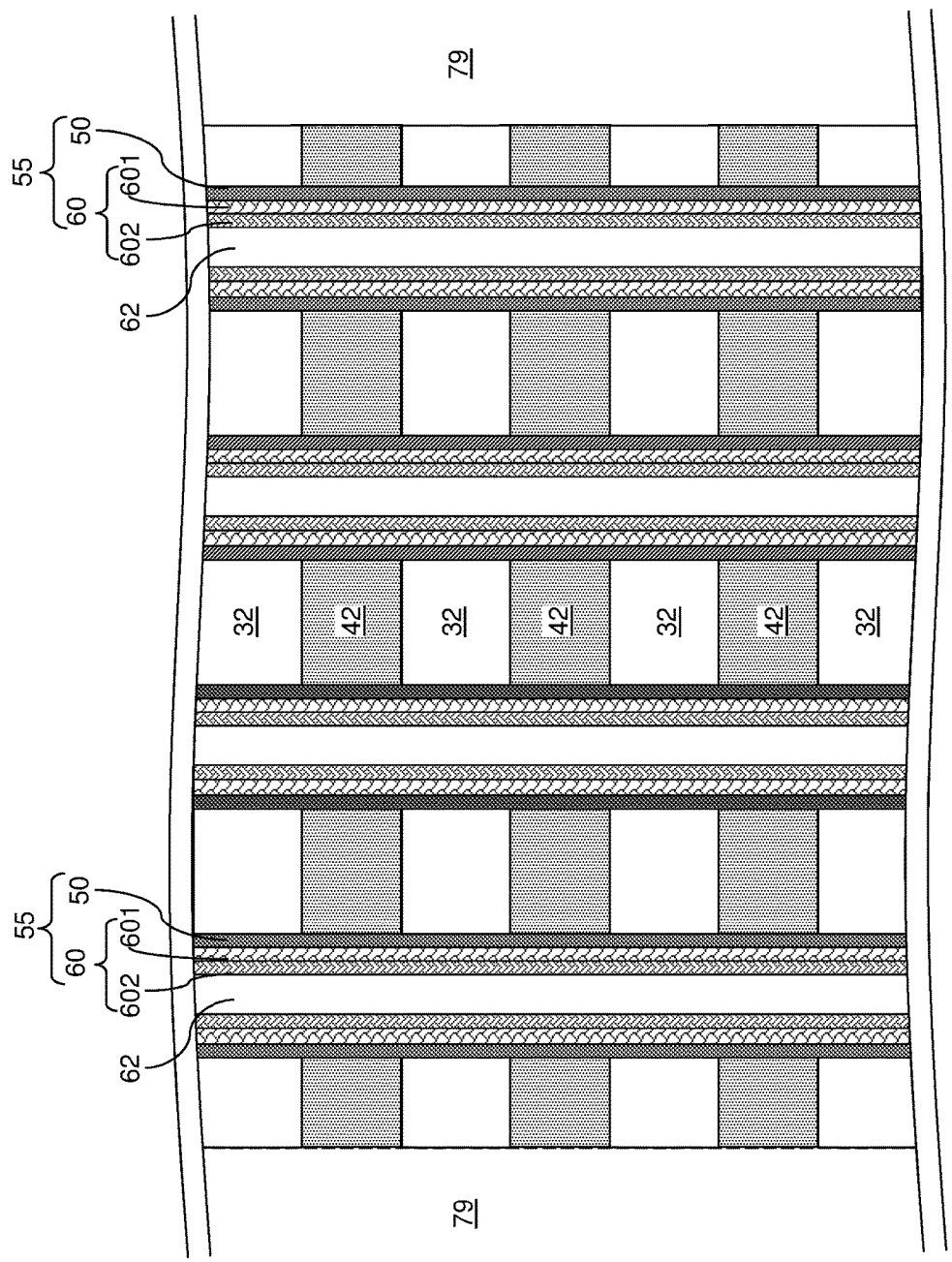
FIG. 7C is a schematic vertical cross-sectional view of a region of the exemplary structure along the vertical plane C-C' of FIG. 7B.

Referring to FIGS. 7A-7C, a contact level dielectric layer 73 can be formed over the alternating stack (32, 42) of insulating layer 32 and sacrificial material layers 42, and over the memory stack structures 55 and the support pillar structures 20. The contact level dielectric layer 73 includes a dielectric material that is different from the dielectric material of the sacrificial material layers 42. For example, the contact level dielectric layer 73 can include silicon oxide. The contact level dielectric layer 73 can have a thickness in a range from 50 nm to 500 nm, although lesser and greater thicknesses can also be employed.

A photoresist layer (not shown) can be applied over the contact level dielectric layer 73, and is lithographically patterned to form openings in areas between clusters of memory stack structures 55. The pattern in the photoresist layer can be transferred through the contact level dielectric layer 73, the alternating stack (32, 42) and/or the retro-stepped dielectric material portion 65 employing an anisotropic etch to form backside trenches 79, which vertically extend from the top surface of the contact level dielectric layer 73 at least to the top surface of the substrate (9, 10), and laterally extend through the memory array region 100 and the contact region 300.

In one embodiment, the backside trenches 79 can laterally extend along a first horizontal direction hd1 and can be laterally spaced apart among one another along a second horizontal direction hd2 that is perpendicular to the first horizontal direction hd1. The memory stack structures 55 can be arranged in rows that extend along the first horizontal direction hd1. The drain select level isolation structures 72 can laterally extend along the first horizontal direction hd1. Each backside trench 79 can have a uniform width that is invariant along the lengthwise direction (i.e., along the first horizontal direction hd1). Each drain select level isolation structure 72 can have a uniform vertical cross-sectional profile along vertical planes that are perpendicular to the first horizontal direction hd1 that is invariant with translation along the first horizontal direction hd1. Multiple rows of memory stack structures 55 can be located between a neighboring pair of a backside trench 79 and a drain select level isolation structure 72, or between a neighboring pair of drain select level isolation structures 72. In one embodiment, the backside trenches 79 can include a source contact opening in which a source contact via structure can be subsequently formed. The photoresist layer can be removed, for example, by ashing.

Figure 8A:
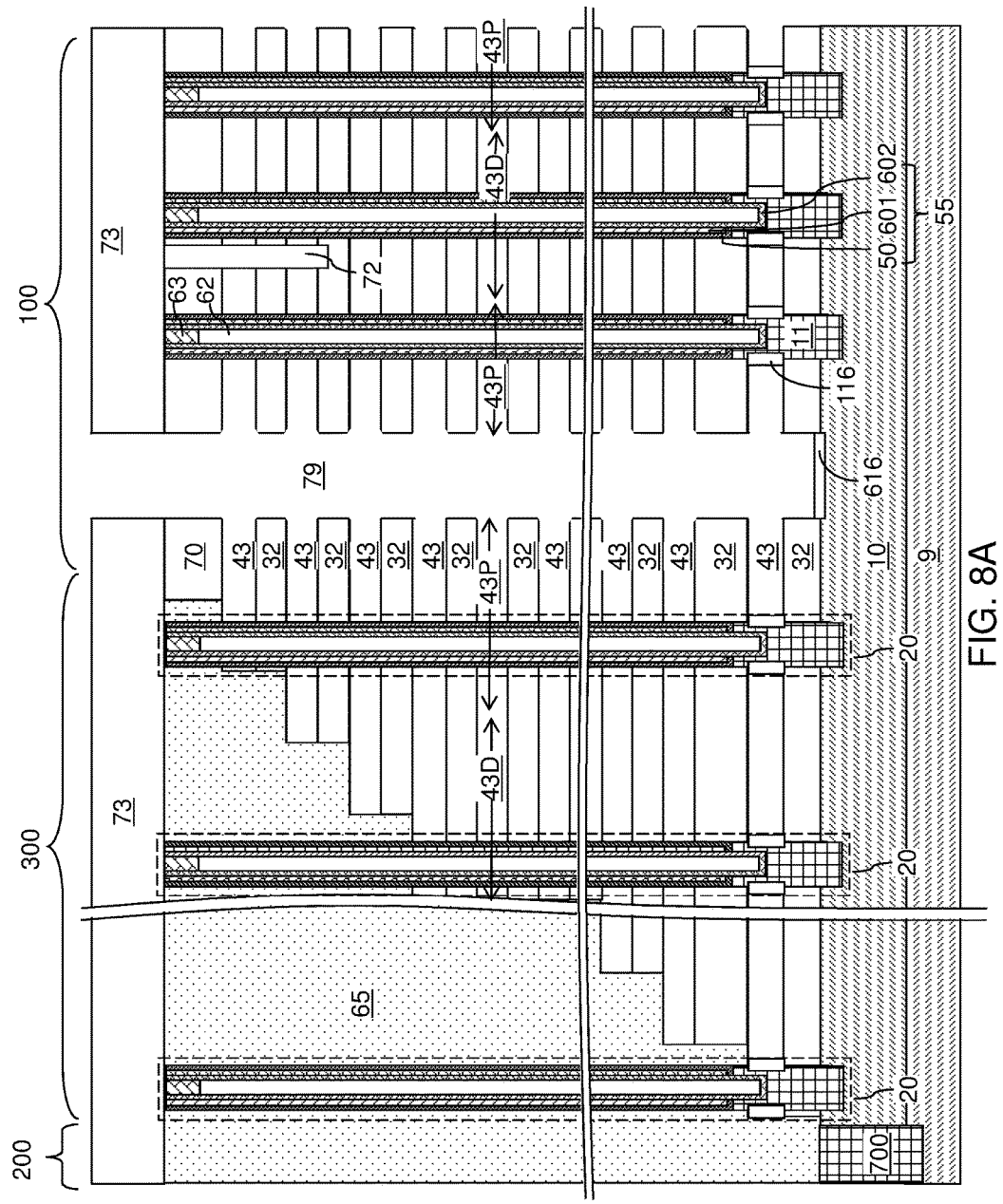
FIG. 8A is a schematic vertical cross-sectional view of the exemplary structure after formation of backside recesses according to an embodiment of the present disclosure.
Figure 8B:
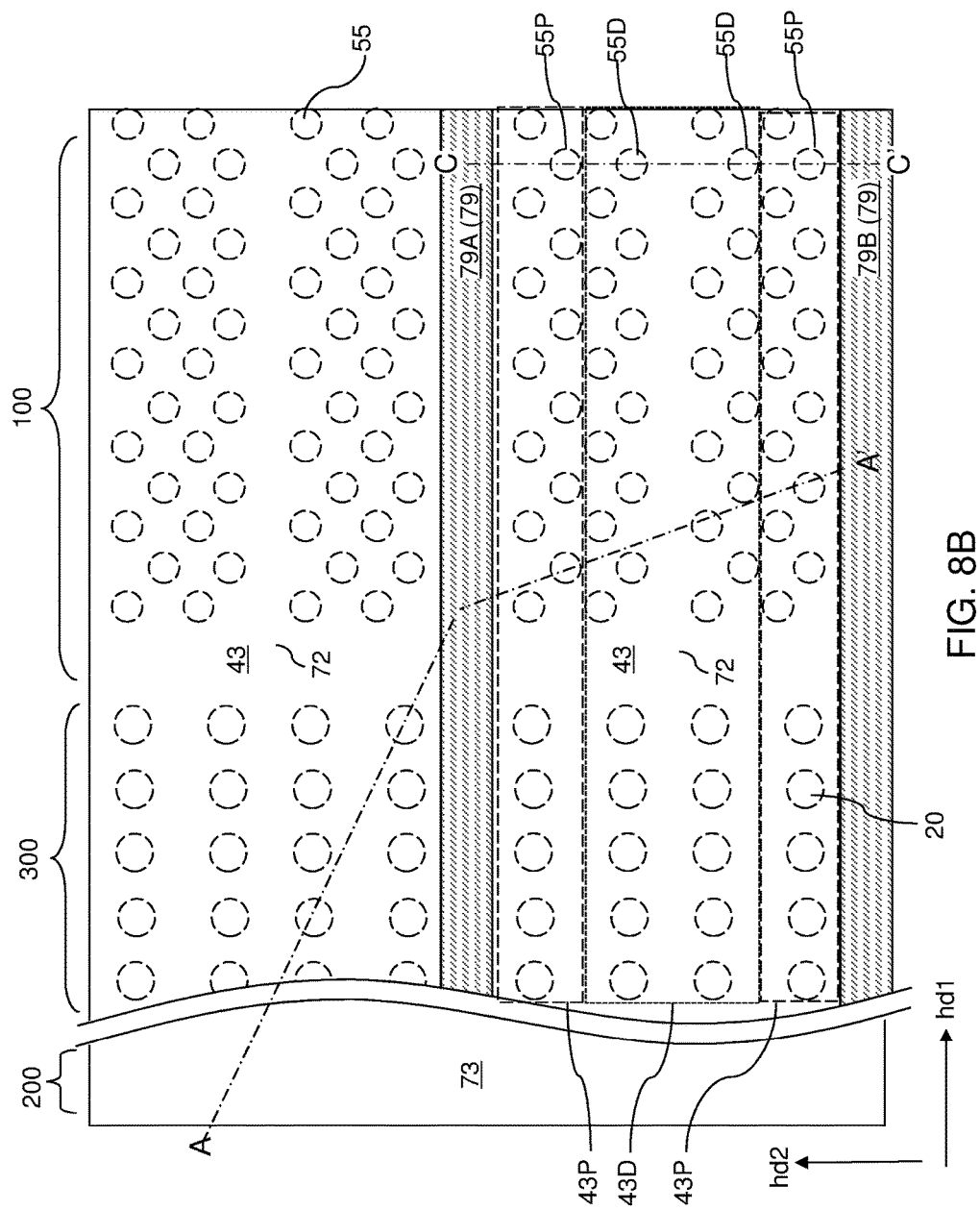
FIG. 8B is horizontal cross sectional view of the exemplary structure of FIG. 8A along horizontal plane B-B'. The vertical plane A-A' is the plane of the schematic vertical cross-sectional view of FIG. 8B.
Figure 9A:
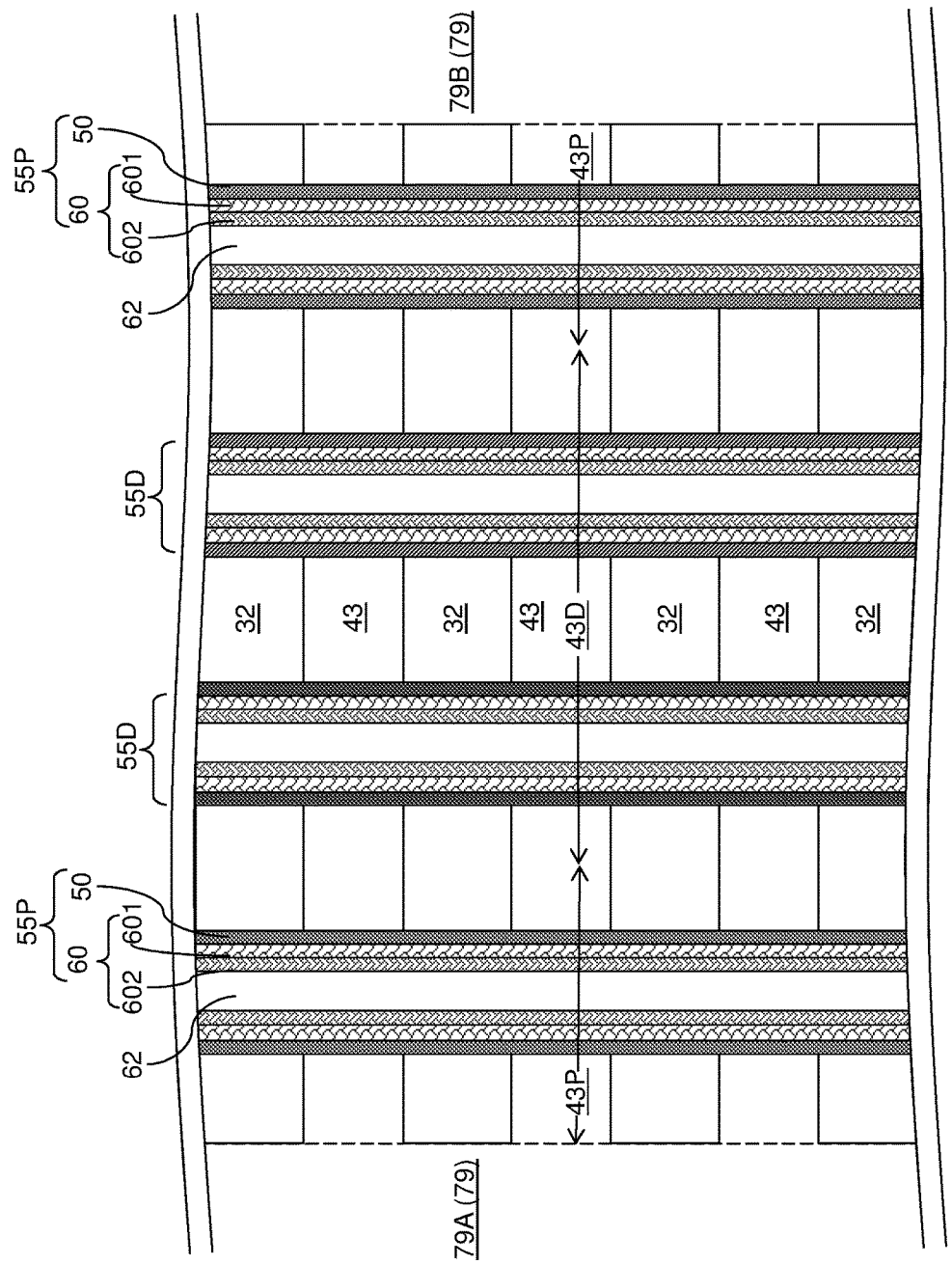
FIGS. 9A-9F are sequential vertical cross-sectional views of a region of the exemplary structure along a vertical plane corresponding to the vertical plane C-C' in FIG. 8B during formation of first exemplary electrically conductive layers according to an embodiment of the present disclosure.

Referring to FIGS. 8A, 8B and 9A, an etchant that selectively etches the second material of the sacrificial material layers 42 with respect to the first material of the insulating layers 32 can be introduced into the backside trenches 79, for example, employing an etch process. FIG. 9A illustrates a region of the exemplary structure of FIG. 8A along a vertical plane corresponding to the vertical plane C-C' in FIG. 8B. Backside recesses 43 are formed in volumes from which the sacrificial material layers 42 are removed. The removal of the second material of the sacrificial material layers 42 can be selective to the first material of the insulating layers 32, the material of the retro-stepped dielectric material portion 65, the semiconductor material of the semiconductor material layer 10, and the material of the outermost layer of the memory films 50. In one embodiment, the sacrificial material layers 42 can include silicon nitride, and the materials of the insulating layers 32 and the retro-stepped dielectric material portion 65 can be selected from silicon oxide and dielectric metal oxides.

The etch process that removes the second material selective to the first material and the outermost layer of the memory films 50 can be a wet etch process employing a wet etch solution, or can be a gas phase (dry) etch process in which the etchant is introduced in a vapor phase into the backside trenches 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials employed in the art. The support pillar structure 20, the retro-stepped dielectric material portion 65, and the memory stack structures 55 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed.

In one embodiment, the memory array region 100 comprises an array of monolithic three-dimensional NAND strings having a plurality of device levels disposed above the substrate (9, 10). In this case, each backside recess 43 can define a space for receiving a respective word line of the array of monolithic three-dimensional NAND strings.

Each of the plurality of backside recesses 43 can extend substantially parallel to the top surface of the substrate (9, 10). A backside recess 43 can be vertically bounded by a top surface of an underlying insulating layer 32 and a bottom surface of an overlying insulating layer 32. In one embodiment, each backside recess 43 can have a uniform height throughout.

As shown in FIGS. 8A, 8B and 9A, each backside recess 43 contains one or more regions 43P which are proximal to the backside trench 79, and a region 43D which is distal from the backside trench 79. For example, as shown in FIGS. 8B and 9A, a backside recess 43 located between two neighboring backside trenches (79A, 79B) contains two proximal regions 43P, each of which is adjacent to each respective backside trench 79, and one distal region 43D which is located between the two proximal regions 43P.

The memory openings 49 in which the memory stack structures 55 are formed are herein referred to as front side openings or front side cavities in contrast with the backside recesses 43. As shown in FIGS. 8B and 9A, the memory stack structures 55 are arranged in rows parallel to the first horizontal direction (e.g., word line direction) hd1 in either the proximal regions 43P or the distal region 43D. The memory stack structures 55 in the rows that are located in the proximal regions 43P are referred to as proximal memory stack structures 55P. The memory stack structures 55 that are located in the rows in the distal region 43D are referred to as distal memory stack structures 55D. In one non-limiting example shown in FIG. 8B, there are eight rows of memory stack structures 55 located between two adjacent backside trenches (79A, 79B). The two edge rows adjacent to each backside trench (79A, 79B) are located in the respective proximal region 43P and include proximal memory stack structures 55P. The four middle rows in the distal region 43D include distal memory stack structures 55D. It should be noted that there may be only one row of memory stack structures in each region and/or more than one (e.g., two through ten for example) rows of memory stack structures in each region.

Physically exposed surface portions of the optional pedestal channel portions 11 and the semiconductor material layer 10 can be converted into dielectric material portions by thermal conversion and/or plasma conversion of the semiconductor materials into dielectric materials. For example, thermal conversion and/or plasma conversion can be employed to convert a surface portion of each pedestal channel portion 11 into a tubular dielectric spacer 116, and to convert each physically exposed surface portion of the semiconductor material layer 10 into a planar dielectric portion 616. In one embodiment, each tubular dielectric spacer 116 can be topologically homeomorphic to a torus, i.e., generally ring-shaped. As used herein, an element is topologically homeomorphic to a torus if the shape of the element can be continuously stretched without destroying a hole or forming a new hole into the shape of a torus. The tubular dielectric spacers 116 include a dielectric material that includes the same semiconductor element as the pedestal channel portions 11 and additionally includes at least one non-metallic element such as oxygen and/or nitrogen such that the material of the tubular dielectric spacers 116 is a dielectric material. In one embodiment, the tubular dielectric spacers 116 can include a dielectric oxide, a dielectric nitride, or a dielectric oxynitride of the semiconductor material of the pedestal channel portions 11. Likewise, each planar dielectric portion 616 includes a dielectric material that includes the same semiconductor element as the semiconductor material layer and additionally includes at least one non-metallic element such as oxygen and/or nitrogen such that the material of the planar dielectric portions 616 is a dielectric material. In one embodiment, the planar dielectric portions 616 can include a dielectric oxide, a dielectric nitride, or a dielectric oxynitride of the semiconductor material of the semiconductor material layer 10.

Figure 9B:
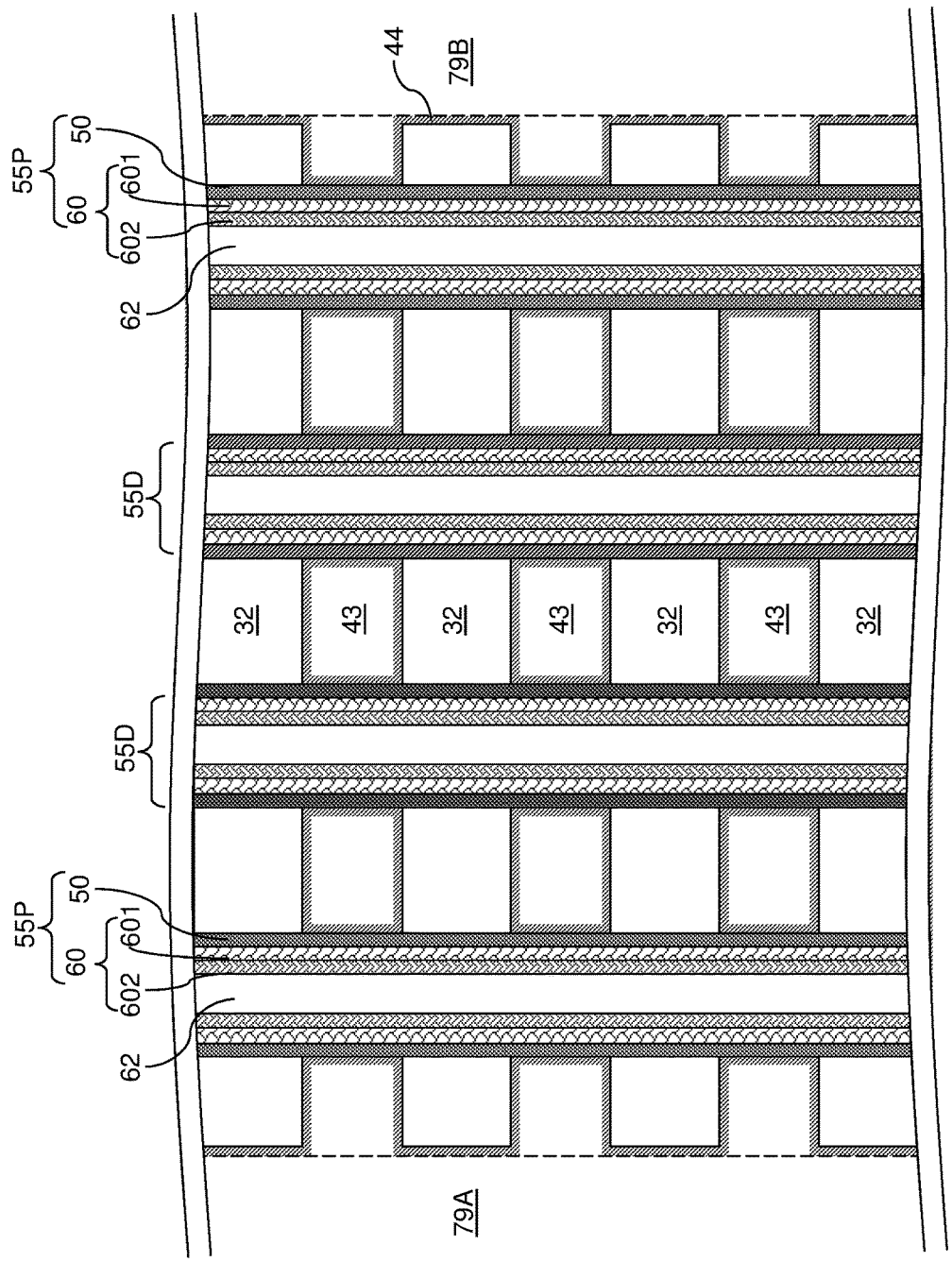

Referring to FIG. 9B, a backside blocking dielectric layer 44 can be optionally formed. The backside blocking dielectric layer 44, if present, comprises a dielectric material that functions as a control gate dielectric for the control gates to be subsequently formed in the backside recesses 43. In case the blocking dielectric layer 52 is present within each memory opening, the backside blocking dielectric layer 44 is optional. In case the blocking dielectric layer 52 is omitted, the backside blocking dielectric layer 44 is present.

The backside blocking dielectric layer 44 can be formed in the backside recesses 43 and on a sidewall of the backside trench 79. The backside blocking dielectric layer 44 can be formed directly on horizontal surfaces of the insulating layers 32 and sidewalls of the memory stack structures 55 within the backside recesses 43. If the backside blocking dielectric layer 44 is formed, formation of the tubular dielectric spacers 116 and the planar dielectric portion 616 prior to formation of the backside blocking dielectric layer 44 is optional. In one embodiment, the backside blocking dielectric layer 44 can be formed by a conformal deposition process such as atomic layer deposition (ALD). The backside blocking dielectric layer 44 can consist essentially of aluminum oxide. The thickness of the backside blocking dielectric layer 44 can be in a range from 1 nm to 15 nm, such as 2 to 6 nm, although lesser and greater thicknesses can also be employed.

The dielectric material of the backside blocking dielectric layer 44 can be a dielectric metal oxide such as aluminum oxide, a dielectric oxide of at least one transition metal element, a dielectric oxide of at least one Lanthanide element, a dielectric oxide of a combination of aluminum, at least one transition metal element, and/or at least one Lanthanide element. Alternatively or additionally, the backside blocking dielectric layer 44 can include a silicon oxide layer. The backside blocking dielectric layer 44 can be deposited by a conformal deposition method such as chemical vapor deposition or atomic layer deposition. The backside blocking dielectric layer 44 is formed on the sidewalls of the backside trenches 79, horizontal surfaces and sidewalls of the insulating layers 32, the portions of the sidewall surfaces of the memory stack structures 55 that are physically exposed to the backside recesses 43, and a top surface of the planar dielectric portion 616.

Figure 9C:
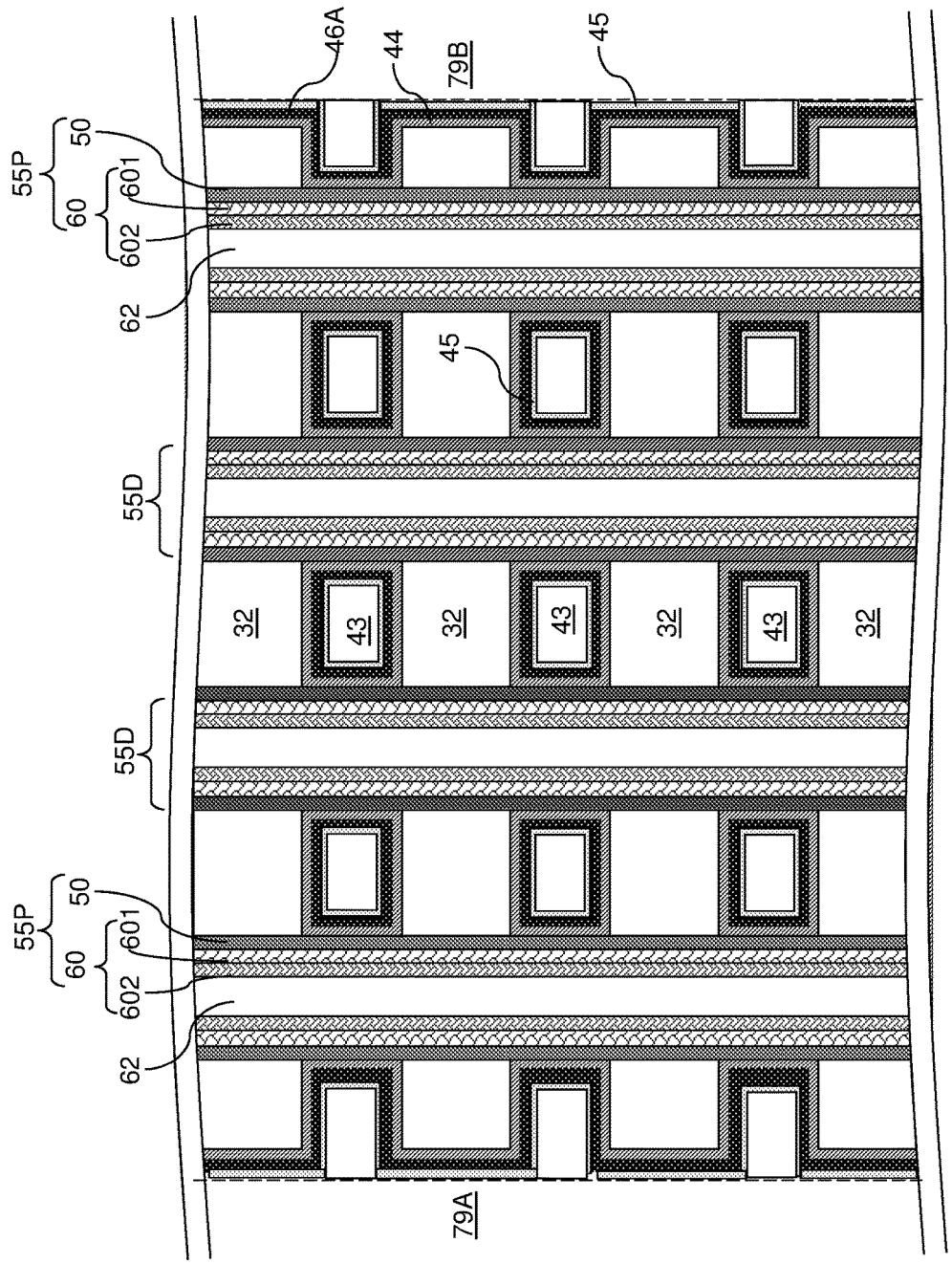

Referring to FIG. 9C, a metallic nitride liner 46A can be deposited by a conformal deposition process on the physically exposed surfaces of the backside blocking dielectric layer 44 (or on surfaces of the memory stack structures 55 if layer 44 is omitted). The metallic nitride liner 46A includes a metallic nitride material such as TiN, TaN, WN, or a layer stack thereof. The metallic nitride liner 46A can be deposited, for example, by chemical vapor deposition, and can have a uniform thickness throughout. The thickness of the metallic nitride liner 46A can be in a range from 1 nm to 12 nm, such as from 2 nm to 6 nm, although lesser and greater thicknesses can also be employed.

A tungsten-nucleation-material layer 45 is deposited directly on all physically exposed surfaces of the metallic nitride liner 46A. As used herein, a "tungsten nucleation material" refers to a material that induces nucleation of tungsten on a surface thereof.

The tungsten-nucleation-material layer 45 can be formed by surface adsorption or deposition of at least one element selected from silicon, germanium, and boron. In one embodiment, the tungsten-nucleation-material layer 45 can be formed by conformal deposition of silicon atoms, boron atoms, and/or germanium atoms by thermal decomposition of at least one hydride gas. For example, at least one gas selected from $SiH_4$, $Si_2H_6$, $B_2H_6$, $GeH_4$, and $Ge_2H_6$ can be flowed into a process chamber including the exemplary structure, and can be thermally decomposed to form the tungsten-nucleation-material layer 45 including one or more monolayers of silicon atoms, boron atoms, germanium atoms, or a combination thereof. Thus, the tungsten-nucleation-material layer 45 can be a silicon layer, a boron layer, a germanium layer, a silicon germanium layer, a silicon-boron polymer layer, etc. The thickness of the tungsten-nucleation-material layer 45 can be in a range from 0.3 nm to 2 nm, such as from 0.6 nm to 1.2 nm, although lesser and greater thicknesses can also be employed.

Figure 9D:
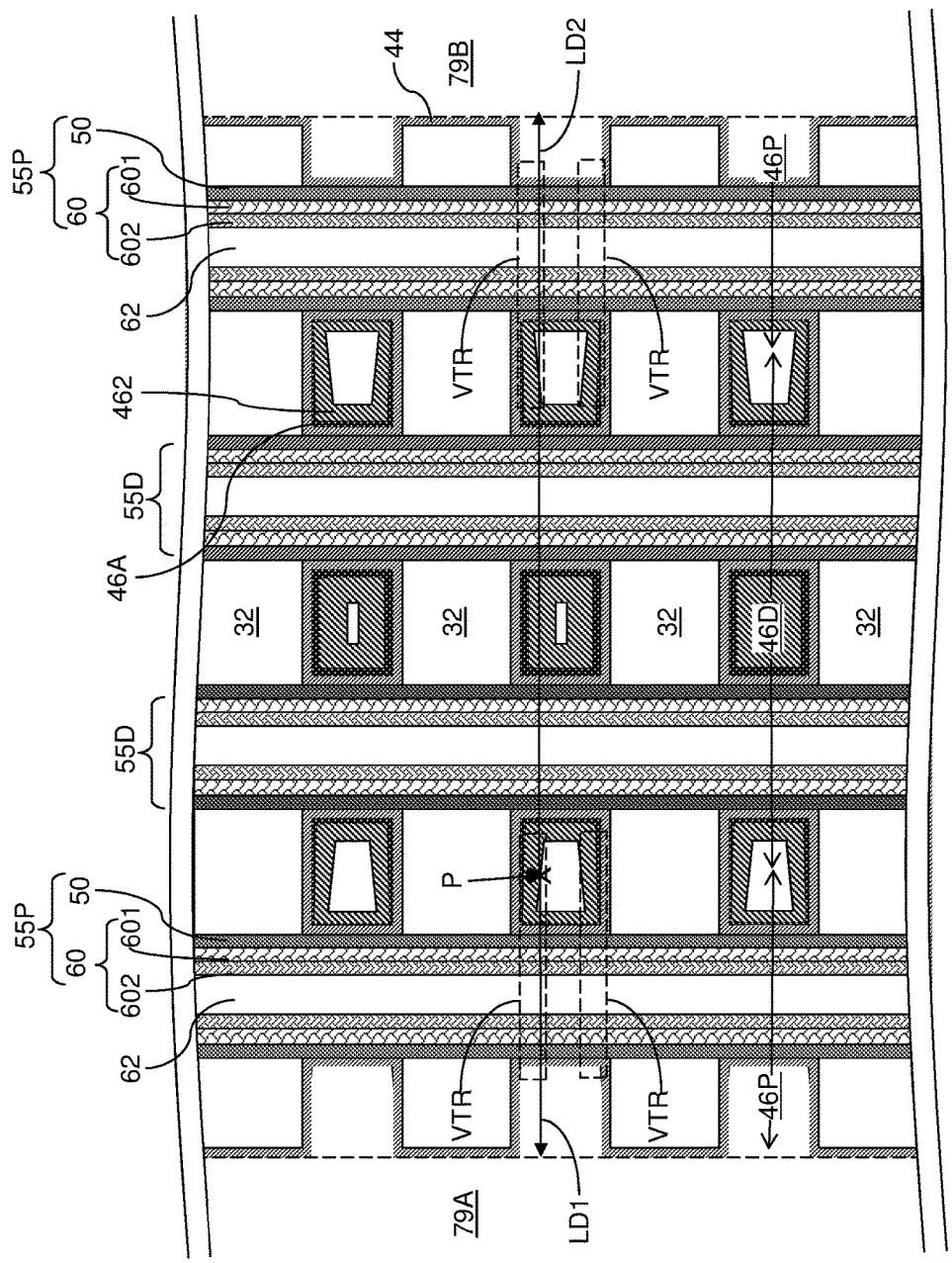

Referring to FIG. 9D, a fluorine-free tungsten layer 462 can be subsequently formed at each level of the backside recesses 43 on the tungsten-nucleation-material layer 45. As used, herein "fluorine-free" means that the reactant used to form the tungsten layer 462 does not include any intentionally added fluorine (i.e., fluorine may be present as an unavoidable impurity), and that fluorine is not intentionally incorporated into the tungsten layer 462 during deposition. Each fluorine-free tungsten layer 462 is formed within a respective one of the backside recesses 43, and is vertically spaced among one another by the insulating layers 32.

The fluorine-free tungsten layer 462 can be formed by repeated pumping and purging of a tungsten chloride reactant from the process chamber containing the exemplary structure. In one embodiment, $WCl_5$ vapor (i.e., $WCl_5$ reactant that is converted into a vapor phase) is provided into the backside recesses 43. In one embodiment, the $WCl_5$ vapor can be provided through the backside trenches 79 and into the backside recesses 43 by pumping of the $WCl_5$ vapor into the CVD or ALD process chamber in which the exemplary structure is placed for processing. In another embodiment, the $WCl_5$ vapor can be provided through the backside trenches 79 and into the backside recesses 43 by pumping of $WCl_6$ vapor (i.e., $WCl_6$ reactant) into the process chamber. Without wishing to be bound by a particular theory, it is believed that in this case, $WCl_6$ molecules can be decomposed in the backside recesses into $WCl_5$ molecules and a chlorine atom that can combine with another chlorine atom to form $Cl_2$ gas and/or which can combine with boron, silicon and/or germanium in the tungsten-nucleation-material layer 45 to form silicon tetrachloride gas, germanium tetrachloride gas or boron trichloride gas. Without wishing to be bound by a particular theory, it is believed that the tungsten-nucleation-material layer 45 reacts with the WCl$_5$ vapor to form WCl$_4$ vapor and at least one of silicon tetrachloride gas, germanium tetrachloride gas or boron trichloride gas. Depending on the species of the atoms in the tungsten-nucleation-material layer 45, any of the following chemical reactions may occur to etch the tungsten-nucleation-material layer 45 concurrently with deposition of fluorine-free tungsten:

$$4WCl_5 + Si \rightarrow 4WCl_4 + SiCl_4; \tag{1}$$

$$4WCl_5 + Ge \rightarrow 4WCl_4 + GeCl_4; \text{ and} \tag{2}$$

$$3WCl_5 + B \rightarrow 3WCl_4 + BCl_3. \tag{3}$$

Without wishing to be bound by a particular theory, it is believed that this step partially etches the tungsten-nucleation-material layer 45.

The pumping step is followed by a purging step in which the vapor and gas is pumped out of the chamber containing the exemplary structure. Without wishing to be bound by a particular theory, it is believed that during the purging step, loosely bound WCl$_4$ molecules are pumped out from the proximal regions 43P of the backside recesses 43 that are located adjacent to the backside trenches 79. However, a significant number of residual WCl$_4$ molecules remain trapped in the distal regions 43D of the backside recesses 43 due to their large size.

Without wishing to be bound by a particular theory, it is believed that the residual WCl$_4$ molecules react with the remaining tungsten-nucleation-material layer 45 in the distal regions 43D to deposit the fluorine-free tungsten layer 462 on the metallic nitride liner 46A in the distal regions 43D. The fluorine-free tungsten layer 462 nucleates only on portions of the tungsten-nucleation-material layer 45 by any of the following chemical reactions:

$$WCl_4 + Si \rightarrow W + SiCl_4; \tag{1}$$

$$WCl_4 + Ge \rightarrow W + GeCl_4; \text{ or} \tag{2}$$

$$3WCl_4 + 4B \rightarrow 3W + 4BCl_3. \tag{3}$$

It is believed that either no fluorine-free tungsten layer 462 is deposited in the proximal regions 43P or that a lower thickness of the fluorine-free tungsten layer 462 is deposited in the proximal regions 43P than in the distal regions 43D. During the tungsten deposition step, the tungsten-nucleation-material layer 45 is consumed. The pump-purge process can be repeated multiple times until a sufficient thickness of the fluorine-free tungsten layer 462 is formed in the distal regions 43D.

Without wishing to be bound by a particular theory, it is believed that the etch rate the metallic nitride liner 46A is proportional to the local partial pressure (i.e., the local density in the gas phase) of the WCl$_5$ vapor, and the deposition rate of tungsten is proportional to the local partial pressure of the WCl$_4$ vapor. The pressure in the process chamber can be controlled such that at least one of the local partial pressure of the WCl$_5$ vapor and the local partial pressure of the WCl$_4$ vapor has a lateral gradient within each backside recess 43 located between a neighboring pair of backside trenches 79. For example, an atomic layer deposition process including an alternating sequence of gas exposure (i.e., "pump") steps and purge steps can be employed such that the supply of the WCl$_5$ vapor or the WCl$_6$ vapor can be pulsed with intervening purge steps.

In one embodiment, the pumping speed and/or the total pressure during the purge steps can be controlled such that pumping of the WCl$_4$ vapor occurs slowly at each purge step. The general pressure range that can be employed for the pulsed etch-deposition process can be in a range from 0.01 mTorr to 10 mTorr, such as from 0.1 mTorr to 3 mTorr, although lesser and greater pressure ranges can also be employed. Thus, the WCl$_4$ vapor can have a longer residence time within the distal regions 43D of the backside recesses 43 than in the proximal regions 43P of the backside recesses 43. Generally, slow pumping of the WCl$_4$ vapor during a purge phase can increase the local residence time for the WCl$_4$ vapor at the distal regions 43D of the backside recesses 43 that are laterally spaced from a neighboring pair of backside trenches 79 by the proximal regions 43P.

For the purpose of etching by the WCl$_5$ vapor, WCl$_5$ vapor or WCl$_6$ vapor can be supplied during the gas exposure steps. The process chamber can be pumped to the base pressure so that injection of the WCl$_5$ vapor or the WCl$_6$ vapor induces a lateral pressure gradient in the backside recesses 43. The proximal regions 43P of the backside recesses 43 can have a higher local partial pressure of the WCl$_5$ vapor than distal regions 43D of the backside recesses 43.

Without wishing to be bound by a particular theory, it is believed that the different residence time for the WCl$_5$ vapor induces non-uniform etching of the metallic nitride liner 46A. The local density of the WCl$_5$ vapor is relatively high within the backside trenches 79. The duration of gas exposure steps and the supply of the WCl$_5$ vapor (or the WCl$_6$ vapor) can be selected such that the metallic nitride liner 46A is completely or partially etched from inside the backside trenches 79. The continuous metallic nitride liner 46A as initially formed at the processing steps of FIG. 9C can be divided into multiple metallic nitride liners 46A located within a respective one of the backside recesses 43. The relatively high local partial pressure of the WCl$_5$ vapor in the proximal regions 43P of the backside recesses 43 is believed to induce etching of the metallic nitride liner 46A. Thus, the metallic nitride liner 46A can have a greater thickness in the distal regions 43D of backside recesses 43 than in the proximal regions 43P. In one embodiment, the thickness of each metallic nitride liner 46A may decrease to zero in outer parts of the proximal regions 43P.

It is believed that the selective etching within the proximal regions 43P can occur for one or both of tungsten-nucleation-material layer 45 and/or the metallic nitride liner 46A. In other words layer 45 can be etched without etching layer 46A and still achieve non-uniform fluorine free tungsten deposition. Without wishing to be bound by a particular theory, it is believed that tungsten deposition does not directly occur on the metallic nitride liner 46A if only the tungsten-nucleation-material layer 45 is etched. It is also believed that tungsten deposition does not directly occur on the underlying aluminum oxide backside blocking dielectric layer 44 if both the metallic nitride liner 46A and the tungsten-nucleation-material layer 45 are etched. Thus, it is not required that both the metallic nitride liner 46A and the tungsten-nucleation-material layer 45 are etched.

Without wishing to be bound by a particular theory, it is believed that as a result of the longer residence time of the WCl$_4$ vapor in the distal regions 43D than in the proximal regions 43P induces non-uniform deposition of the fluorine-free tungsten layers 462 within each backside recess 43. Thus, the fluorine-free tungsten layer 462 can have a greater thickness in the distal regions 43D than in the proximal regions 43P. In one embodiment, the thickness of each fluorine-free tungsten layer 462 may decrease to zero in the proximal regions 43P before each fluorine-free tungsten layer 462 (having a finite thickness in the distal regions 43D) reaches the backside trenches 79.

The thickness of the thickest portion of the fluorine-free tungsten layer 462 may be the same as, or may be less than, the height of the backside recesses 43 as provided at the processing steps of FIG. 9C. In case the thickness of the thickest portion of the fluorine-free tungsten layer 462 is less than the height of the backside recesses 43 as provided at the processing steps of FIG. 9C, each backside recess 43 can continuously extend from a first backside trench 79A adjoining the backside recess 43 to a second backside trench 79B adjoining the backside recess 43. Each of the fluorine-free tungsten layers 462 is formed over a respective surface area of the backside blocking dielectric layer 44, and includes at least a portion that is spaced from the backside blocking dielectric layer by a metallic nitride liner 46A, which in one embodiment can have a variable thickness.

Generally, different residence time can be provided for the $WCl_5$ vapor and/or for the $WCl_4$ vapor across regions of the proximal and distal regions of the backside recesses 43 through pressure control (e.g., pump and purge steps and/or overall pressure) of the process chamber. Fluorine-free tungsten layers 462 are formed in the backside recesses 43 such that each of the fluorine-free tungsten layers 462 is formed within a respective one of the backside recesses 43 and includes variable thickness regions VTR that have a respective variable vertical thickness that increases with a distance from the nearest backside trench 79. The nearest trench distance is defined as a lesser of a first lateral distance LD1 from a given point P to the first backside trench 79A and a second lateral distance LD2 from the given point to the second backside trench 79B. The first backside trench 79A and the second backside trench 79B are a pair of backside trenches 79 by which the backside recesses 43 are laterally bound, and the given point P is any point at which the nearest trench distance is measured.

While the present disclosure is described employing an embodiment in which the $WCl_4$ vapor has a greater residence time in the distal regions 43D than in the proximal regions 43P of the backside recesses 43, and/or an embodiment in which $WCl_5$ vapor has a shorter residence time in the distal regions 43D than in the proximal regions 43P of the backside recesses 43, embodiments in which one of the above conditions and/or other condition(s) are used may be employed to form fluorine-free tungsten layers 462 having a lateral thickness gradient and/or to form metallic nitride liner 46A having a lateral thickness gradient. In other words, embodiments may be employed in which differential etching or differential nucleation is employed to provide the lateral thickness gradient in the fluorine-free tungsten layer 462 and/or the lateral thickness gradient in the metallic nitride liner 46A.

Figure 9E:
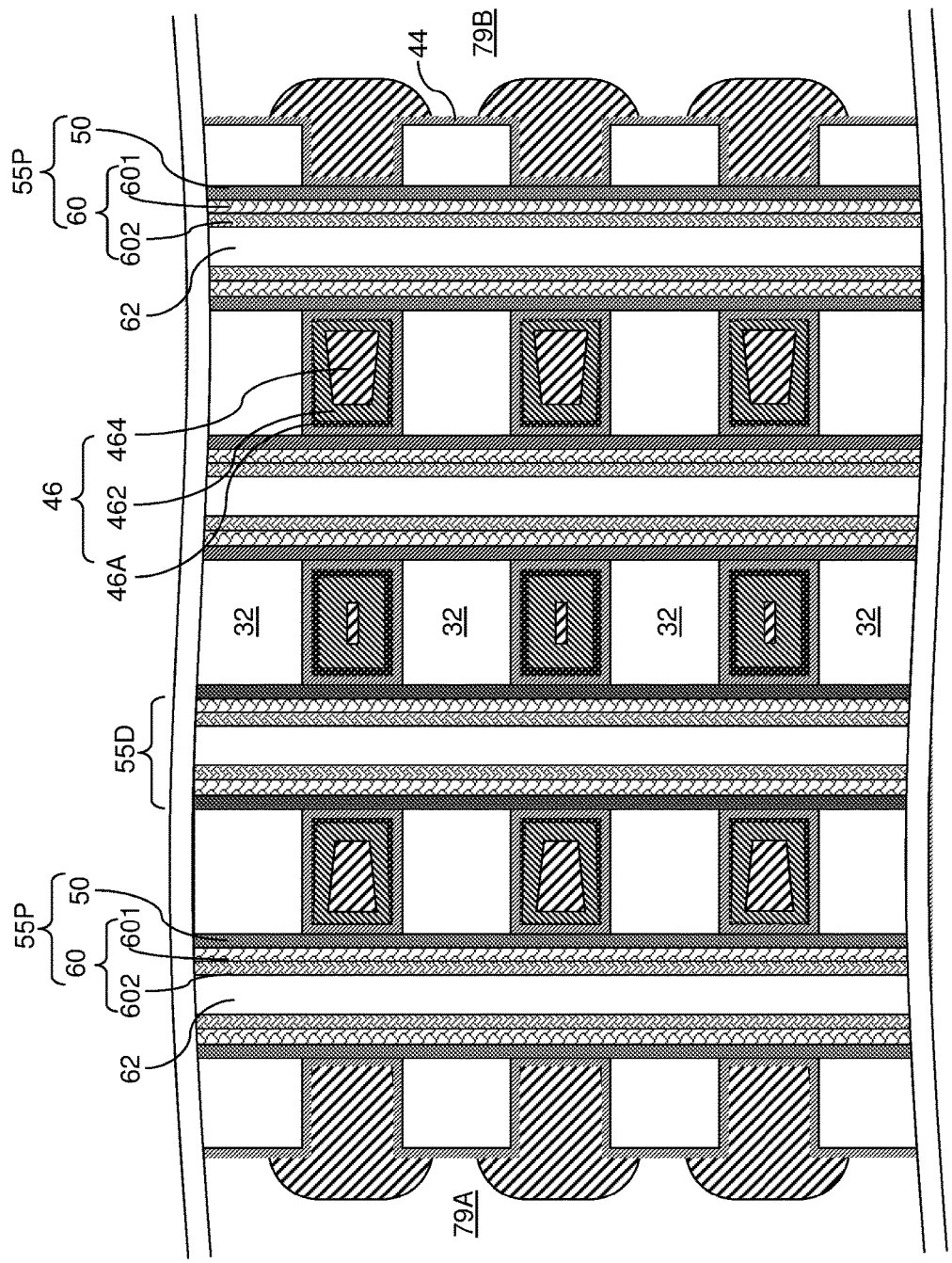

Referring to FIG. 9E, at least one metallic fill material layer having a different composition than the fluorine-free tungsten layers 462 is formed in each remaining volume of the backside recesses 43. The at least one metallic fill material layer comprises a material selected from a fluorine-containing tungsten and/or a metal other than tungsten. In one embodiment, the at least one metallic fill material layer can include a fluorine-containing tungsten layer 464. For example, a tungsten deposition process employing $WF_6$ reactant can be employed to deposit the fluorine-containing tungsten layer 464. In this case, the fluorine-free tungsten layers 462 can consist essentially of tungsten atoms and additional atoms selected from chlorine and optionally one or more of silicon, boron and germanium atoms that are present at an atomic concentration in a range from 1 part per million to 100 parts per million, such as from 3 parts per million to 30 parts per million. The fluorine-containing tungsten layer 464 can consist essentially of tungsten atoms and fluorine atoms that are present at an atomic concentration in a range from 1 part per million to 100 parts per million, such as from 3 parts per million to 30 parts per million.

Decomposition of $WF_6$ and growth of the material of the fluorine-containing tungsten layer 464 occurs only on metallic surfaces and does not proceed from non-metallic surfaces. Thus, the material of the fluorine-containing tungsten layer 464 grows from the center regions of the remaining volumes of the backside recesses 43 toward the backside trenches 79. A seamless deposition of a fluorine-containing tungsten material can occur in the backside recesses 43 until the entire remaining volume of each backside recess 43 is filled with a respective fluorine-containing tungsten layer 464. Each contiguous combination of a metallic nitride liner 46A, a fluorine-free tungsten layer 462, and a fluorine-containing tungsten layer 464 constitutes a first exemplary electrically conductive layer 46 that laterally extends from a first backside trench 79A to a second backside trench 79B.

Each first exemplary electrically conductive layer 46 has a lateral compositional gradient, i.e., a gradual change in the composition along a lateral direction. Specifically, the thicknesses of the metallic nitride liner 46A and the fluorine-free tungsten layer 462 gradually decrease from a distal region 46D of the electrically conductive layer 46 located in the distal regions 43D of the backside recesses to the proximal regions 46P of the electrically conductive layer located in the proximal regions 43P of the backside recesses. For example, an electrically conductive layer 46 (e.g., a word line of a NAND memory device) located between two neighboring backside trenches 79 contains two proximal regions 46P, each of which is located adjacent to each respective backside trench 79, and one distal region 46D which is located between the two proximal regions 46P.

The thickness of the fluorine-containing tungsten layer 464 gradually increases from the distal region 46D of each first exemplary electrically conductive layer 46 toward the proximal regions 46P at each of the first and second backside trenches 79. Each measurement of the composition of each first exemplary electrically conductive layer 46 can be performed within a respective vertical plane that includes a point of measurement and is parallel to the sidewalls of the backside trenches 79, i.e., sidewalls of the insulating layers 32. In other words, the "composition" of each first exemplary electrically conductive layer 46 refers to an areal composition within vertical planes that are parallel to sidewalls of the backside trenches 79. Due to the changes in the thicknesses of the various components layers (46A, 462, 464) within each first exemplary electrically conductive layer 46, the composition of each first exemplary electrically conductive layer 46 laterally changes through changes in the relative weight of the various component layers (i.e., each layer within a set of a metallic nitride liner 46A, a fluorine-free tungsten layer 462, and a fluorine-containing tungsten layer 464) within the first exemplary electrically conductive layer 46.

In one embodiment, there may be some unavoidable interdiffusion of fluorine and chlorine between layers 462 and 464 during or after deposition of layer 464. However, in one embodiment, the fluorine-free tungsten layer 462 contains at least 100 times less atomic fluorine concentration than the fluorine-containing tungsten layer 464. Likewise, the fluorine-containing tungsten layer 464 contains at least 100 times less atomic chlorine concentration than the fluorine-free tungsten layer 462. For example, the difference in fluorine or chlorine concentration between layers 462 and 464 can range between $5 \times 10^{19}$ to $5 \times 10^{21}$ atoms per $cm^3$.

Figure 9F:
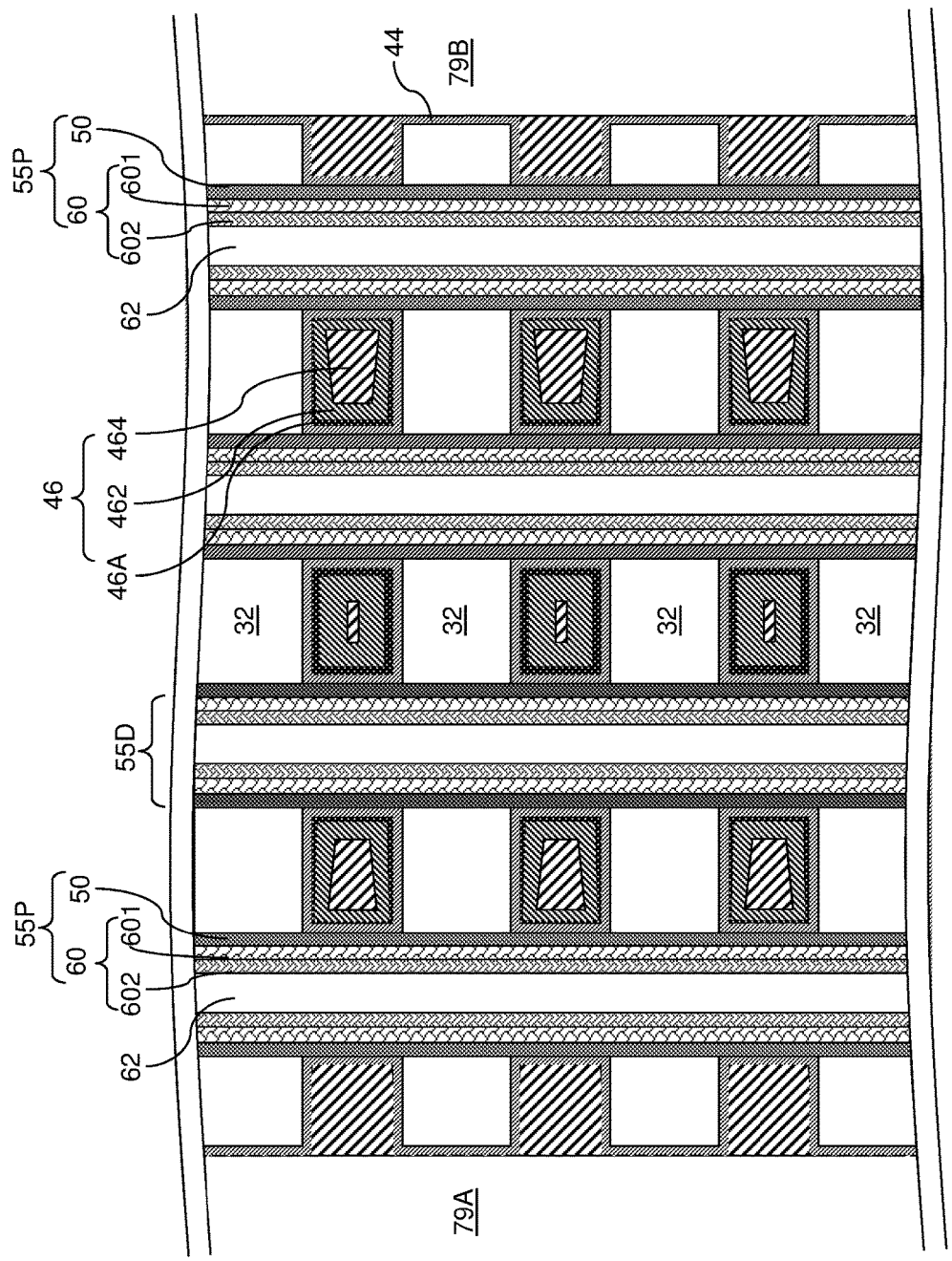

Referring to FIG. 9F, metallic material portions of the first exemplary electrically conductive layers 46 that are collaterally deposited in the first and second backside trenches 79 during formation of the at least one metallic fill material layer (such as the fluorine-containing tungsten layer 464) can be removed from inside the first and second backside recesses 79 by an anisotropic etch process. Thus, the first exemplary electrically conductive layers 46 can be formed in the volumes of the backside recesses 43. Each of the first exemplary electrically conductive layers 46 comprises a respective one of the fluorine-free tungsten layers 462 and respective at least one metallic fill material layer such as a fluorine-containing tungsten layer 464.

Figure 10A:
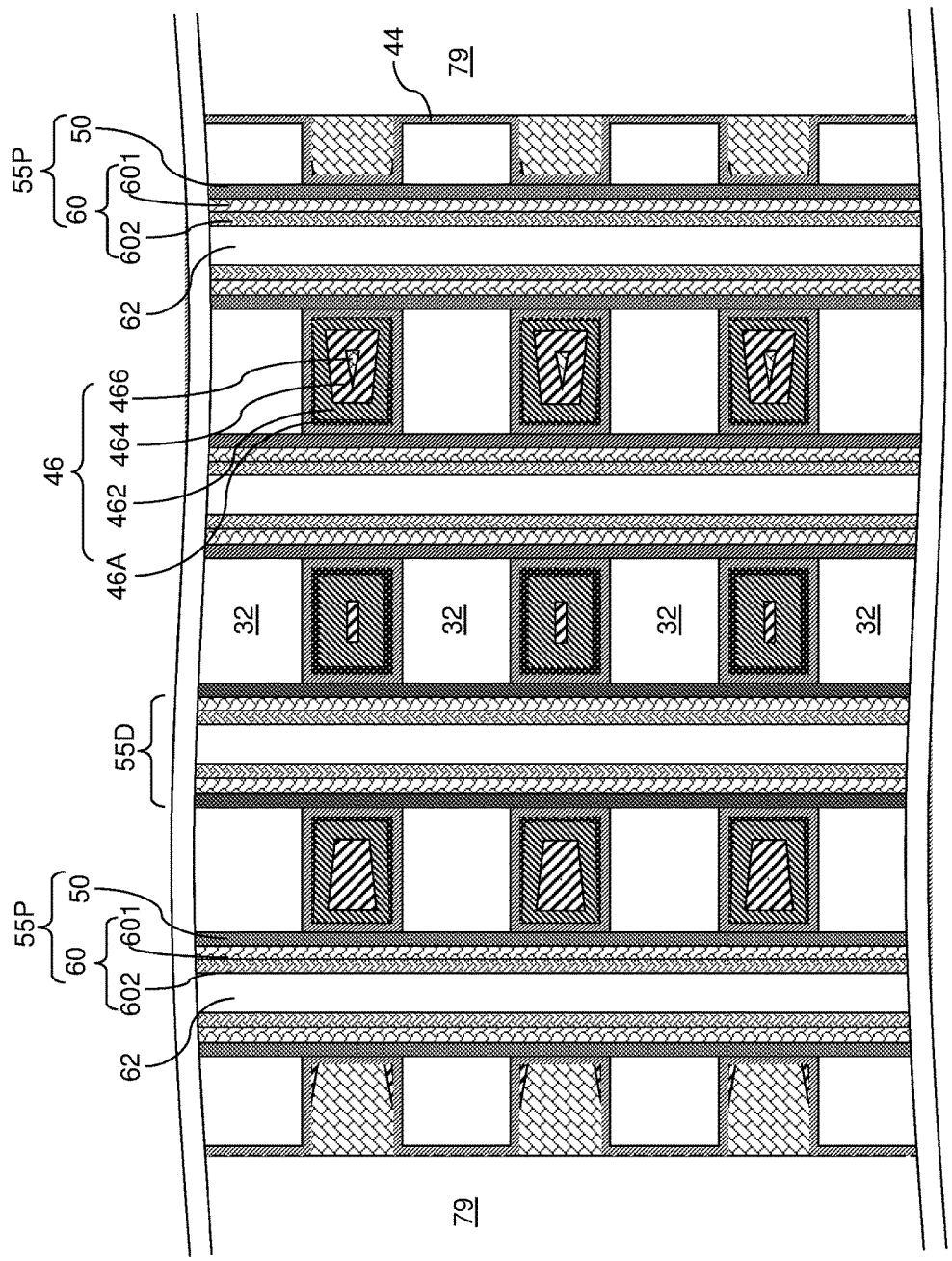
FIGS. 10A-10E illustrate first, second, third, fourth, and fifth alternative configurations for the first exemplary electrically conductive layers, respectively, according to an embodiment of the present disclosure.

Referring to FIG. 10A, a first alternative configuration for the first exemplary layers 46 is illustrated. The first alternating configuration for the first exemplary layers 46 can be derived from the first exemplary structure of FIG. 9D by depositing a fluorine-containing tungsten layer 464 and a metal layer 466 including a metal other than tungsten as the at least one metallic fill material layer. The fluorine-containing tungsten layer 464 can be formed by decomposition of $WF_6$ as in the processing steps of FIG. 9E with a modification in the duration of the deposition process. Specifically, the duration of the deposition process that deposits the fluorine-containing tungsten material is shortened such that the fluorine-containing tungsten layer 464 does not completely fill the remaining volumes of the backside recesses 43. Decomposition of $WF_6$ and growth of the material of the fluorine-containing tungsten layer 464 occurs only on metallic surfaces and does not proceed from non-metallic surfaces. Thus, the material of the fluorine-containing tungsten layer 464 grows from the center portions (e.g., distal regions 43D) of the remaining volumes of the backside recesses 43 toward the backside trenches 79.

The metal layers 466 can be deposited by employing a selective metal deposition process that grows a metal only from metallic surfaces while suppressing growth of the metal from insulating surfaces. For example, the selective metal deposition process can grow ruthenium, molybdenum, or cobalt from the physically exposed surfaces of the fluorine-containing tungsten layer 464. A seamless deposition of the metal can occur in the remaining volumes of the backside recesses 43 until the entire volume of each backside recess 43 is filled with metallic materials. Each contiguous combination of a metallic nitride liner 46A, a fluorine-free tungsten layer 462, a fluorine-containing tungsten layer 464, and a metal layer 466 constitutes a first alternative configuration of the first exemplary electrically conductive layer 46 that laterally extends from a first backside trench 79A to a second backside trench 79B.

Each first alternative configuration of the first exemplary electrically conductive layer 46 has a lateral compositional grading. Specifically, the thicknesses of the metallic nitride liner 46A and the fluorine-free tungsten layer 462 gradually decrease and the thickness of the fluorine-containing tungsten layer 464 and metal layer 466 gradually increases from the distal region 46D to the proximal region 46P of the electrically conductive layer 46. Thus, the composition of each second alternative configuration of the first exemplary electrically conductive layer 46 laterally changes through changes in the relative weight of the various component layers (i.e., each layer within a set of a metallic nitride liner 46A, a fluorine-free tungsten layer 462, a fluorine-containing tungsten layer 464, and a metal layer 466) within the second alternative configuration of the first exemplary electrically conductive layer 46. Subsequently, the processing steps of FIG. 9F can be performed to remove portions of the electrically conductive layers 46 that protrude into the backside trenches 79.

Figure 10B:
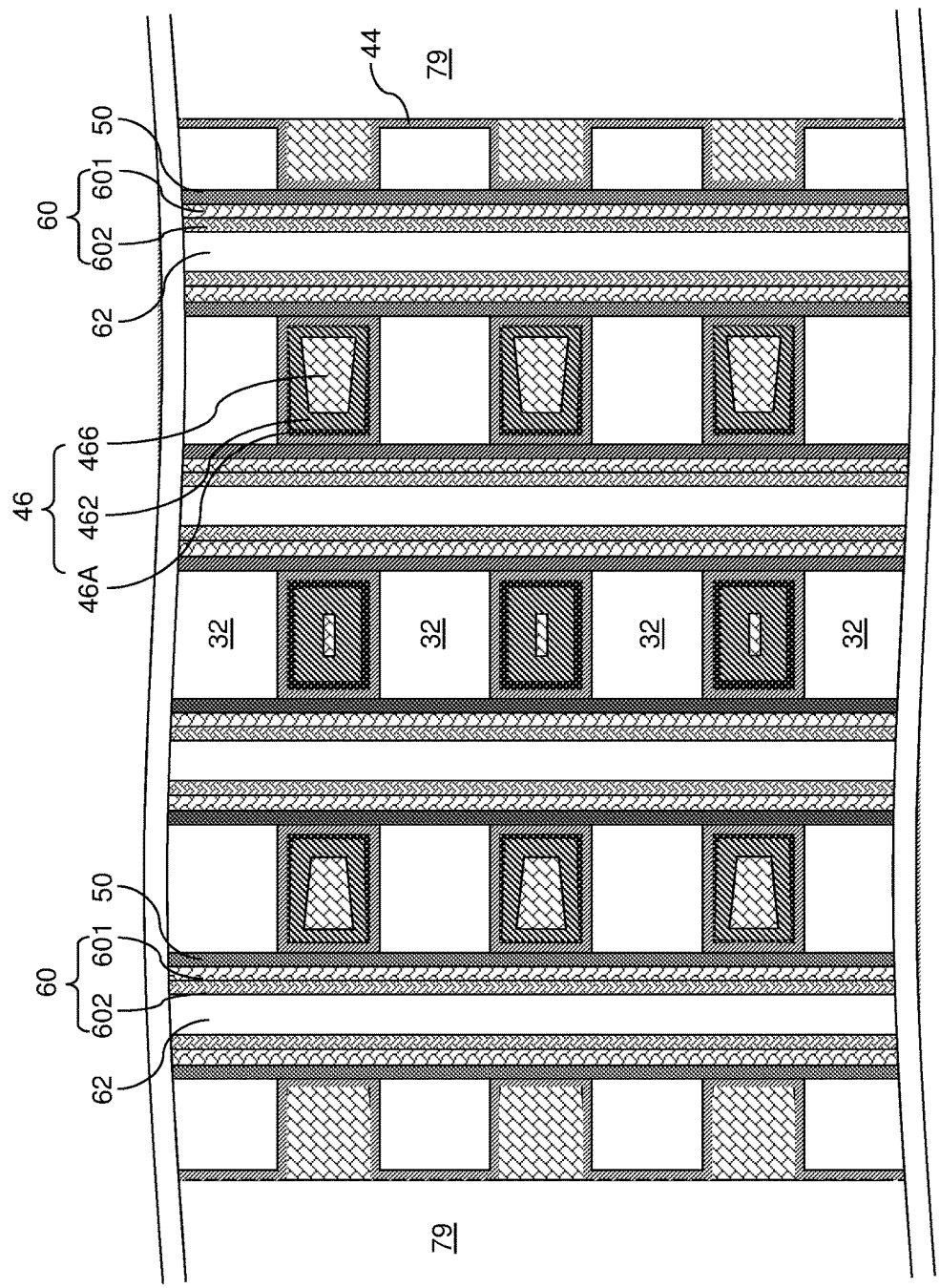

Referring to FIG. 10B, a second alternative configuration for the first exemplary layers 46 is illustrated. The second alternating configuration for the first exemplary layers 46 can be derived from the first exemplary structure of FIG. 9D by depositing the metal layer 466 including a metal other than tungsten as the at least one metallic fill material layer instead of the fluorine-containing tungsten layer 464

The metal layers 466 can be deposited by employing a selective metal deposition process that grows a metal only from metallic surfaces while suppressing growth of the metal from insulating surfaces. For example, the selective metal deposition process can grow ruthenium, molybdenum, or cobalt from the physically exposed surfaces of the fluorine-free tungsten layer 462. A seamless deposition of the metal can occur in the remaining volumes of the backside recesses 43 until the entire volume of each backside recess 43 is filled with metallic materials. Each contiguous combination of a metallic nitride liner 46A, a fluorine-free tungsten layer 462, and a metal layer 466 constitutes a second alternative configuration of the first exemplary electrically conductive layer 46 that laterally extends from a first backside trench 79A to a second backside trench 79B.

Each second alternative configuration of the first exemplary electrically conductive layer 46 has a lateral compositional grading. Specifically, the thicknesses of the metallic nitride liner 46A and the fluorine-free tungsten layer 462 gradually decrease and the thickness of the metal layer 466 gradually increases from the distal region 46D to the proximal region 46P of the electrically conductive layer 46. Thus, the composition of each second alternative configuration of the first exemplary electrically conductive layer 46 laterally changes through changes in the relative weight of the various component layers (i.e., each layer within a set of a metallic nitride liner 46A, a fluorine-free tungsten layer 462, and a metal layer 466) within the second alternative configuration of the first exemplary electrically conductive layer 46. Subsequently, the processing steps of FIG. 9F can be performed to remove portions of the electrically conductive layers 46 that protrude into the backside trenches 79.

Figure 10C:
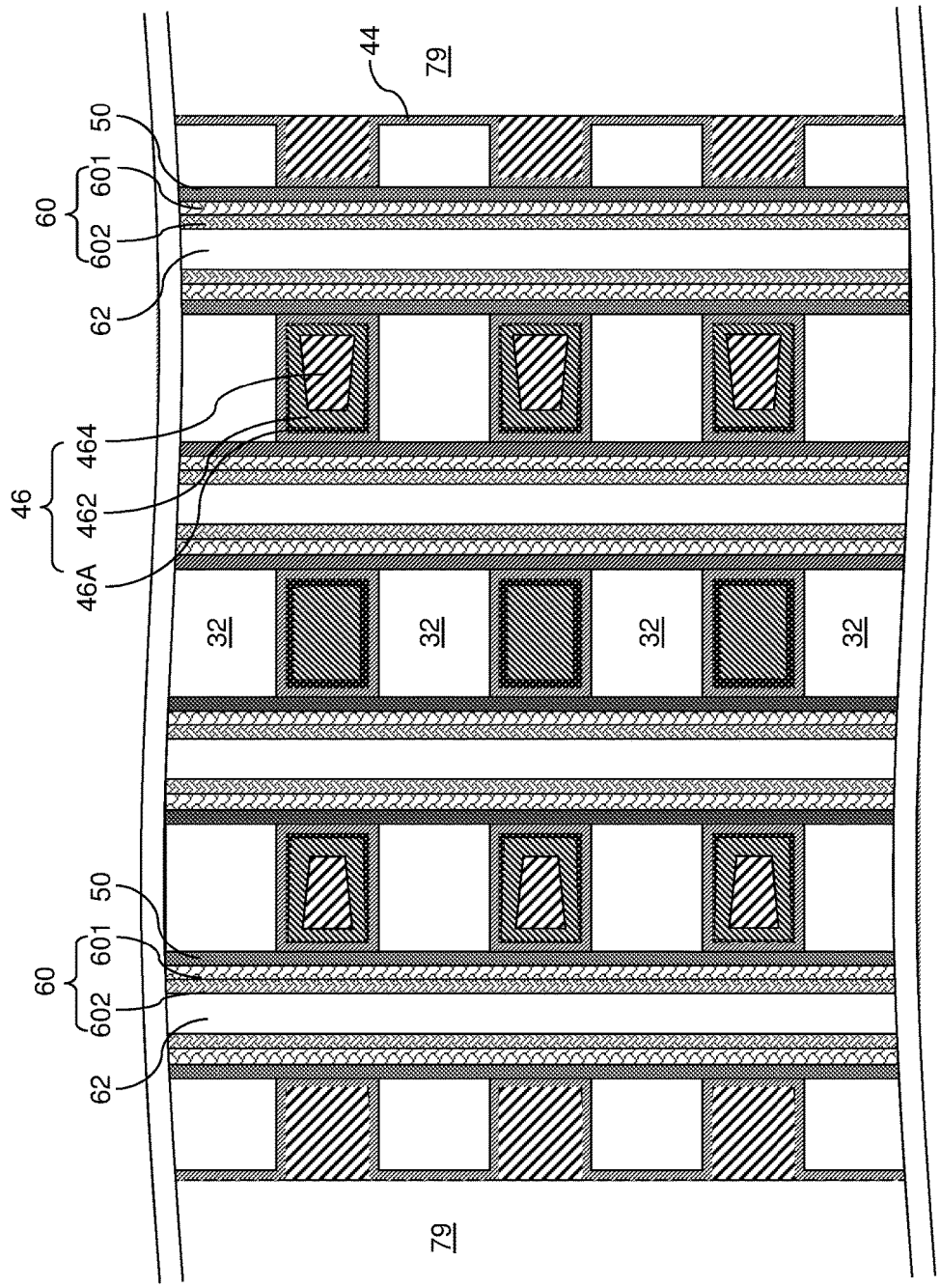

Referring to FIG. 10C, a third alternative configuration of the first exemplary electrically conductive layer 46 can be derived from the first exemplary structure of FIG. 9D by prolonging the duration of the deposition process that forms the fluorine-free tungsten layer 462. Specifically, the fluorine-free tungsten layer 462 can grow in the center portion (i.e., in the distal region 43D) of each backside recess 43 to block the center portions (e.g., at least part of the distal regions 43D) of the backside recesses 43. Thus, the volume of each backside recess 43 is divided into two discrete portions that are laterally spaced apart. A fluorine-containing tungsten layer 464 is subsequently deposited on the fluorine-free tungsten layer 462 by performing the processing steps of FIG. 9E. Subsequently, the processing steps of FIG. 9F can be performed to remove portions of the electrically conductive layers 46 that protrude into the backside trenches 79. Each third alternative configuration for the first exemplary electrically conductive layer 46 also has a lateral compositional grading as described above with respect to FIG. 9E.

Figure 10D:
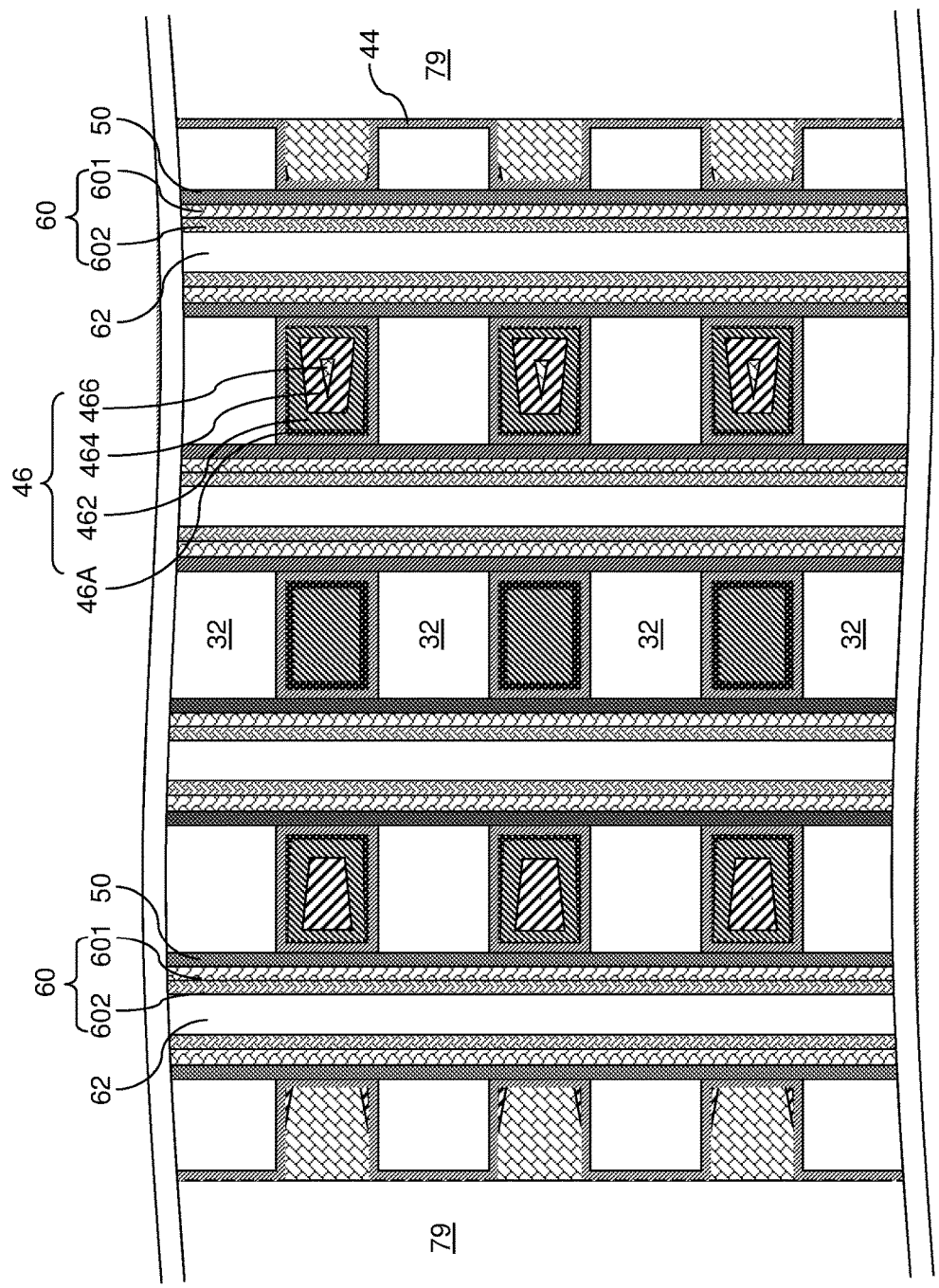

Referring to FIG. 10D, a fourth alternative configuration of the first exemplary electrically conductive layer 46 can be derived from the first alternative configuration of the first exemplary structure of FIG. 10A by prolonging the duration of the deposition process that forms the fluorine-free tungsten layer 462. Specifically, the fluorine-free tungsten layer 462 can grow in the center portion (i.e., in the distal region 43D) of each backside recess 43 to block the center portions (e.g., at least part of the distal regions 43D). Thus, the volume of each backside recess 43 is divided into two discrete portions that are laterally spaced apart. A fluorine-containing tungsten layer 464 and a metal layer 466 are subsequently deposited on the fluorine-free tungsten layer 462. Subsequently, the processing steps of FIG. 9F can be performed to remove portions of the electrically conductive layers 46 that protrude into the backside trenches 79. Each fourth alternative configuration of the first exemplary electrically conductive layer 46 also has a lateral compositional grading described above with respect to FIG. 10A. The thickness of the fluorine-containing tungsten layer 464 increases from the center region of each first exemplary electrically conductive layer 46 toward each of the first and second backside trenches 79 in regions in which the metal layer 466 is not present. The thickness of the fluorine-containing tungsten layer 464 may be uniform in regions in which the metal layer 466 is present. The thickness of the metal layer 466 increases from the center region of each first exemplary electrically conductive layer 46 toward each of the first and second backside trenches 79. Thus, the composition of each fourth alternative configuration of the first exemplary electrically conductive layer 46 laterally changes through changes in the relative weight of the various component layers (i.e., each layer within a set of a metallic nitride liner 46A, a fluorine-free tungsten layer 462, a fluorine-containing tungsten layer 464, and a metal layer 466) within the fourth alternative configuration of the first exemplary electrically conductive layer 46. Subsequently, the processing steps of FIG. 9F can be performed to remove portions of the electrically conductive layers 46 that protrude into the backside trenches 79.

Figure 10E:
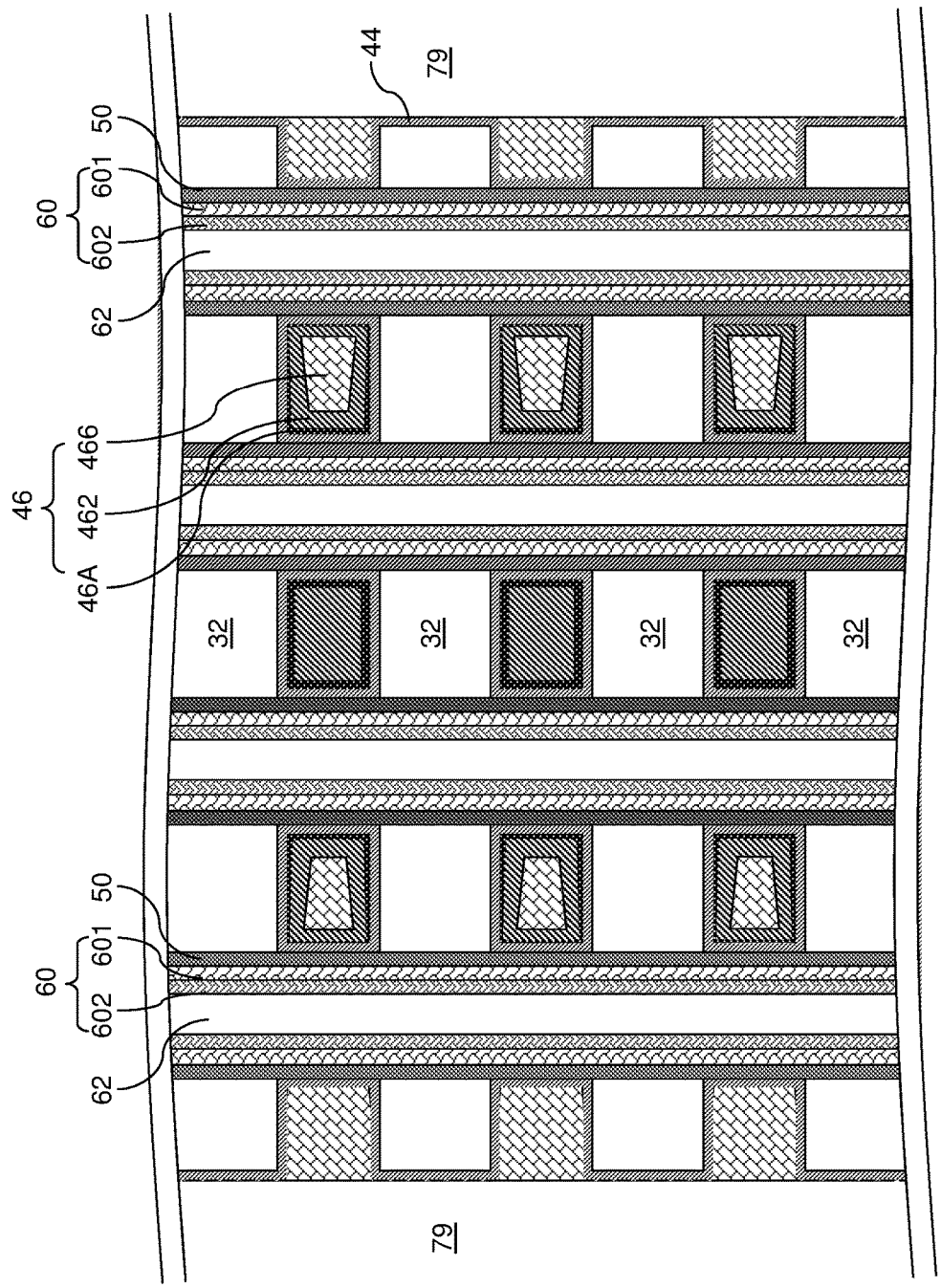

Referring to FIG. 10E, a fifth alternative configuration of the first exemplary electrically conductive layer 46 can be derived from the second alternative configuration of the second exemplary structure of FIG. 10B by prolonging the duration of the deposition process that forms the fluorine-free tungsten layer 462. Specifically, the fluorine-free tungsten layer 462 can grow in the center portion (i.e., in the distal region 43D) of each backside recess 43 to block the center portions (e.g., at least part of the distal regions 43D). Thus, the volume of each backside recess 43 is divided into two discrete portions that are laterally spaced apart. A metal layer 466 are subsequently deposited on the fluorine-free tungsten layer 462. Subsequently, the processing steps of FIG. 9F can be performed to remove portions of the electrically conductive layers 46 that protrude into the backside trenches 79.

Each fifth alternative configuration of the first exemplary electrically conductive layer 46 has a lateral compositional grading. Specifically, the thicknesses of the metallic nitride liner 46A and the fluorine-free tungsten layer 462 gradually decrease from center region of each first exemplary electrically conductive layer 46 (e.g., from a point located in the distal region 46D around an equidistant plane from the first and second backside trenches 79) toward each of the first and second backside trenches 79. The thickness of the metal layer 466 increases from the center region of each first exemplary electrically conductive layer 46 toward each of the first and second backside trenches 79. Thus, the composition of each fifth alternative configuration of the first exemplary electrically conductive layer 46 laterally changes through changes in the relative weight of the various component layers (i.e., each layer within a set of a metallic nitride liner 46A, a fluorine-free tungsten layer 462, and a metal layer 466) within the fifth alternative configuration of the first exemplary electrically conductive layer 46. Subsequently, the processing steps of FIG. 9F can be performed to remove portions of the electrically conductive layers 46 that protrude into the backside trenches 79.

Figure 11A:
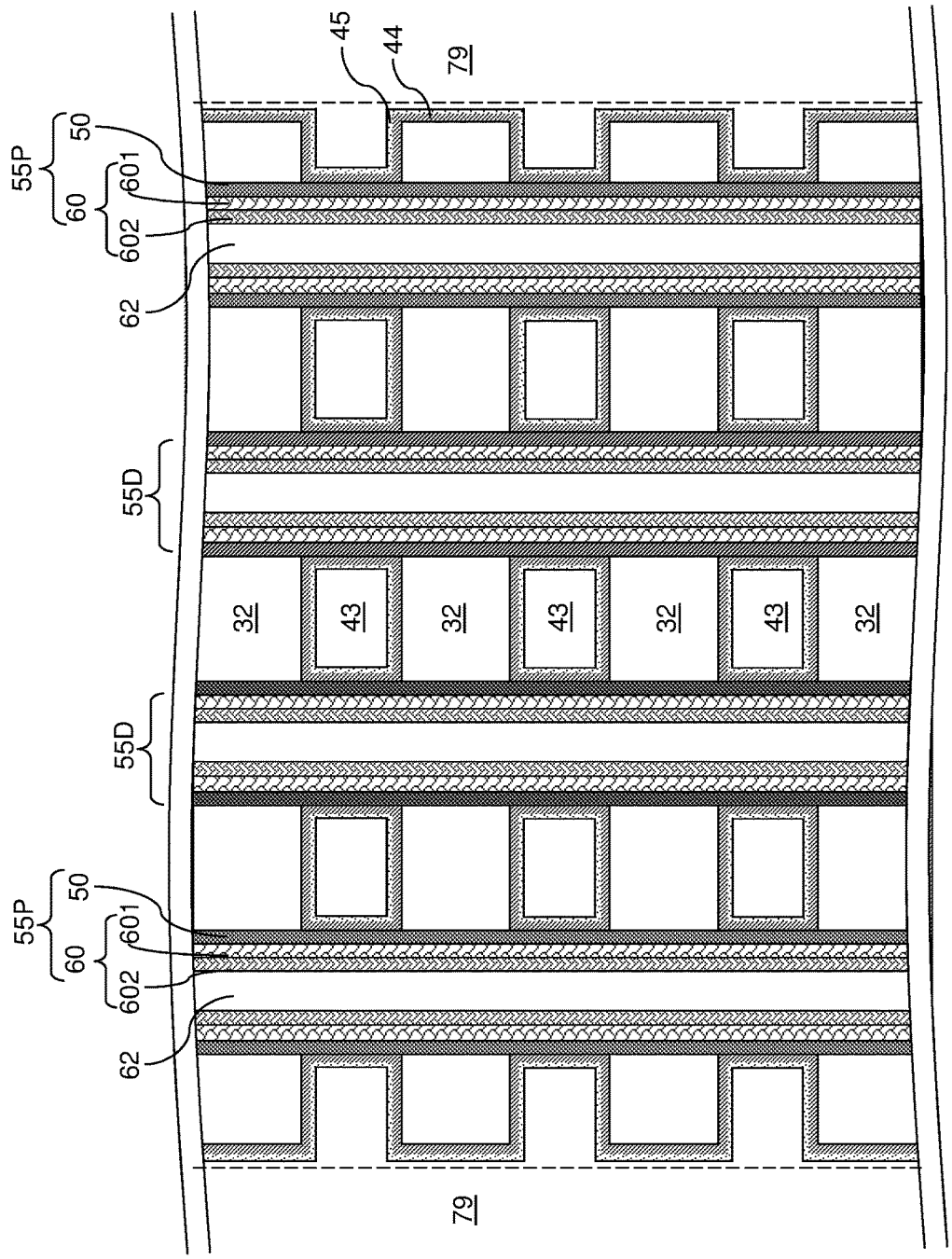

Referring to FIG. 11A, an exemplary structure for forming second exemplary electrically conductive layers 46 can be derived from the exemplary structure of FIG. 9B by depositing a tungsten-nucleation-material layer 45 directly on all physically exposed surfaces of the backside blocking dielectric layer 44 instead of on the metallic nitride liner 46A which is omitted in this embodiment.

Figure 11B:
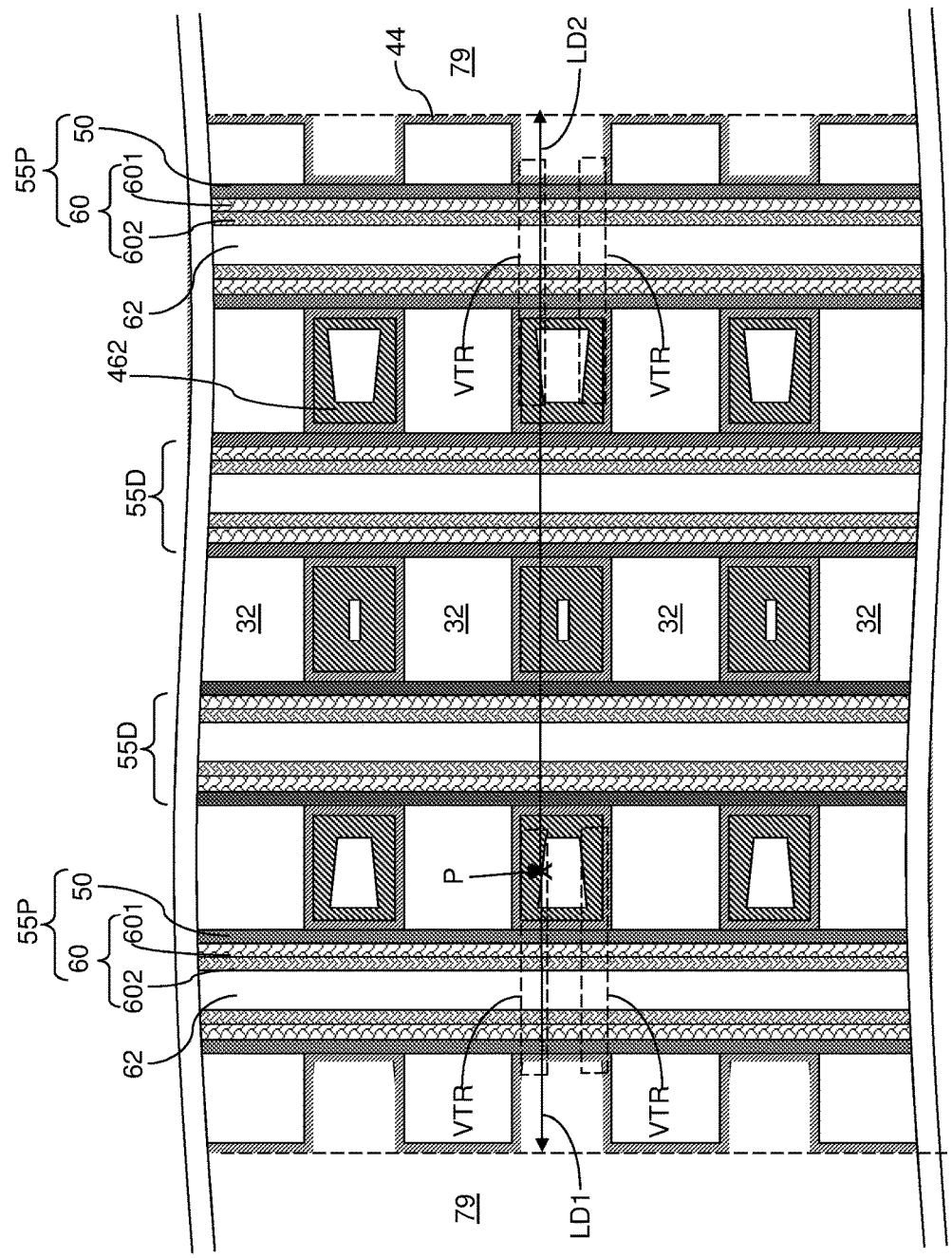

Referring to FIG. 11B, a fluorine-free tungsten layer 462 can be formed within each backside recess 43 on the backside blocking dielectric layer 44 by the process described above with respect to FIG. 9D.

Referring to FIG. 11C, at least one metallic fill material layer having a different composition than the fluorine-free tungsten layers 462 is formed in each remaining volume of the backside recesses 43 by the process described above with respect to FIG. 9E.

Figure 11D:
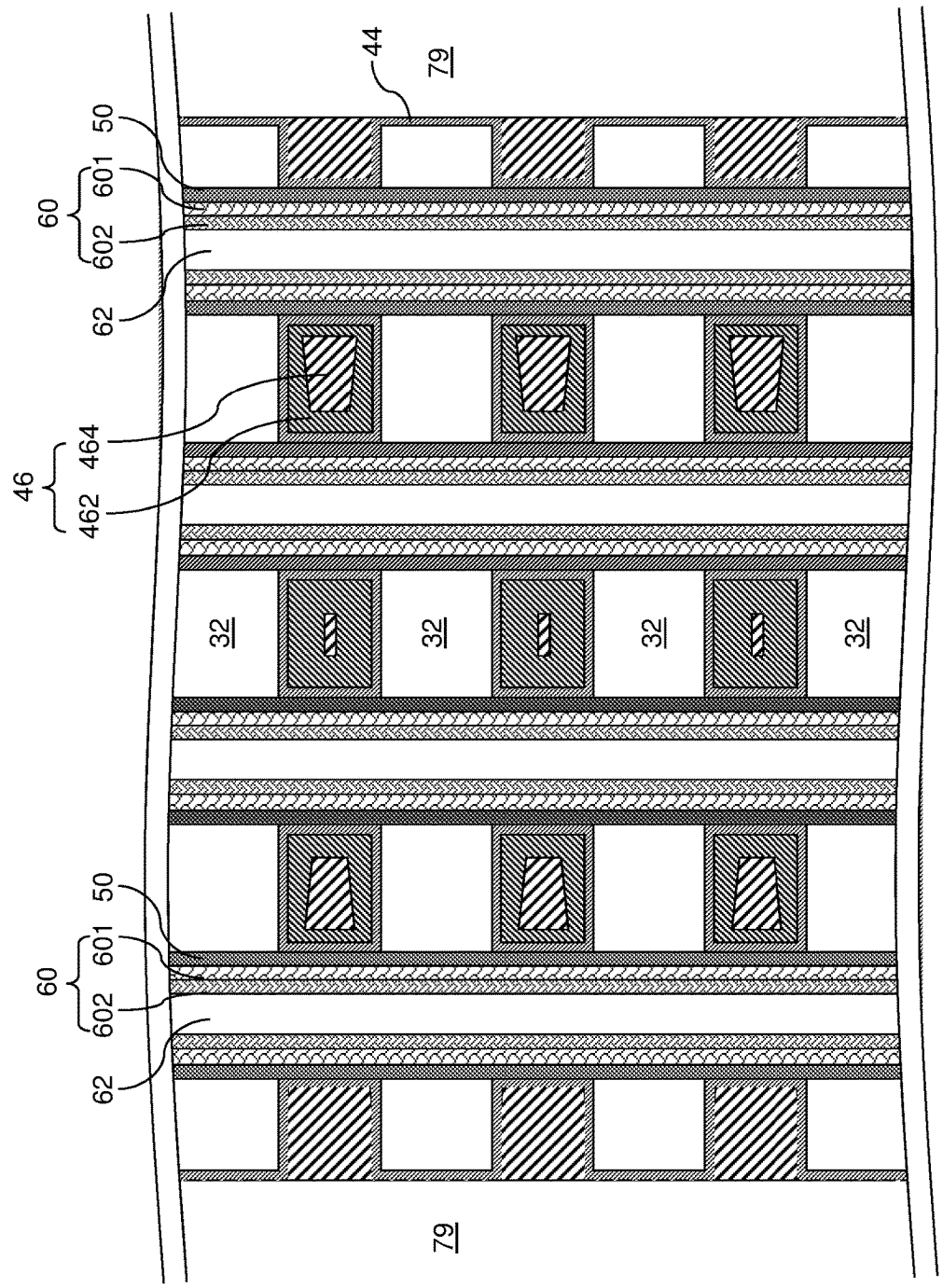

Referring to FIG. 11D, metallic material portions of the second exemplary electrically conductive layers 46 that are collaterally deposited in the first and second backside trenches 79 during formation of the at least one metallic fill material layer (such as the fluorine-containing tungsten layer 464) can be removed from inside the first and second backside recesses 79 by an anisotropic etch process. Thus, the second exemplary electrically conductive layers 46 can be formed in the volumes of the backside recesses 43. Each of the second exemplary electrically conductive layers 46 comprises a respective one of the fluorine-free tungsten layers 462 and respective at least one metallic fill material layer (464, 466).

Figure 12A:
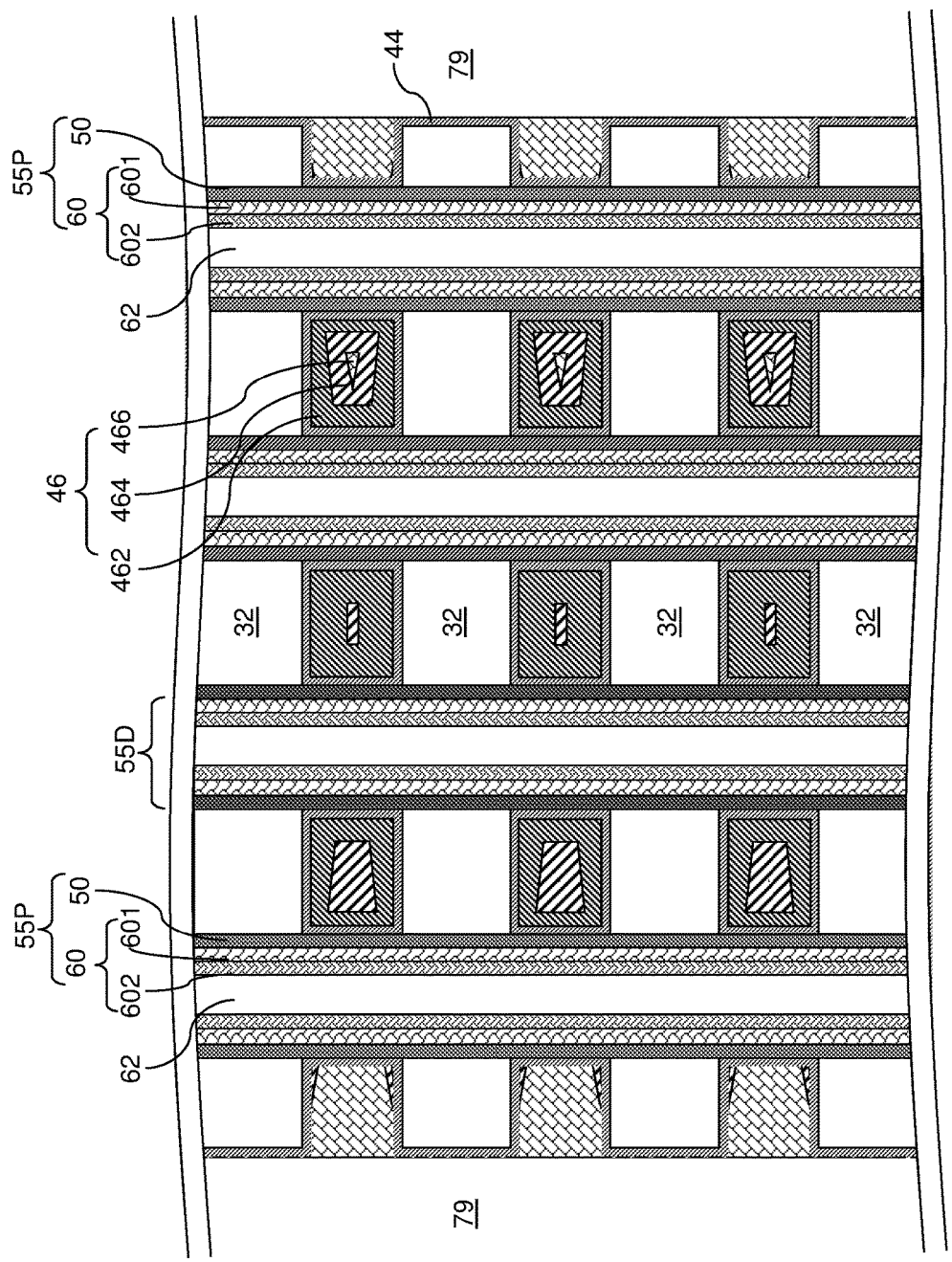
FIGS. 12A-12E illustrate first, second, third, fourth, and fifth alternative configurations for the second exemplary electrically conductive layers, respectively, according to an embodiment of the present disclosure.

Referring to FIG. 12A, a first alternative configuration for the second exemplary layers 46 is illustrated. This configuration is the same as the one described above with respect to FIG. 10A, except that the liner 46A is omitted.

Figure 12B:
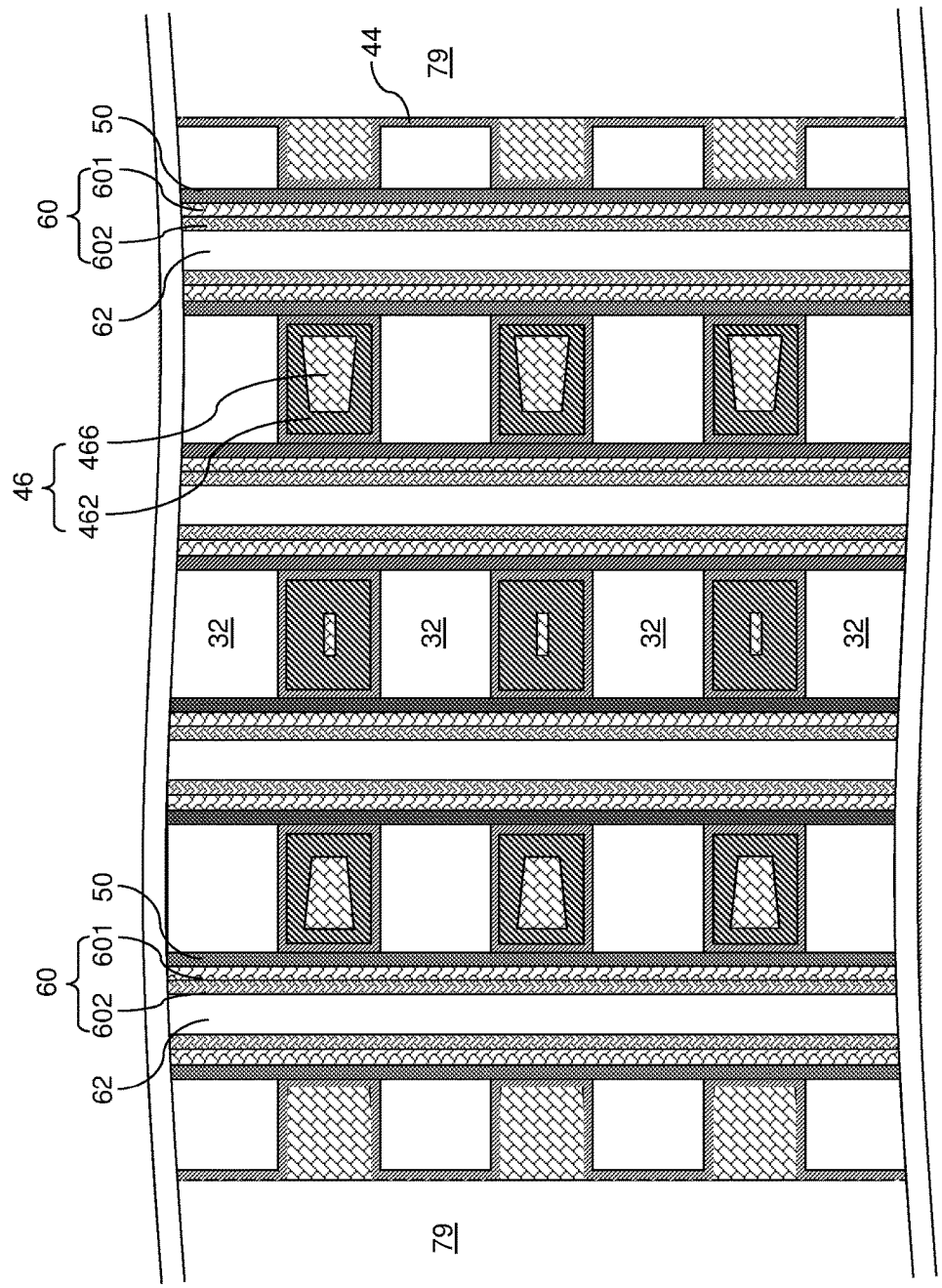

Referring to FIG. 12B, a second alternative configuration for the second exemplary layers 46 is illustrated. This configuration is the same as the one described above with respect to FIG. 10B, except that the liner 46A is omitted.

Figure 12C:
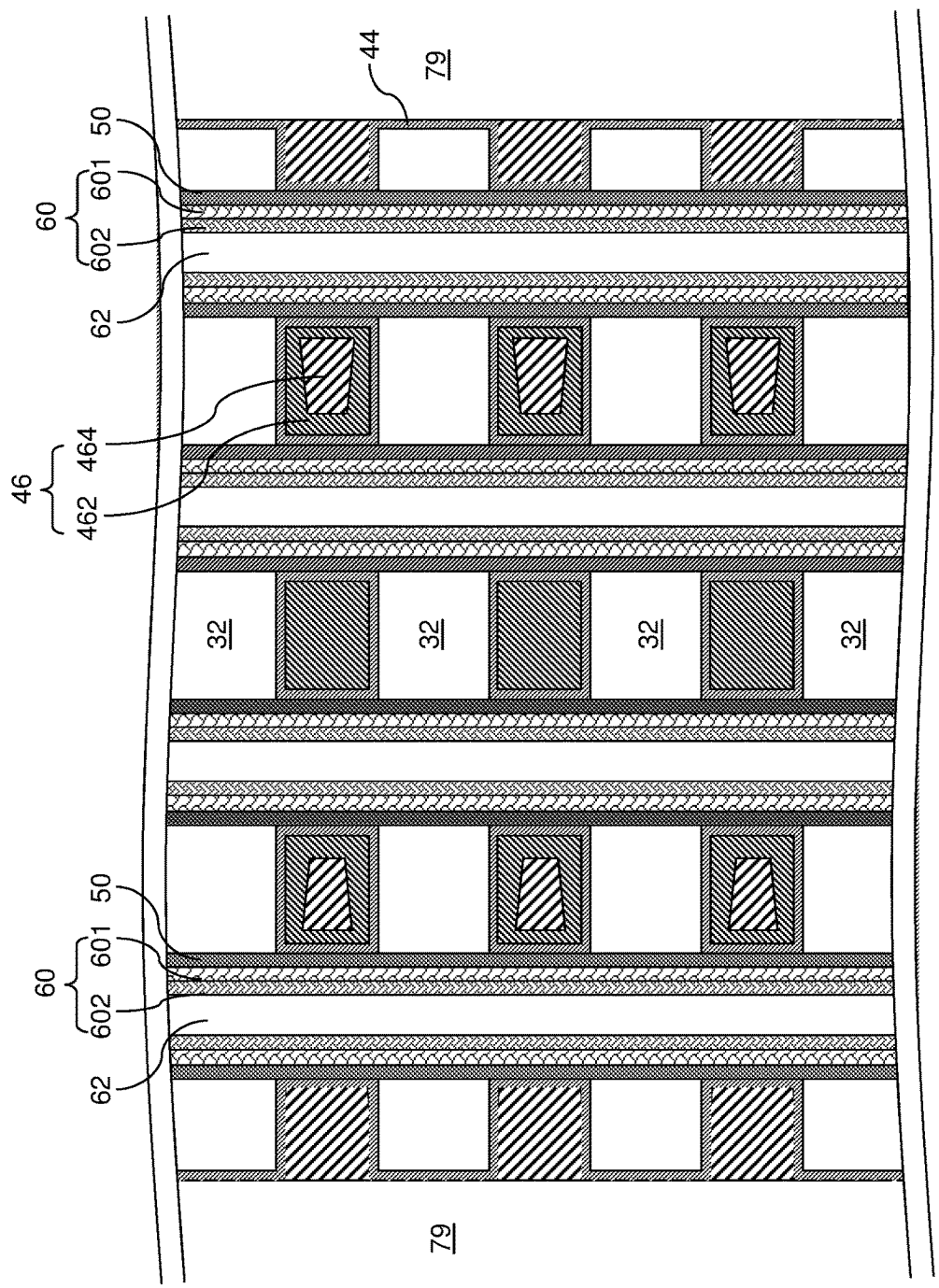

Referring to FIG. 12C, a third alternative configuration for the second exemplary layers 46 is illustrated. This configuration is the same as the one described above with respect to FIG. 10C, except that the liner 46A is omitted.

Figure 12D:
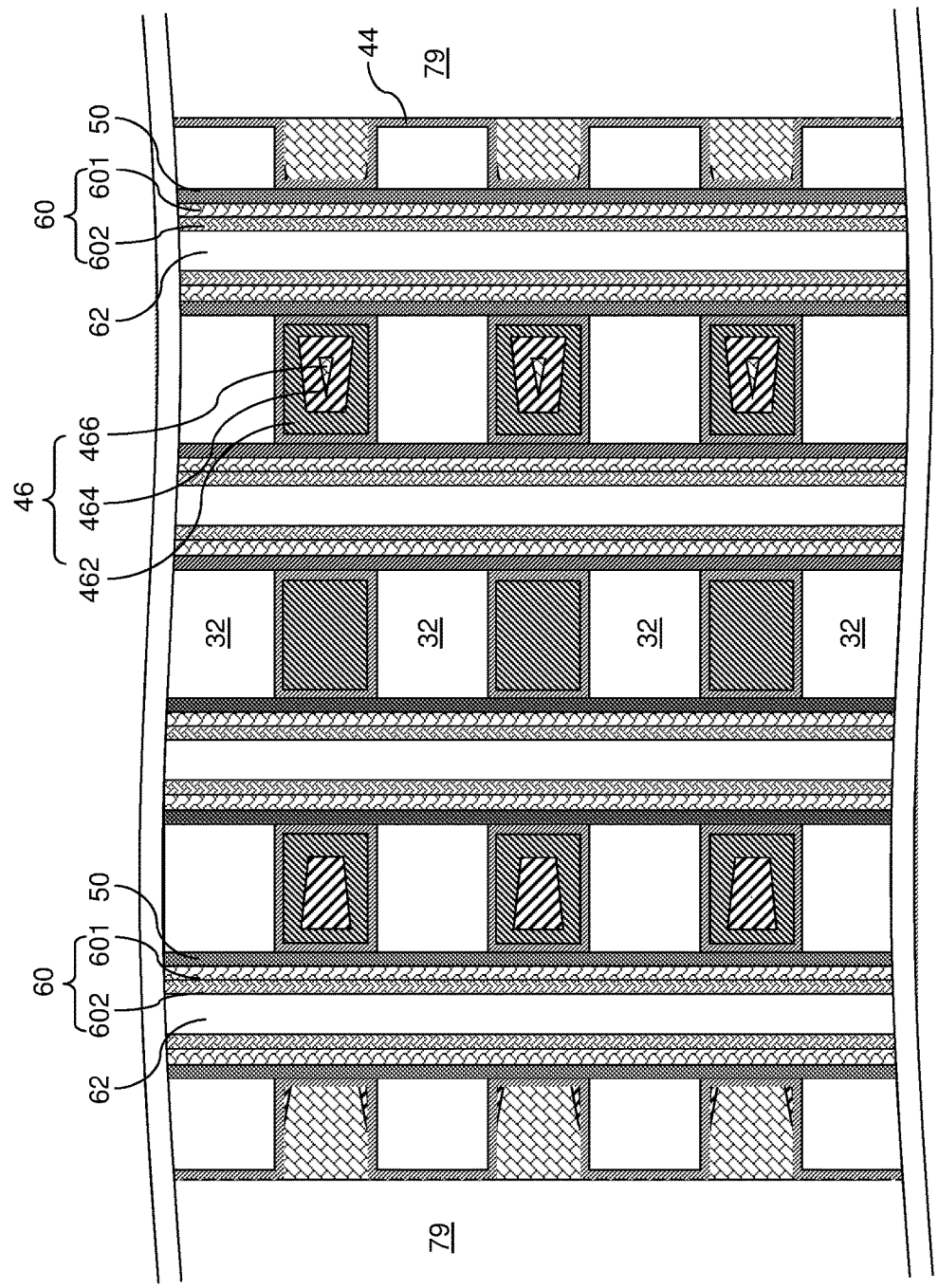

Referring to FIG. 12D, a fourth alternative configuration for the second exemplary layers 46 is illustrated. This configuration is the same as the one described above with respect to FIG. 10D, except that the liner 46A is omitted.

Figure 12E:
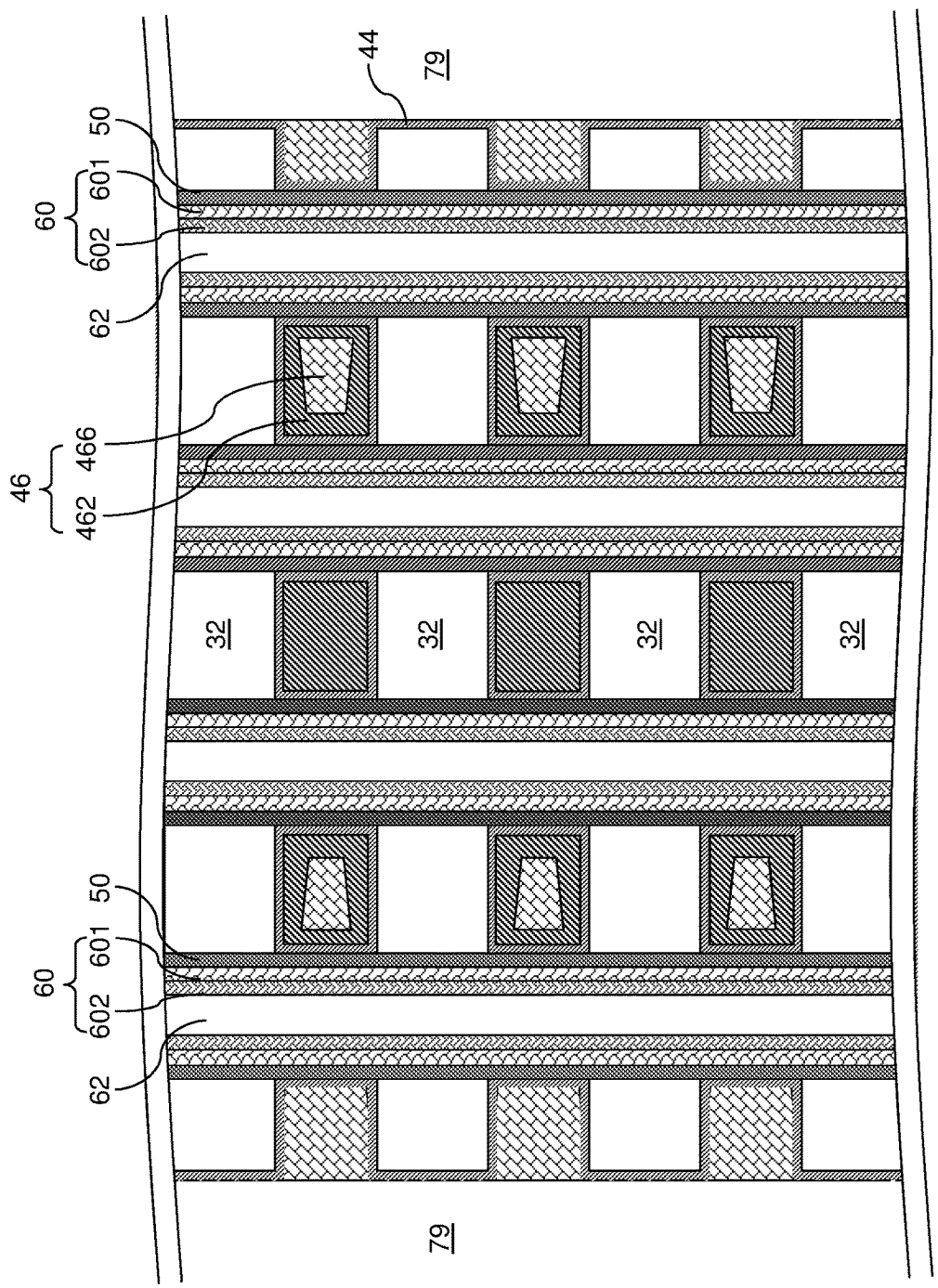

Referring to FIG. 12E, a fifth alternative configuration for the second exemplary layers 46 is illustrated. This configuration is the same as the one described above with respect to FIG. 10E, except that the liner 46A is omitted.

Figure 13A:
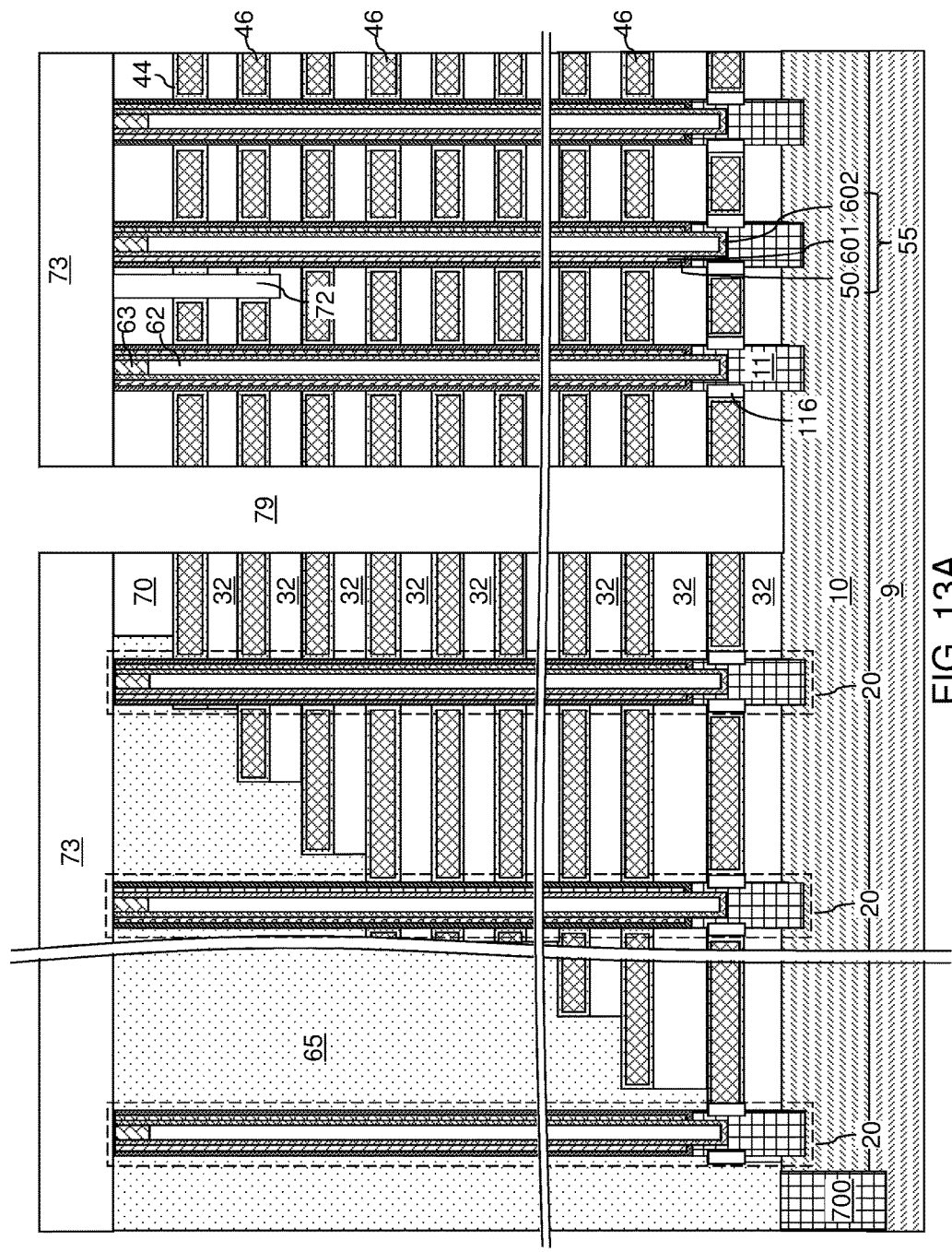
FIG. 13A is a schematic vertical cross-sectional view of the exemplary structure after removal of a deposited conductive material from within the backside trench according to an embodiment of the present disclosure.
Figure 13B:
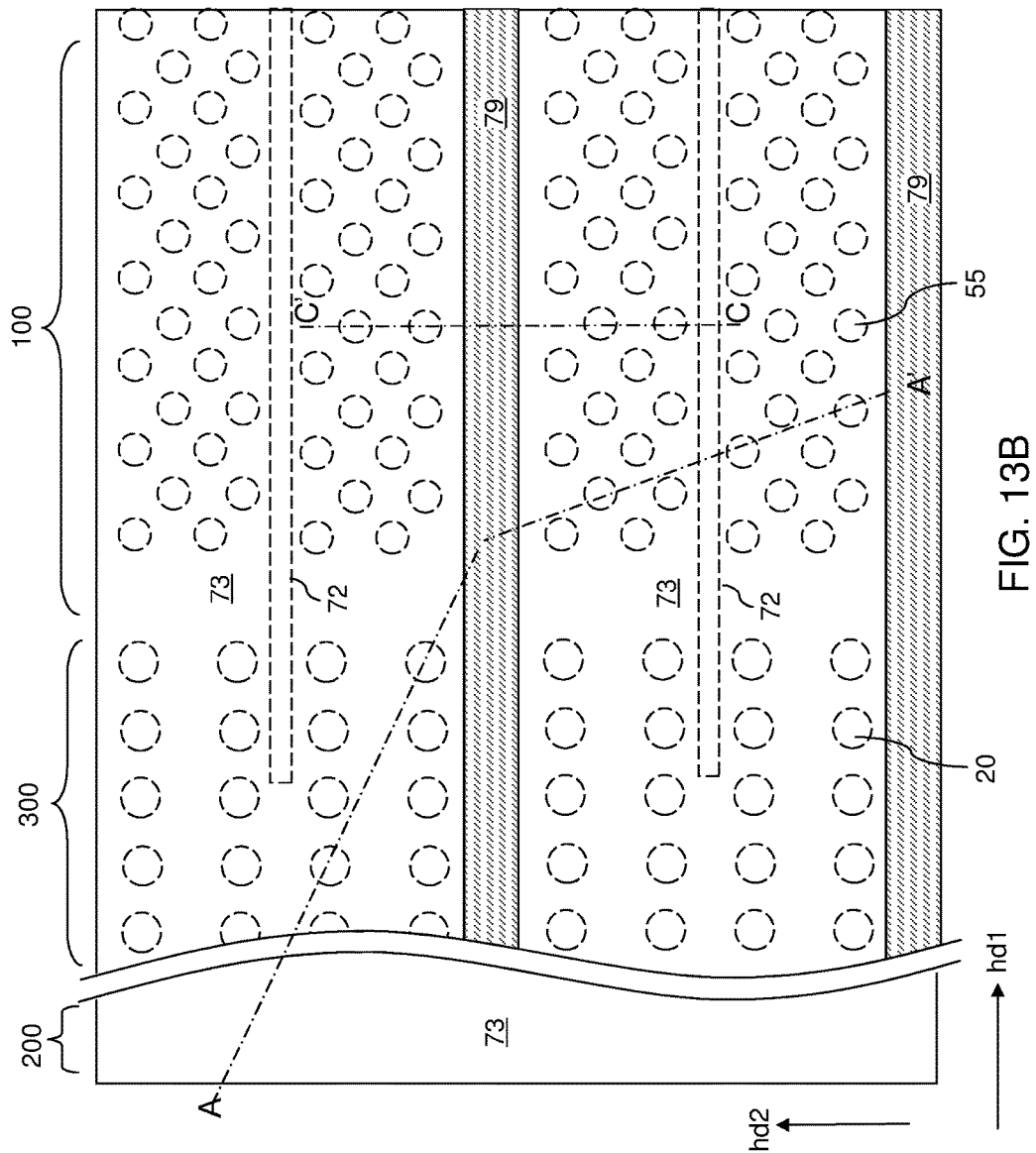
FIG. 13B is a top-down view of the exemplary structure of FIG. 13A. The vertical plane A-A' is the plane of the schematic vertical cross-sectional view of FIG. 13A.
Figure 13C:
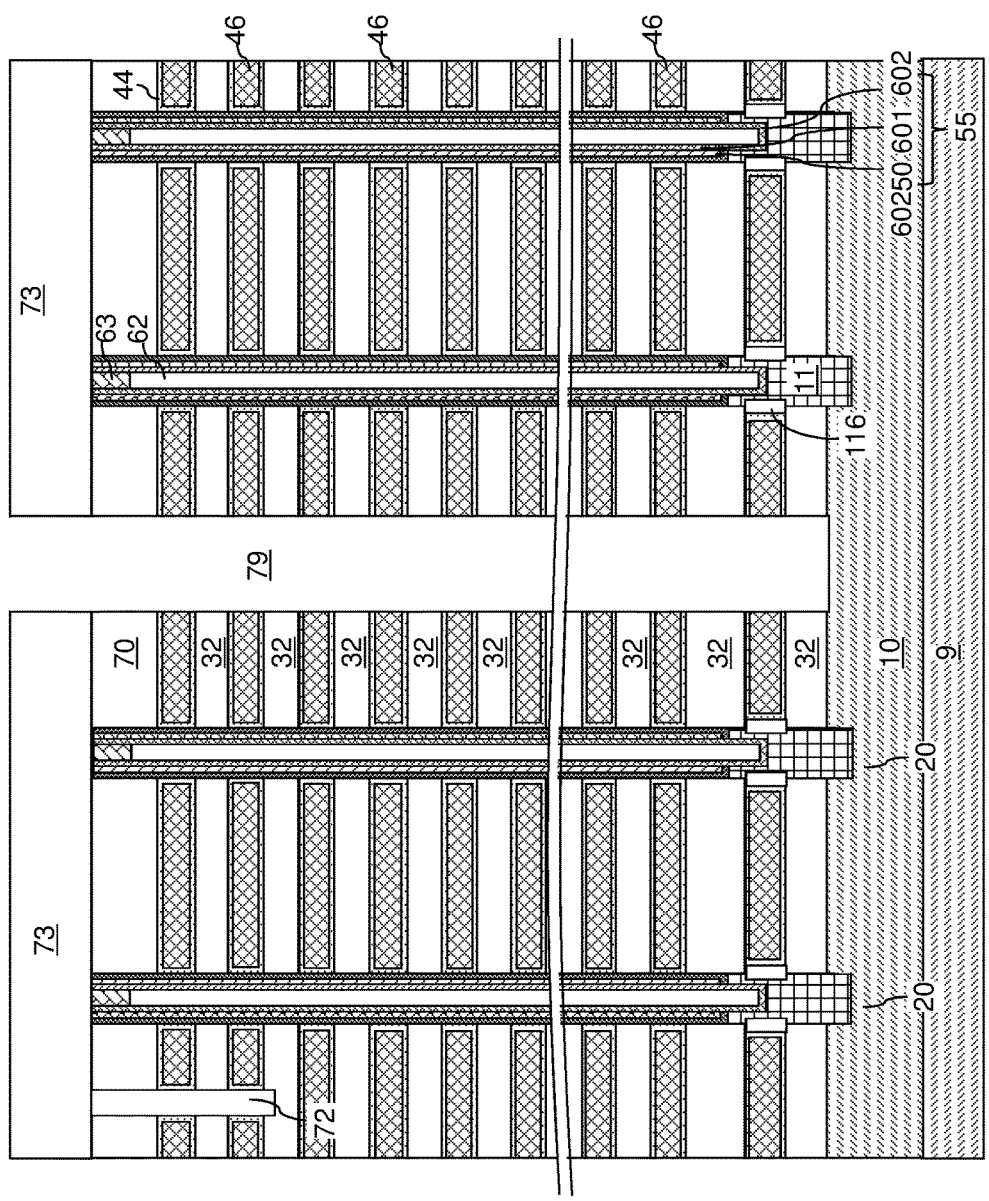
FIG. 13C is a schematic vertical cross-sectional view of the exemplary structure along the vertical plane C-C' of FIG. 13B.

Referring to FIGS. 13A-13C, the exemplary structure is illustrated after formation of electrically conductive layers 46, which may be any of the electrically conductive layers 46 described above. Each electrically conductive layer 46 can be a conductive line structure. Thus, the sacrificial material layers 42 are replaced with the electrically conductive layers 46.

Each electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode for the plurality of vertical memory devices. The planar dielectric portions 616 can be removed from bottom regions of the backside trenches 79 by an etch process, which may be an anisotropic etch process or an isotropic etch process.

Figure 14A:
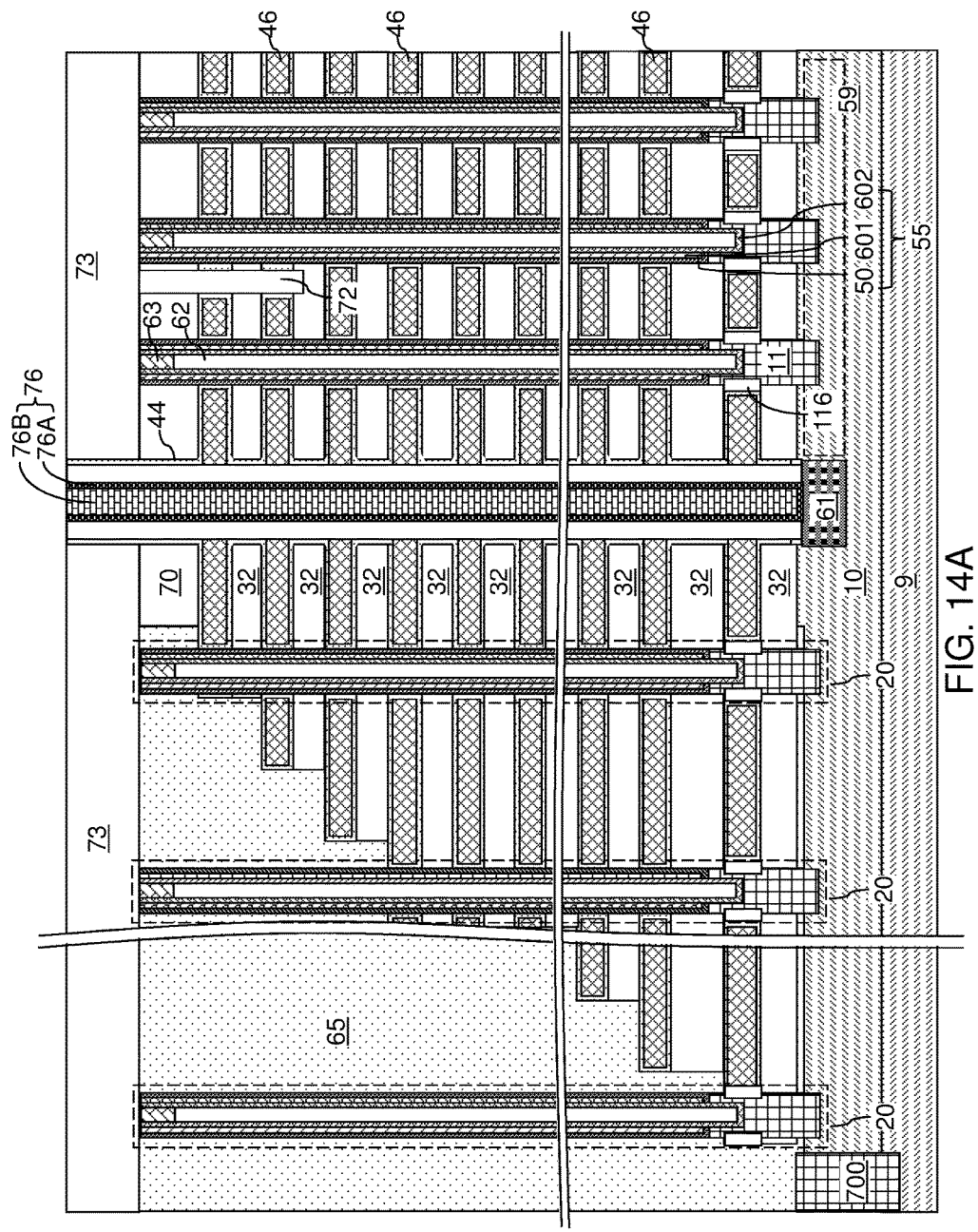
FIG. 14A is a schematic vertical cross-sectional view of the exemplary structure after formation of an insulating spacer and a backside contact structure according to an embodiment of the present disclosure.
Figure 14B:
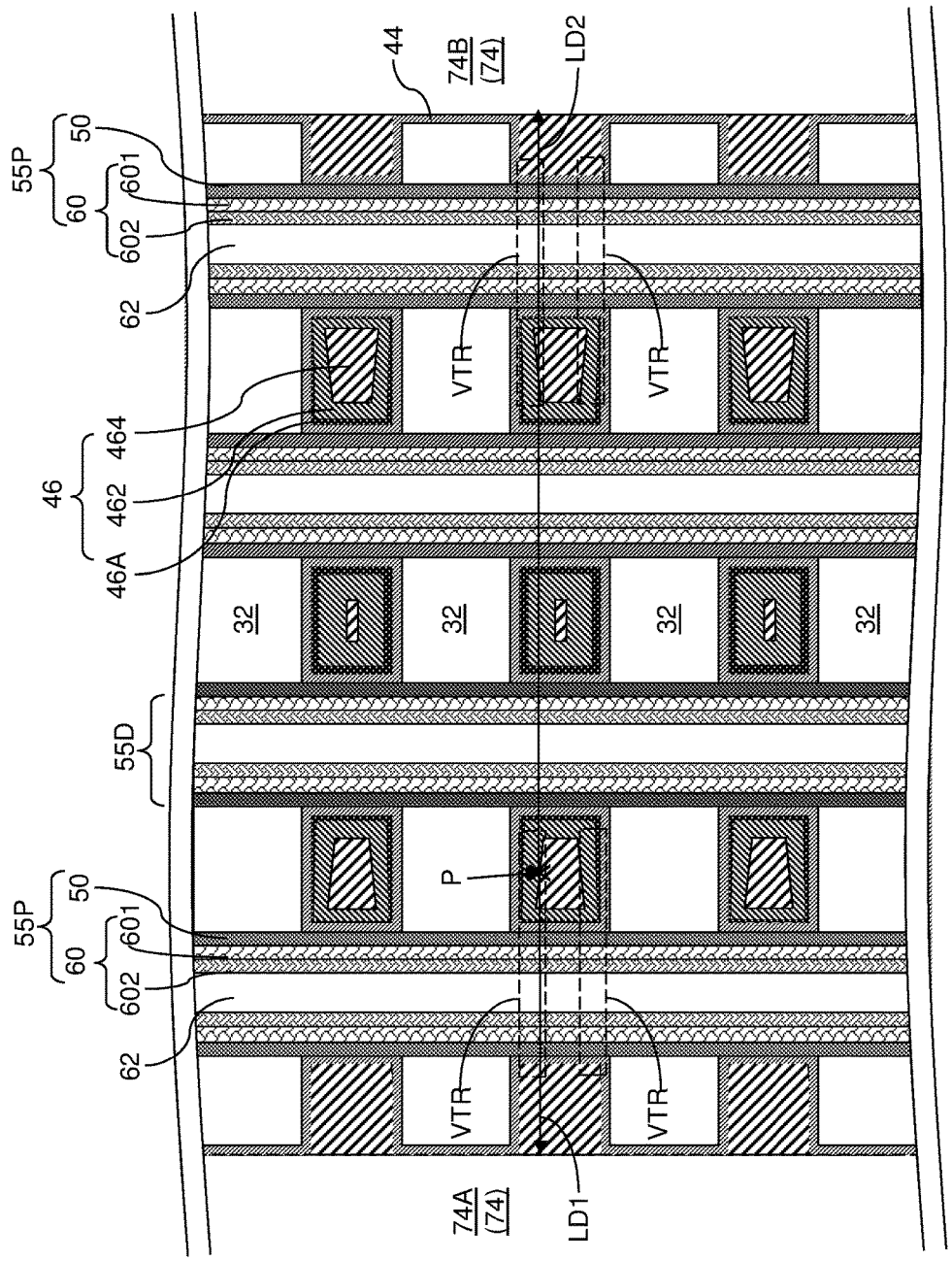
FIG. 14B is a vertical cross-sectional view of a region of a configuration of the exemplary structure of FIG. 14A.

Referring to FIGS. 14A and 14B, an insulating material layer can be formed in the backside trenches 79 and over the contact level dielectric layer 73 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer can include silicon oxide. The insulating material layer can be formed, for example, by low pressure chemical vapor deposition (LPCVD) or atomic layer deposition (ALD). The thickness of the insulating material layer can be in a range from 1.5 nm to 60 nm, although lesser and greater thicknesses can also be employed.

If a backside blocking dielectric layer 44 is present, the insulating material layer can be formed directly on surfaces of the backside blocking dielectric layer 44 and directly on the sidewalls of the electrically conductive layers 46. If a backside blocking dielectric layer 44 is not employed, the insulating material layer can be formed directly on sidewalls of the insulating layers 32 and directly on sidewalls of the electrically conductive layers 46.

An anisotropic etch is performed to remove horizontal portions of the insulating material layer from above the contact level dielectric layer 73 and at the bottom of each backside trench 79. Each remaining portion of the insulating material layer constitutes an insulating spacer 74, which is a dielectric wall structure laterally extending along the horizontal direction hd1 and vertically extending from a bottommost layer of the alternating stack (32, 46) to a topmost layer of the alternating stack (32, 46). A backside cavity is present within a volume surrounded by each insulating spacer 74. A top surface of the semiconductor material layer 10 can be physically exposed at the bottom of each backside trench 79.

A source region 61 can be formed at a surface portion of the semiconductor material layer 10 under each backside cavity by implantation of electrical dopants into physically exposed surface portions of the semiconductor material layer 10. Each source region 61 is formed in a surface portion of the substrate (9, 10) that underlies a respective opening through the insulating spacer 74. Due to the straggle of the implanted dopant atoms during the implantation process and lateral diffusion of the implanted dopant atoms during a subsequent activation anneal process, each source region 61 can have a lateral extent greater than the lateral extent of the opening through the insulating spacer 74.

An upper portion of the semiconductor material layer 10 that extends between the source region 61 and the plurality of pedestal channel portions 11 constitutes a horizontal semiconductor channel 59 for a plurality of field effect transistors. The horizontal semiconductor channel 59 is connected to multiple vertical semiconductor channels 60 through respective pedestal channel portions 11. The horizontal semiconductor channel 59 contacts the source region 61 and the plurality of pedestal channel portions 11. A bottommost electrically conductive layer 46 provided upon formation of the electrically conductive layers 46 within the alternating stack (32, 46) can comprise a select gate electrode for the field effect transistors. Each source region 61 is formed in an upper portion of the semiconductor substrate (9, 10). Semiconductor channels (59, 11, 60) extend between each source region 61 and a respective set of drain regions 63. The semiconductor channels (59, 11, 60) include the vertical semiconductor channels 60 of the memory stack structures 55.

A backside contact via structure 76 can be formed within each backside cavity. Each contact via structure 76 can fill a respective cavity. The contact via structures 76 can be formed by depositing at least one conductive material in the remaining unfilled volume (i.e., the backside cavity) of the backside trench 79. For example, the at least one conductive material can include a conductive liner 76A and a conductive fill material portion 76B. The conductive liner 76A can include a conductive metallic liner such as TiN, TaN, WN, TiC, TaC, WC, an alloy thereof, or a stack thereof. The thickness of the conductive liner 76A can be in a range from 3 nm to 30 nm, although lesser and greater thicknesses can also be employed. The conductive fill material portion 76B can include a metal or a metallic alloy. For example, the conductive fill material portion 76B can include W, Cu, Al, Co, Ru, Ni, an alloy thereof, or a stack thereof.

The at least one conductive material can be planarized employing the contact level dielectric layer 73 overlying the alternating stack (32, 46) as a stopping layer. If chemical mechanical planarization (CMP) process is employed, the contact level dielectric layer 73 can be employed as a CMP stopping layer. Each remaining continuous portion of the at least one conductive material in the backside trenches 79 constitutes a backside contact via structure 76. The backside contact via structure 76 extends through the alternating stack (32, 46), and contacts a top surface of the source region 61. If a backside blocking dielectric layer 44 is employed, the backside contact via structure 76 can contact a sidewall of the backside blocking dielectric layer 44.

Alternatively, electrical contact to the semiconductor material layer 10 may be provided by a contact via structure (not shown) provided in another device region, and the backside trenches 79 can be filled with a different dielectric wall structure that includes a dielectric material that fills the entire volume of a respective backside trench. Generally, a dielectric wall structure can be formed within each backside trench 79 with, or without, formation of an additional structural component (such as a backside contact via structure 76).

Figure 15A:
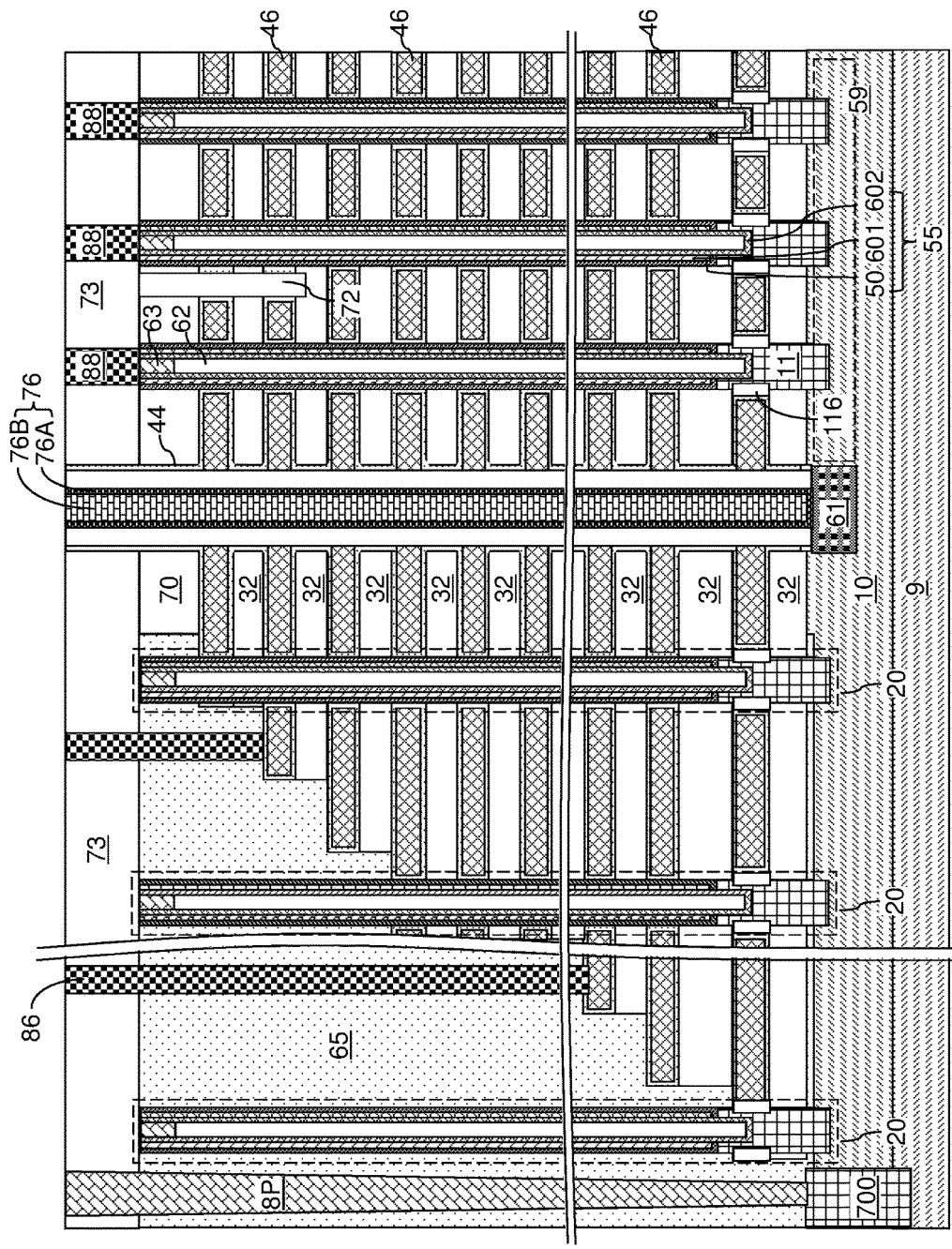
FIG. 15A is a schematic vertical cross-sectional view of the exemplary structure after formation of additional contact via structures according to an embodiment of the present disclosure.
Figure 15B:
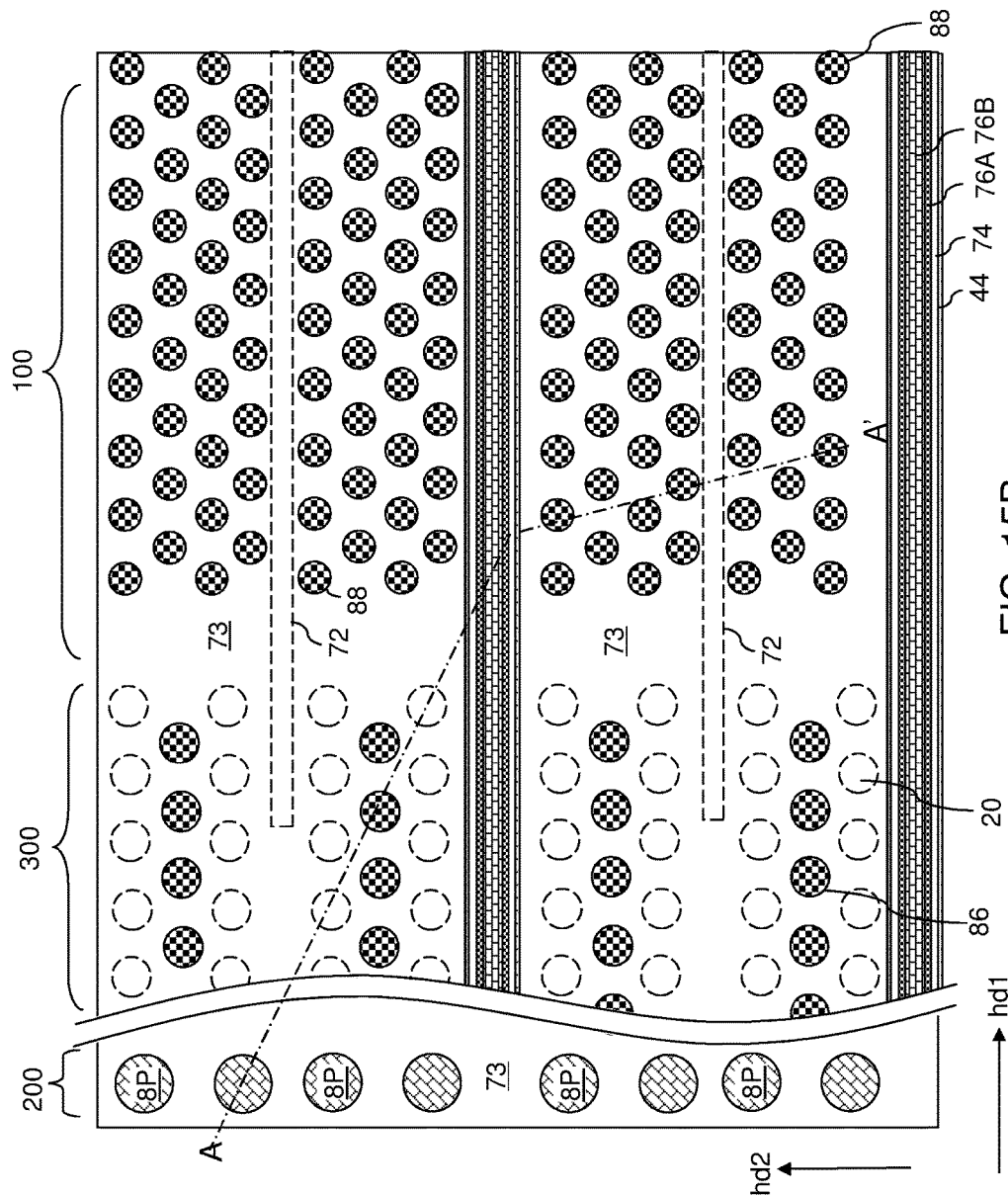
FIG. 15B is a top-down view of the exemplary structure of FIG. 15A. The vertical plane A-A' is the plane of the schematic vertical cross-sectional view of FIG. 15A.

Referring to FIGS. 15A and 15B, additional contact via structures (88, 86, 8P) can be formed through the contact level dielectric layer 73, and optionally through the retro-stepped dielectric material portion 65. For example, drain contact via structures 88 can be formed through the contact level dielectric layer 73 on each drain region 63. Word line contact via structures 86 can be formed on the electrically conductive layers 46 through the contact level dielectric layer 73, and through the retro-stepped dielectric material portion 65. Peripheral device contact via structures 8P can be formed through the retro-stepped dielectric material portion 65 directly on respective nodes of the peripheral devices.

The exemplary structures can include a three-dimensional memory device. In one embodiment, the three-dimensional memory device comprises a monolithic three-dimensional NAND memory device. The electrically conductive layers 46 can comprise, or can be electrically connected to, a respective word line of the monolithic three-dimensional NAND memory device. The substrate (9, 10) can comprise a silicon substrate. The vertical NAND memory device can comprise an array of monolithic three-dimensional NAND strings over the silicon substrate. At least one memory cell (as embodied as a portion of a charge storage layer 54 at a level of an electrically conductive layer 46) in a first device level of the array of monolithic three-dimensional NAND strings can be located over another memory cell (as embodied as another portion of the charge storage layer 54 at a level of another electrically conductive layer 46) in a second device level of the array of monolithic three-dimensional NAND strings. The silicon substrate can contain an integrated circuit comprising a driver circuit (comprising at the least one semiconductor device 700) for the memory device located thereon. The electrically conductive layers 46 can comprise a plurality of control gate electrodes having a strip shape extending substantially parallel to the top surface of the substrate (9, 10), e.g., between a pair of backside trenches 79. The plurality of control gate electrodes comprises at least a first control gate electrode located in a first device level and a second control gate electrode located in a second device level. The array of monolithic three-dimensional NAND strings can comprise: a plurality of semiconductor channels (59, 11, 60), wherein at least one end portion 60 of each of the plurality of semiconductor channels (59, 11, 60) extends substantially perpendicular to a top surface of the substrate (9, 10) and comprising a respective one of the vertical semiconductor channels 60; and a plurality of charge storage elements (comprising portions of the memory films 50, i.e., portions of the charge storage layer 54). Each charge storage element can be located adjacent to a respective one of the plurality of semiconductor channels (59, 11, 60).

Referring to all drawings and according to various embodiments of the present disclosure, a three-dimensional memory device is provided, which comprises: an alternating stack of insulating layers 32 and electrically conductive layers 46 located over a substrate 10, and memory stack structures 55 extending through the alternating stack (32, 46), wherein each memory stack structure 55 comprises a memory film 50 and a vertical semiconductor channel 60, a first trench 79 located on a first side of the alternating stack, and a second trench 79 located on a second side of the alternating stack. Each of the electrically conductive layers 46 comprises a first proximal region 46P adjacent to the first trench 79A, a second proximal region 46P adjacent to the second trench 79B and a distal region 46D located between the first and the second proximal regions 46P. The distal region differs 46D from the first and second proximal regions 46P in at least one of composition and structure In one embodiment, the electrically conductive layers comprises 46 a fluorine-free tungsten layer 462 which has a greater thickness in the distal region 46D than in the first and the second proximal regions 46P. In one embodiment, each of the electrically conductive layers 46 further comprises at least one metallic fill material layer (464, 466) having a different composition than the fluorine-free tungsten layer 462 and filling a remaining volume of each of the respective electrically conductive layer 46.

In one embodiment, a first dielectric wall structure 74A is located in the first trench 79A and a second dielectric wall structure 74B is located in the second trench 79B. The electrically conductive layers 46 laterally extend between a first dielectric wall structure 74A and a second dielectric wall structure 74B that have lengthwise sidewalls that extend along a first horizontal direction hd1 parallel to sidewalls of the insulating layers 32 that extend along the first horizontal direction hd1. The fluorine-free tungsten layer 462 includes variable thickness regions that have a respective variable vertical thickness that increases with a nearest trench distance that is defined as a lesser of a first lateral distance LD1 from a given point P to the first dielectric wall structure 74A and a second lateral distance LD2 from the given point P to the second dielectric wall structure 74B, the given point P being any point at which the nearest trench distance is measured. In one embodiment, the fluorine-free tungsten layer 462 is laterally offset from, and does not directly contact, the first and second dielectric wall structures (74A, 74B).

In one embodiment, each fluorine-free tungsten layer 462 includes four variable thickness regions VTR that comprise: a first upper variable thickness region VTR having a first tapered bottom surface, overlying respective at least one metallic fill material layer (464, 466), and being more proximal to the first dielectric wall structure 74A than to the second dielectric wall structure 74B; a first lower variable thickness region VTR having a first tapered top surface, underlying the respective at least one metallic fill material layer (464, 466), and being more proximal to the first dielectric wall structure 74A than to the second dielectric wall structure 74B; a second upper variable thickness region VTR having a second tapered bottom surface, overlying the respective at least one metallic fill material layer (464, 466), and being more proximal to the second dielectric wall structure 74B than to the first dielectric wall structure 74A; and a second lower variable thickness region VTR having a second tapered top surface, underlying the respective at least one metallic fill material layer, and being more proximal to the second dielectric wall structure 74B than to the first dielectric wall structure 74A.

In one embodiment, one or more of the at least one metallic fill material layer (464, 466) continuously extend laterally from the first dielectric wall structure 74A to the second dielectric wall structure 74B.

In one embodiment, one of the fluorine-free tungsten layers 462 includes a region located between a pair among the variable thickness regions VTR and having a vertical thickness that is the same as a total thickness of an electrically conductive layer 46 that includes the one of the fluorine-free tungsten layers 462.

In one embodiment, the at least one metallic fill material layer (464, 466) includes a tapered top surface and a tapered bottom surface such that a vertical distance between the tapered top surface and the tapered bottom surface decreases with the nearest trench distance. In one embodiment, the metallic fill material is located in the first and second proximal regions 46P and no metallic fill material is located in the distal region 46D. In one embodiment, each of the electrically conductive layers 46 further comprises a metallic nitride liner 46A having a greater thickness in the first and second proximal regions 46P than in the distal region 46D.

In one embodiment, each variable thickness region VTR of the fluorine-free tungsten layers 462 includes a doped tungsten surface layer having a higher dopant concentration of a dopant species than portions of the fluorine-free tungsten layers 462 contacting the at least one metallic fill material layer (464, 466), wherein the dopant species is selected from silicon, germanium, and boron.

In one embodiment, the three-dimensional memory device comprises a backside blocking dielectric layer 44 continuously extending between each neighboring pair of an electrically conductive layer 46 and an insulating layer 32 and between each neighboring pair of an electrically conductive layer 46 and a memory stack structure 55, wherein each of the fluorine-free tungsten layers 462 is located over a respective surface area of the backside blocking dielectric layer 44.

In one embodiment, the at least one metallic fill material layer (464, 466) comprises a metal that is not tungsten. In another embodiment, the at least one metallic fill material layer (464, 466) comprises a fluorine-containing tungsten layer 464 layer having at least 100 times higher fluorine concentration than the fluorine-free tungsten layer 462. The fluorine-free tungsten layer 462 includes a doped tungsten surface layer adjacent to the memory stack structures 55 having a higher concentration of at least one silicon, germanium or boron than the fluorine-containing tungsten layer 464.

In one embodiment, a method of forming a three-dimensional memory device includes providing an alternating stack of insulating layers 32 and sacrificial material layers 42 located between a first trench 79A and a second trench 79B, forming memory stack 55 structures extending vertically through the alternating stack, wherein each of the memory stack structures 55 comprises a memory film 50 and a vertical semiconductor channel 60, and removing the sacrificial material layers 42 selective to the insulating layers 32 through the first and the second trenches (79A, 79B) to form backside recesses 43. Each backside recess 43 has a first proximal region 43P adjacent to the first trench 79A, a second proximal region 43P adjacent to the second trench 79B and a distal region 43D located between the first and the second proximal regions 43P. The method further includes forming fluorine-free tungsten layers 462 in the respective backside recesses 43 such that each fluorine-free tungsten layer 462 has a greater thickness in the distal region 43D than in the first and the second proximal regions 43P.

In one embodiment, the method further comprises forming a tungsten-nucleation-material layer 45 in the backside recesses 43 prior to forming the fluorine-free tungsten layers 462 in the backside recesses 43, and forming at least one metallic fill material layer (464, 466) having a different composition than the fluorine-free tungsten layers 462 in each remaining volume of the backside recesses 43.

In one embodiment, each of the fluorine-free tungsten layers 462 includes variable thickness regions that have a respective variable vertical thickness that increases with a nearest trench distance that is defined as a lesser of a first lateral distance from a given point to the first trench 79A and a second lateral distance from the given point to the second trench 79B.

In one embodiment, the fluorine-free tungsten layers 462 are formed by pumping at least one of $WCl_5$ vapor or $WCl_6$ vapor which is converted to the $WCl_5$ vapor into the backside recesses 43 such that the $WCl_5$ vapor reacts with the tungsten-nucleation-material layer to form $WCl_4$ vapor, and purging the $WCl_5$ vapor and the $WCl_4$ vapor from the proximal regions 43P while residual $WCl_4$ molecules remain trapped in the distal region 43D such that the residual $WCl_4$ molecules react with the tungsten-nucleation-material layer 45 to form the fluorine-free tungsten layers 462. The tungsten-nucleation-material layer 45 can comprise at least one of silicon, germanium and boron.

In one embodiment, a metallic nitride liner 46A is formed in the backside recesses 43 prior to forming the tungsten-nucleation-material layer 45, and the method also includes selectively etching the metallic nitride liner 46A in the proximal regions 43P by the $WCl_5$ vapor, such that the metallic nitride liner 46A is thicker in the distal region 46D than in the first and the second proximal regions 43P.

In one embodiment, each fluorine-free tungsten layer 462 completely fills a remaining volume (i.e., volume that is not occupied by the optional metallic nitride liner 46A) of the distal region 43D of the respective backside recess 43, and either partially fills or does not fill any part of the first and the second proximal regions 43P of the respective backside recess 43.

In one embodiment, the at least one metallic fill material layer (464, 466) comprises a material selected from cobalt, ruthenium, molybdenum and a fluorine-containing tungsten material formed using a $WF_6$ reactant or combinations thereof.

The various embodiments of the present disclosure provide laterally tapered unfilled volumes in each backside recess 43 after formation of the fluorine-free tungsten layers 462. By depositing a metal that grows only from metallic surfaces as the at least one metallic fill material layer (464, 466), the electrically conductive layers 46 can be formed without seams or voids therein, thereby enhancing resistance to electromigration and providing a higher conductivity per volume for the electrically conductive layers 46. Improved performance and reliability of the word lines in a three-dimensional memory device can be achieved through the methods of the present disclosure.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device comprising:
an alternating stack of insulating layers and electrically conductive layers located over a substrate;
memory stack structures extending through the alternating stack, wherein each memory stack structure comprises a memory film and a vertical semiconductor channel;
a first trench located on a first side of the alternating stack; and
a second trench located on a second side of the alternating stack;
wherein:
each of the electrically conductive layers comprises a first proximal region adjacent to the first trench, a second proximal region adjacent to the second trench and a distal region located between the first and the second proximal regions; and
the distal region differs from the first and second proximal regions in at least one of composition and structure.

2. The three-dimensional memory device of claim 1, wherein each of the electrically conductive layers comprises a fluorine-free tungsten layer which has a greater thickness in the distal region than in the first and second proximal regions.

3. The three-dimensional memory device of claim 2, wherein each of the electrically conductive layers further comprises at least one metallic fill material layer having a different composition than the fluorine-free tungsten layer and filling a remaining volume of each of the respective electrically conductive layers.

4. The three-dimensional memory device of claim 3, further comprising a first dielectric wall structure located in the first trench and a second dielectric wall structure located in the second trench.

5. The three-dimensional memory device of claim 4, wherein:
the electrically conductive layers laterally extend between the first dielectric wall structure and the second dielectric wall structure that have lengthwise sidewalls that extend along a first horizontal direction parallel to sidewalls of the insulating layers that extend along the first horizontal direction;
the fluorine-free tungsten layer includes variable thickness regions that have a respective variable vertical thickness that increases with a nearest trench distance that is defined as a lesser of a first lateral distance from a given point to the first dielectric wall structure and a second lateral distance from the given point to the second dielectric wall structure; and
the fluorine-free tungsten layer is laterally offset from, and does not directly contact, the first and second dielectric wall structures.

6. The Three-dimensional memory device of claim 5, wherein each fluorine-free tungsten layer includes four variable thickness regions that comprise:
a first upper variable thickness region having a first tapered bottom surface, overlying respective at least one metallic fill material layer, and being more proximal to the first dielectric wall structure than to the second dielectric wall structure;
a first lower variable thickness region having a first tapered top surface, underlying the respective at least one metallic fill material layer, and being more proximal to the first dielectric wall structure than to the second dielectric wall structure;
a second upper variable thickness region having a second tapered bottom surface, overlying the respective at least one metallic fill material layer, and being more proximal to the second dielectric wall structure than to the first dielectric wall structure; and
a second lower variable thickness region having a second tapered top surface, underlying the respective at least one metallic fill material layer, and being more proximal to the second dielectric wall structure than to the first dielectric wall structure.

7. The three-dimensional memory device of claim 5, wherein the at least one metallic fill material layer includes a tapered top surface and a tapered bottom surface such that a vertical distance between the tapered top surface and the tapered bottom surface decreases with the nearest trench distance.

8. The three-dimensional memory device of claim 3, wherein the metallic fill material is located in the first and second proximal regions and no metallic fill material is located in the distal region.

9. The three-dimensional memory device of claim 3, wherein:
the at least one metallic fill material layer comprises a fluorine-containing tungsten layer having at least 100 times higher fluorine concentration than the fluorine-free tungsten layer; and
the fluorine-free tungsten layer includes a doped tungsten surface layer adjacent to the memory stack structures having a higher concentration of at least one silicon, germanium or boron than the fluorine-containing tungsten layer.

10. The three-dimensional memory device of claim 3, wherein the at least one metallic fill material layer comprises a metal that is not tungsten.

11. The three-dimensional memory device of claim 2, wherein each of the electrically conductive layers further comprises a metallic nitride liner having a greater thickness in the first and second proximal regions than in the distal region.

12. The three-dimensional memory device of claim 1, wherein:
the three-dimensional memory device comprises a monolithic three-dimensional NAND memory device;
the electrically conductive layers comprise, or are electrically connected to, a respective word line of the monolithic three-dimensional NAND memory device;
the substrate comprises a silicon substrate;
the monolithic three-dimensional NAND memory device comprises an array of monolithic three-dimensional NAND strings located over the silicon substrate;
at least one memory cell in a first device level of the array of monolithic three-dimensional NAND strings is located over another memory cell in a second device level of the array of monolithic three-dimensional NAND strings;
the silicon substrate contains an integrated circuit comprising a driver circuit for the array of monolithic three-dimensional NAND strings;
the electrically conductive layers comprise a plurality of control gate electrodes having a strip shape extending substantially parallel to the top surface of the substrate; and
the array of monolithic three-dimensional NAND strings comprises:
a plurality of semiconductor channels, wherein at least one end portion of each of the plurality of semiconductor channels extends substantially perpendicular to a top surface of the substrate, and
a plurality of charge storage elements, each charge storage element located adjacent to a respective one of the plurality of semiconductor channels.

13. A method of forming a three-dimensional memory device, comprising:
providing an alternating stack of insulating layers and sacrificial material layers located between a first trench and a second trench;
forming memory stack structures extending vertically through the alternating stack, wherein each of the memory stack structures comprises a memory film and a vertical semiconductor channel;
removing the sacrificial material layers selective to the insulating layers through the first and the second trenches to form backside recesses having a first proximal region adjacent to the first trench, a second proximal region adjacent to the second trench and a distal region located between the first and the second proximal regions; and forming fluorine-free tungsten layers in the respective backside recesses such that each fluorine-free tungsten layer has a greater thickness in the distal region than in the first and the second proximal regions.

14. The method of claim 13, further comprising:
forming a tungsten-nucleation-material layer in the backside recesses prior to forming the fluorine-free tungsten layers in the backside recesses; and
forming at least one metallic fill material layer having a different composition than the fluorine-free tungsten layers in each remaining volume of the backside recesses.

15. The method of claim 14, wherein each of the fluorine-free tungsten layers includes variable thickness regions that have a respective variable vertical thickness that increases with a nearest trench distance that is defined as a lesser of a first lateral distance from a given point to the first trench and a second lateral distance from the given point to the second trench.

16. The method of claim 14, wherein the fluorine-free tungsten layers are formed by:
pumping at least one of $WCl_5$ vapor or $WCl_6$ vapor which is converted to the $WCl_5$ vapor into the backside recesses such that the $WCl_5$ vapor reacts with the tungsten-nucleation-material layer to form $WCl_4$ vapor; and purging the $WCl_5$ vapor and the $WCl_4$ vapor from the proximal regions while residual $WCl_4$ molecules remain trapped in the distal region, such that the residual $WCl_4$ molecules react with the tungsten-nucleation-material layer to form the fluorine-free tungsten layers.

17. The method of claim 16, wherein the tungsten-nucleation-material layer comprises at least one of silicon, germanium and boron.

18. The method of claim 17, further comprising forming a metallic nitride liner in the backside recesses prior to forming the tungsten-nucleation-material layer, and selectively etching the metallic nitride liner in the first and the second proximal regions by the $WCl_5$ vapor, such that the metallic nitride liner is thicker in the distal region than in the first and the second proximal regions.

19. The method of claim 14, wherein each fluorine-free tungsten layer completely fills a remaining volume of the distal region of the respective backside recess and either partially fills or does not fill any part of the first and the second proximal regions of the respective backside recess.

20. The method of claim 14, wherein the at least one metallic fill material layer comprises a material selected from one or more of cobalt, ruthenium, molybdenum and a fluorine-containing tungsten material formed using a $WF_6$ reactant.

* * * * *